(12) United States Patent
Kang et al.

(10) Patent No.: US 11,697,762 B2
(45) Date of Patent: Jul. 11, 2023

(54) ORGANIC-INORGANIC HYBRID COATING LAYER, QUANTUM DOT NANOCAPSULE, QUANTUM DOT LIGHT EMITTING DIODE PACKAGE, AND METHOD OF FABRICATING THE SAME

(71) Applicant: Korea University Research and Business Foundation, Sejong Campus, Sejong-si (KR)

(72) Inventors: Sang Ook Kang, Sejong-si (KR); Seung Jun Yi, Suwon-si (KR); Ho Jin Son, Suwon-si (KR); Eun Hye Yang, Sejong-si (KR)

(73) Assignee: Korea University Research and Business Foundation, Sejong Campus, Sejong-si (KR)

( * ) Notice: Subject to any disclaimer, the term of this patent is extended or adjusted under 35 U.S.C. 154(b) by 300 days.

(21) Appl. No.: 17/181,017

(22) Filed: Feb. 22, 2021

(65) Prior Publication Data
US 2021/0269710 A1 Sep. 2, 2021

Related U.S. Application Data

(63) Continuation of application No. PCT/KR2019/010508, filed on Aug. 19, 2019, and a
(Continued)

(30) Foreign Application Priority Data

Aug. 22, 2018 (KR) .................. 10-2018-0097933
Aug. 22, 2018 (KR) .................. 10-2018-0097934
(Continued)

(51) Int. Cl.
*C09K 11/56* (2006.01)
*C09K 11/02* (2006.01)
(Continued)

(52) U.S. Cl.
CPC ............ *C09K 11/565* (2013.01); *C01B 33/14* (2013.01); *C08K 3/011* (2018.01); *C08K 3/30* (2013.01);
(Continued)

(58) Field of Classification Search
CPC .... C09K 11/025; C09K 11/562; C09K 11/565
See application file for complete search history.

(56) References Cited

U.S. PATENT DOCUMENTS

| 7,985,476 B2 | 7/2011 | Kurino et al. |
| 10,030,851 B2 | 7/2018 | Koole et al. |

(Continued)

FOREIGN PATENT DOCUMENTS

| KR | 10-2005-0005168 A | 1/2005 |
| KR | 10-0593689 B1 | 6/2006 |

(Continued)

OTHER PUBLICATIONS

International Search Report and Written Opinion dated Nov. 26, 2019 for International Patent Application No. PCT/KR2019/010507, 4 pages.

(Continued)

*Primary Examiner* — Matthew E. Hoban
(74) *Attorney, Agent, or Firm* — Finch & Maloney PLLC

(57) ABSTRACT

A method of fabricating the organic-inorganic hybrid coating layer includes: preparing a gel mixture including an organic precursor and colloidal silica particles; preparing a first mixed solution by heating the gel mixture; preparing a second mixed solution by adding quantum dots to the first mixed solution; and coating the second mixed solution on a substrate and irradiating light thereon to form a polymer matrix in which the organic precursor and the colloidal silica particles are crosslinked, and preparing a coating layer in which the quantum dots are dispersed in the polymer matrix,
(Continued)

wherein the organic precursor may include at least one of dipentaerythritol pentaacrylate (DPPA) or dipentaerythritol hexaacrylate (DPHA).

20 Claims, 34 Drawing Sheets

Related U.S. Application Data continuation of application No. PCT/KR2019/010509, filed on Aug. 19, 2019, and a continuation of application No. PCT/KR2019/010507, filed on Aug. 19, 2019.

(30) Foreign Application Priority Data

| Aug. 22, 2018 | (KR) | 10-2018-0097935 |
| Jul. 1, 2019 | (KR) | 10-2019-0079007 |
| Jul. 1, 2019 | (KR) | 10-2019-0079009 |
| Jul. 1, 2019 | (KR) | 10-2019-0079010 |

(51) Int. Cl.

| *C09K 11/88* | (2006.01) |
| *C01B 33/14* | (2006.01) |
| *C08K 3/30* | (2006.01) |
| *C08K 3/011* | (2018.01) |
| *H10K 50/115* | (2023.01) |
| *B82Y 40/00* | (2011.01) |
| *B82Y 20/00* | (2011.01) |
| *H10K 102/00* | (2023.01) |

(52) U.S. Cl.
CPC ......... *C09K 11/883* (2013.01); *H10K 50/115* (2023.02); *B82Y 20/00* (2013.01); *B82Y 40/00* (2013.01); *C01P 2004/64* (2013.01); *C01P 2006/60* (2013.01); *C08K 2003/3036* (2013.01); *C08K 2201/011* (2013.01); *H10K 2102/00* (2023.02)

(56) References Cited

U.S. PATENT DOCUMENTS

| 10,032,964 | B2 | 7/2018 | Pickett et al. |
| 10,312,418 | B2 | 6/2019 | Naasani et al. |
| 10,324,373 | B2 | 6/2019 | Yang et al. |
| 2008/0230750 | A1* | 9/2008 | Gillies ................ C09K 11/641 |
| 2015/0314941 | A1 | 11/2015 | Ramadas et al. |
| 2016/0084476 | A1 | 3/2016 | Koole et al. |
| 2016/0315229 | A1 | 10/2016 | Dai et al. |

FOREIGN PATENT DOCUMENTS

| KR | 10-2008-0066692 A | 7/2008 |
| KR | 10-2012-0022372 A | 3/2012 |
| KR | 10-2012-0067541 A | 6/2012 |
| KR | 10-2014-0064979 A | 5/2014 |
| KR | 10-2015-0027701 A | 3/2015 |
| KR | 10-2015-0109325 A | 10/2015 |
| KR | 10-2016-0076930 A | 7/2016 |
| KR | 10-2017-0046524 A | 5/2017 |
| KR | 10-2018-0018066 A | 2/2018 |
| KR | 10-2018-0044461 A | 5/2018 |
| KR | 10-1918019 B1 | 11/2018 |
| WO | 2011036447 A1 | 3/2011 |

OTHER PUBLICATIONS

International Search Report and Written Opinion dated Nov. 12, 2019 for International Patent Application No. PCT/KR2019/010508, 4 pages.
International Search Report and Written Opinion dated Nov. 27, 2019 for International Patent Application No. PCT/KR2019/010509, 4 pages.

\* cited by examiner

Fig. 10
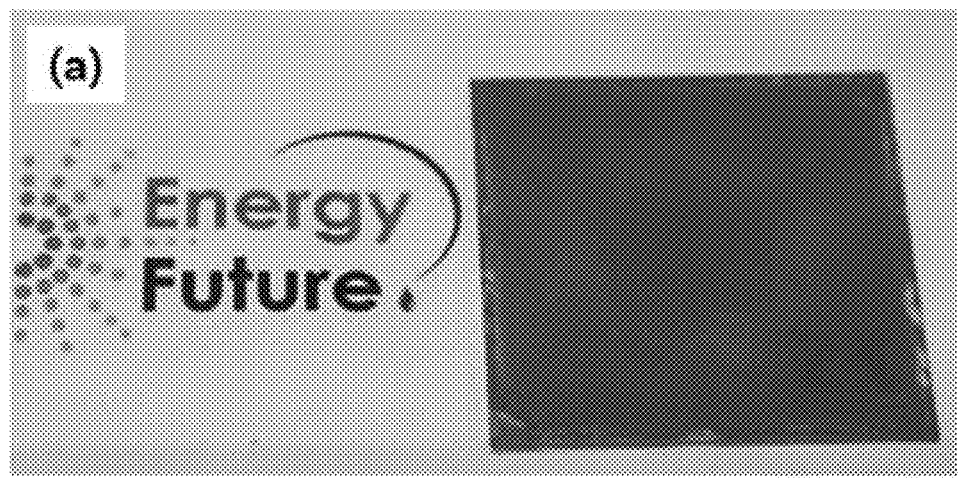
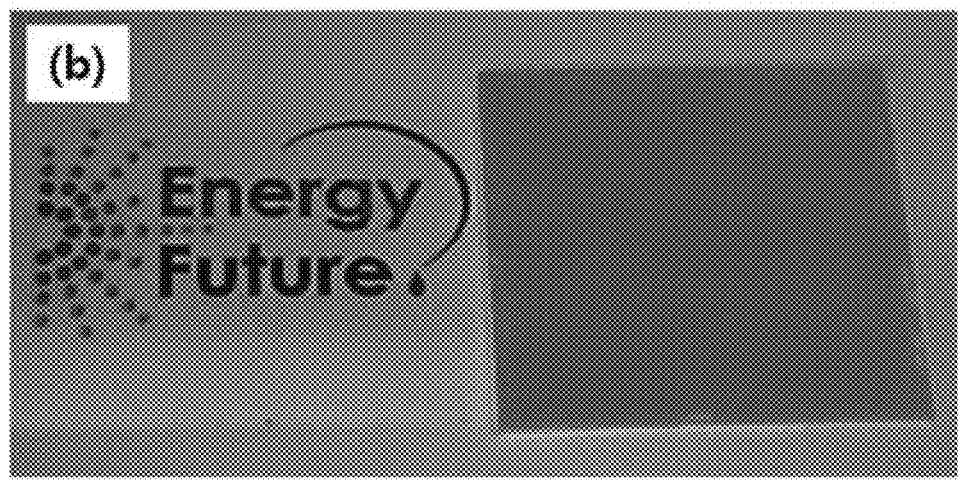

FIG. 23
(a)
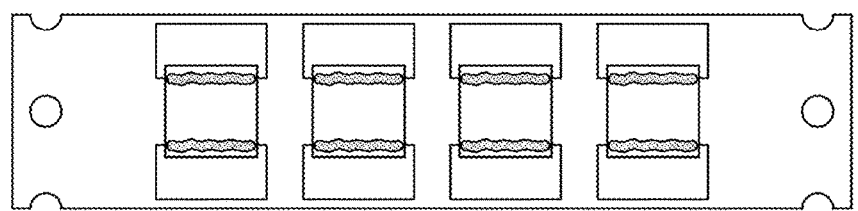
(b)
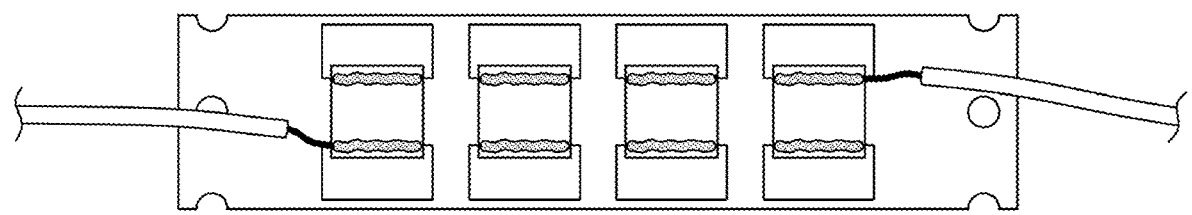

FIG. 24
(a)
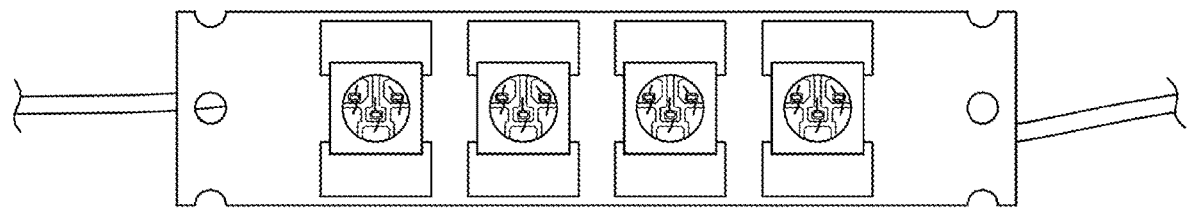
(b)
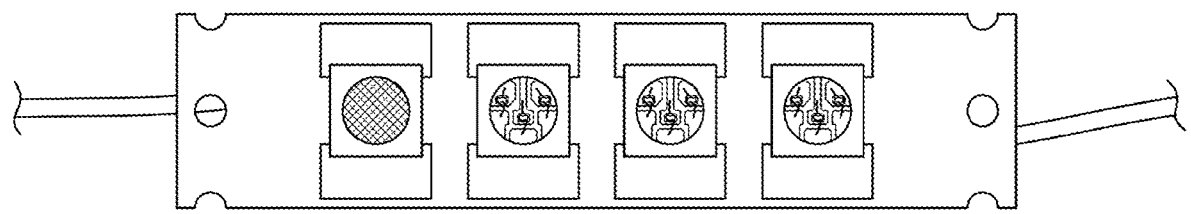

Fig. 25
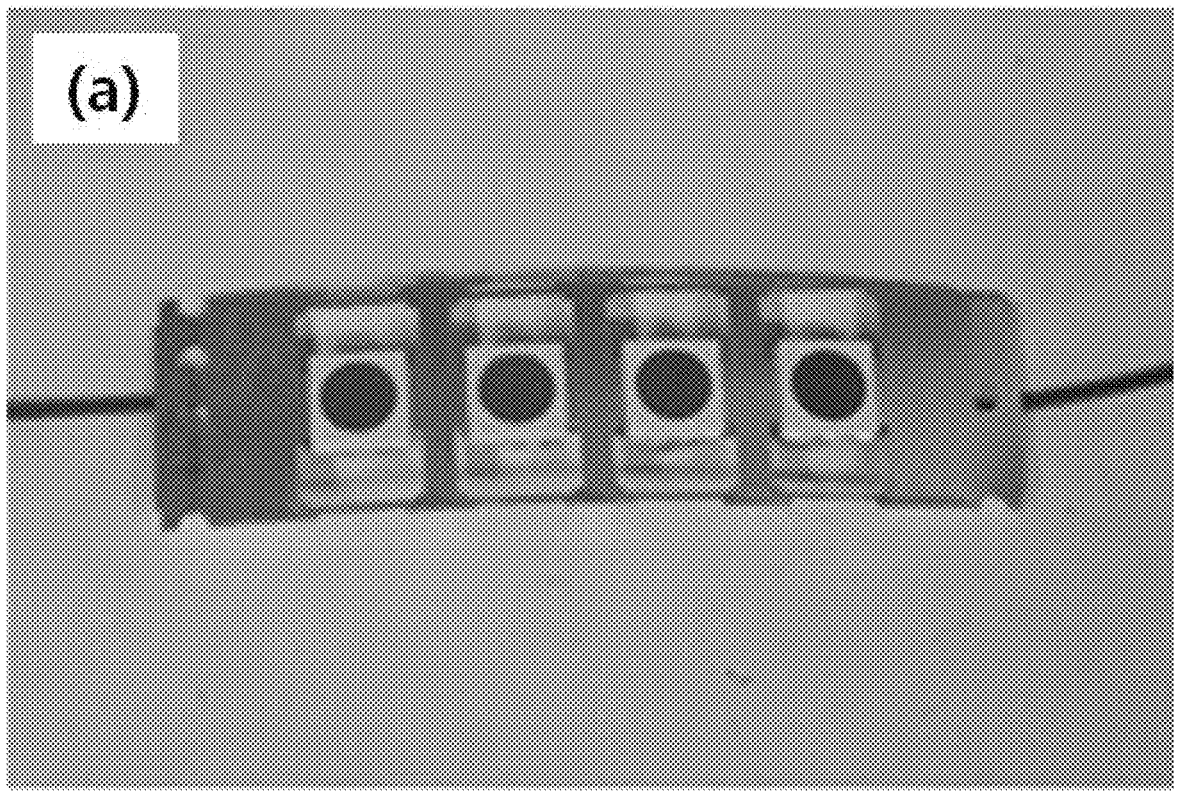
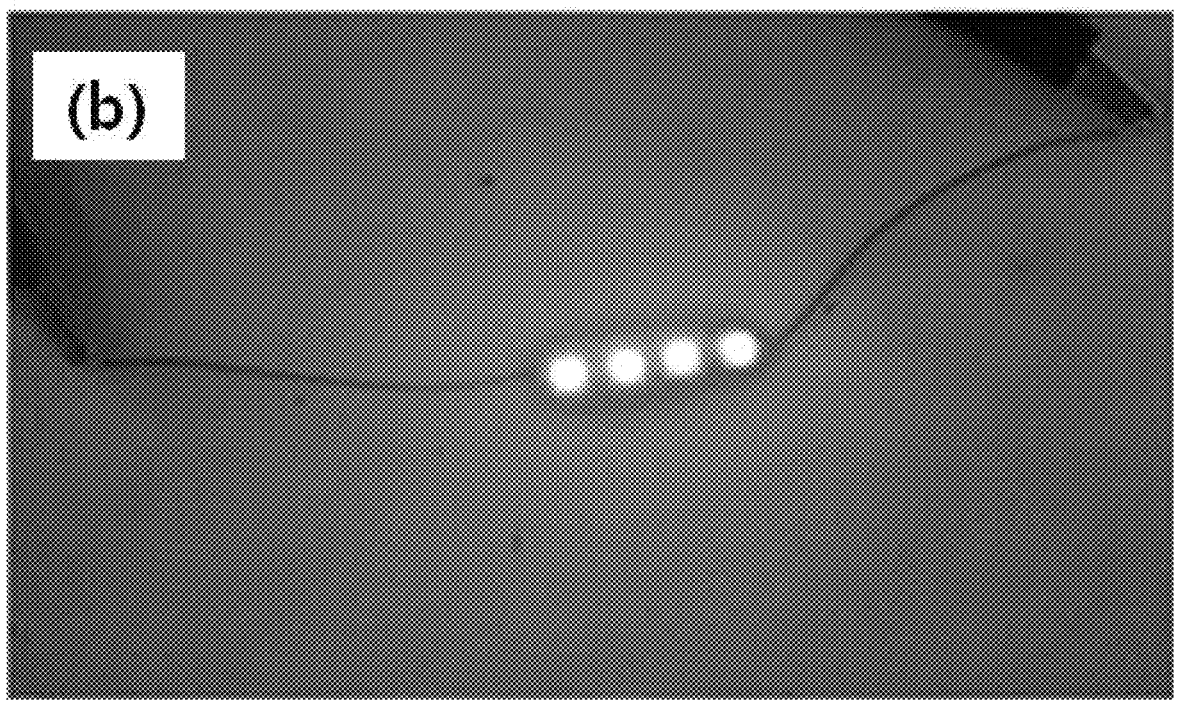

Fig. 26
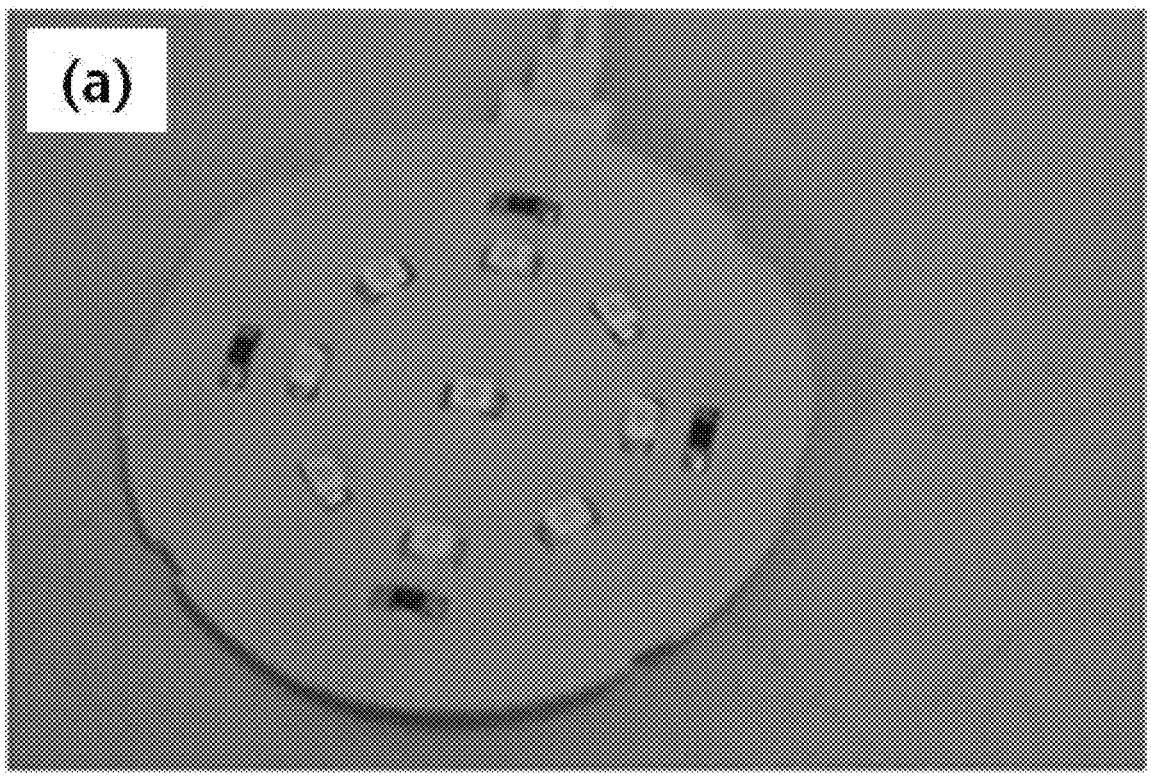
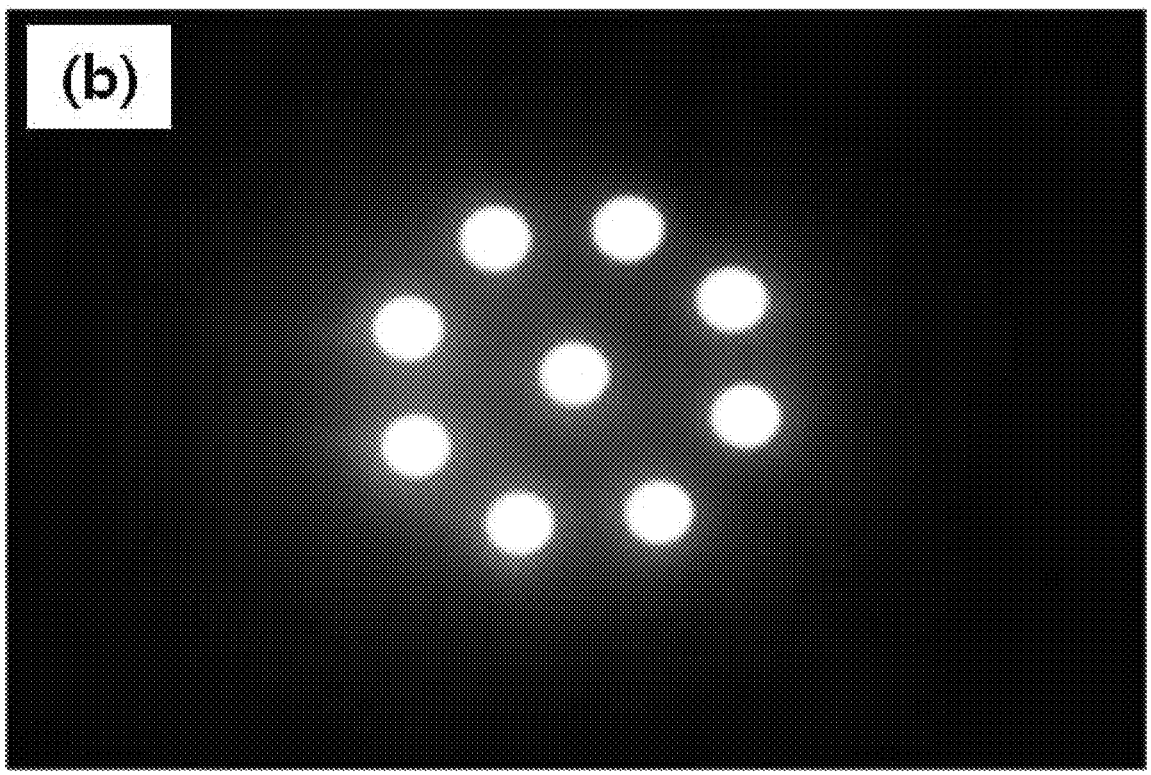

Fig. 27
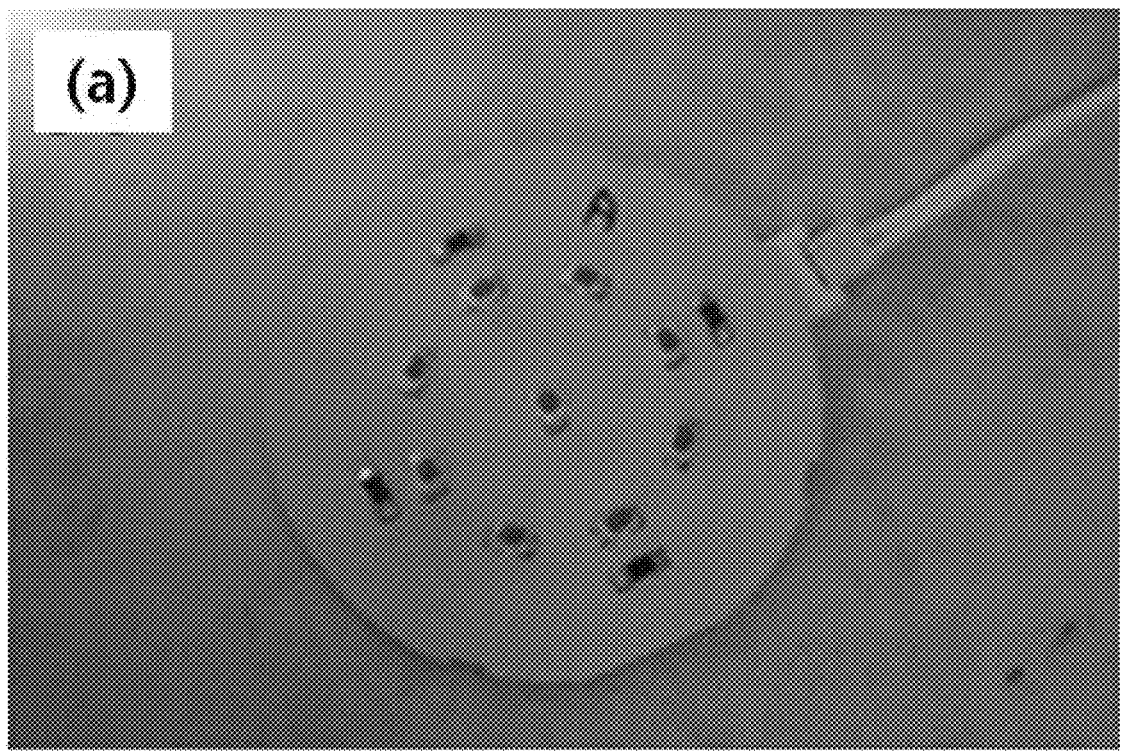
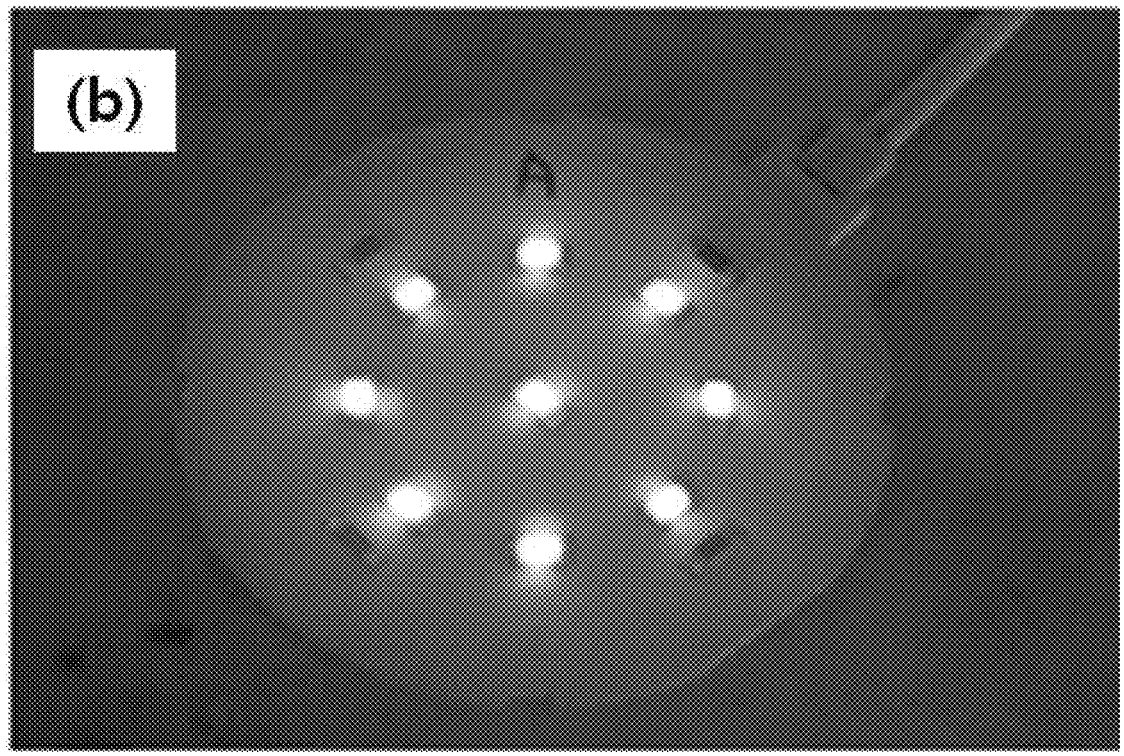

Fig. 28
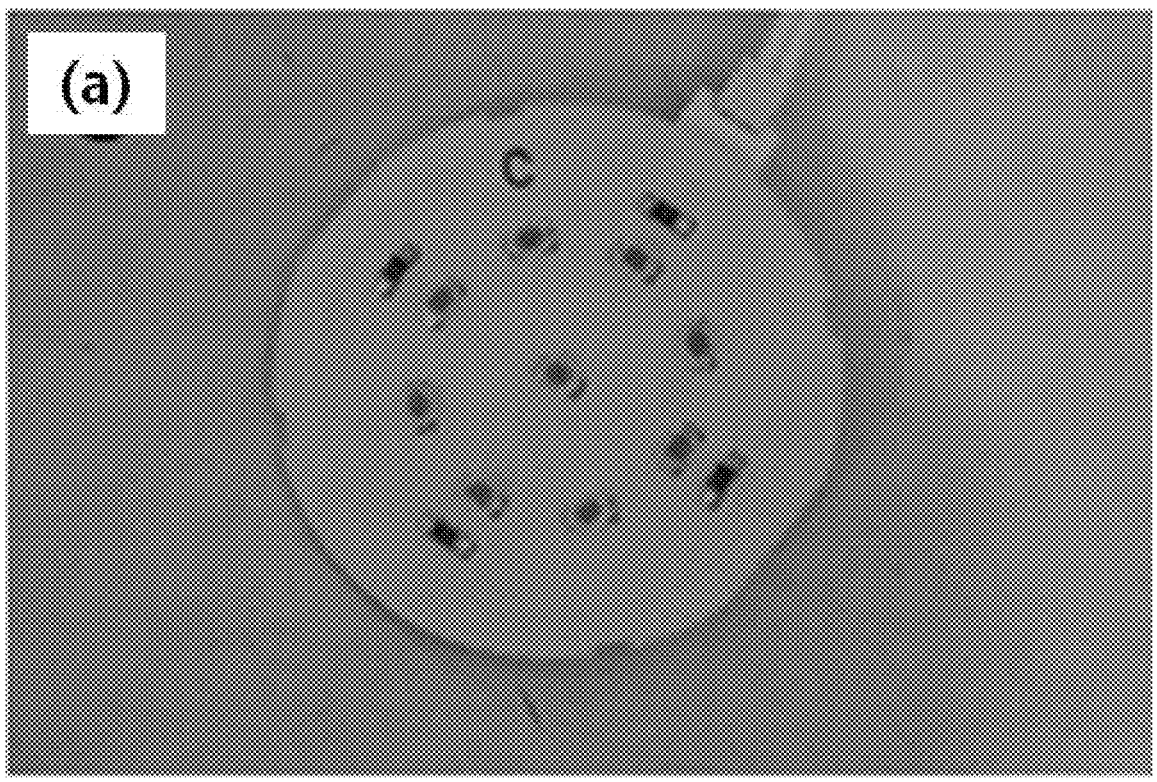
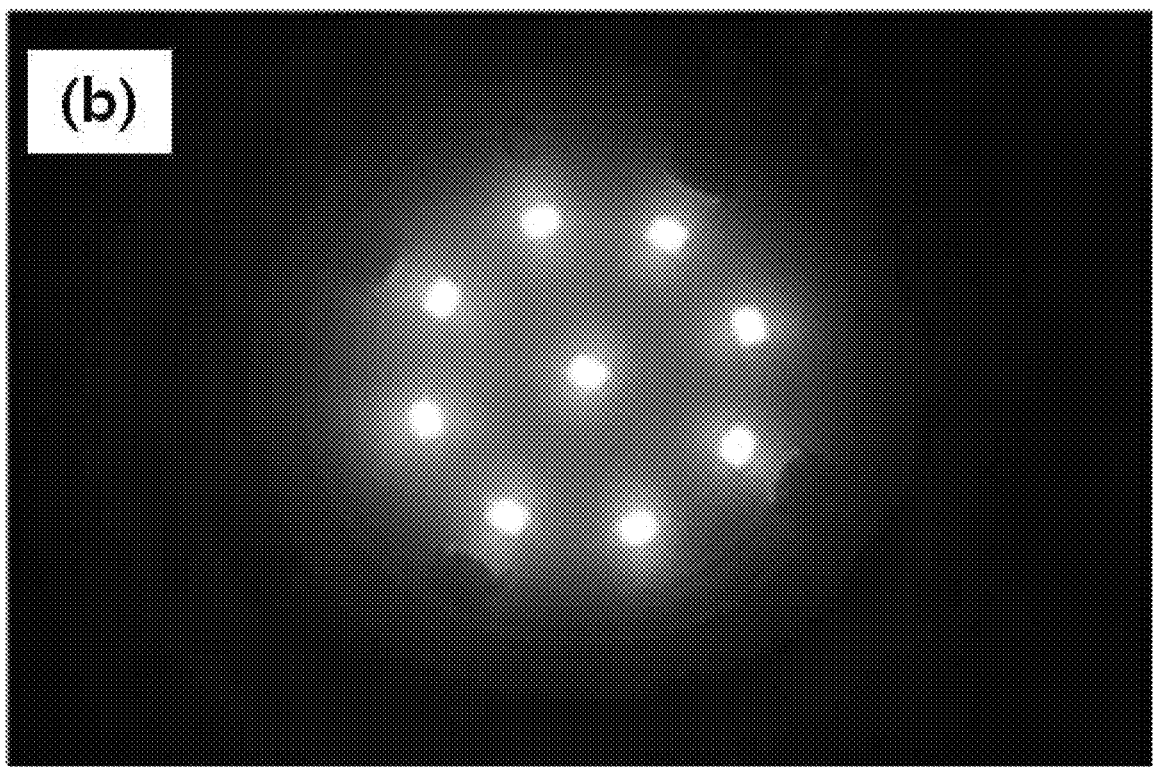

Fig. 29
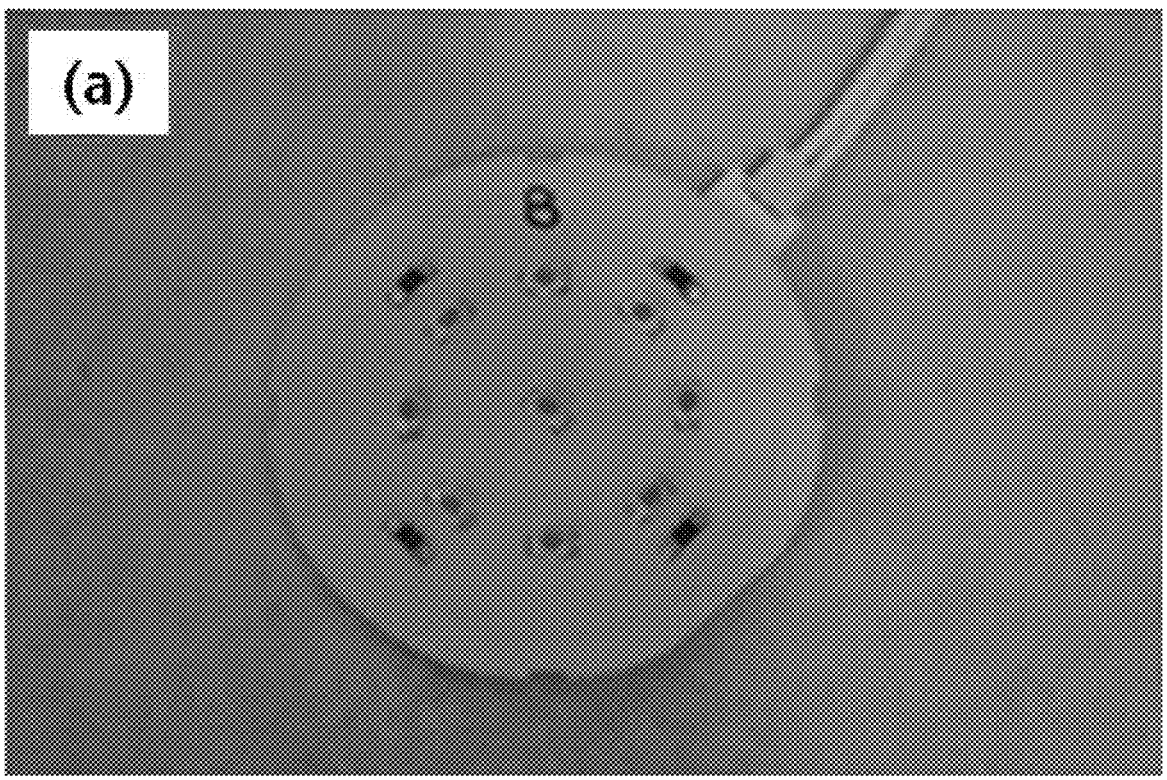
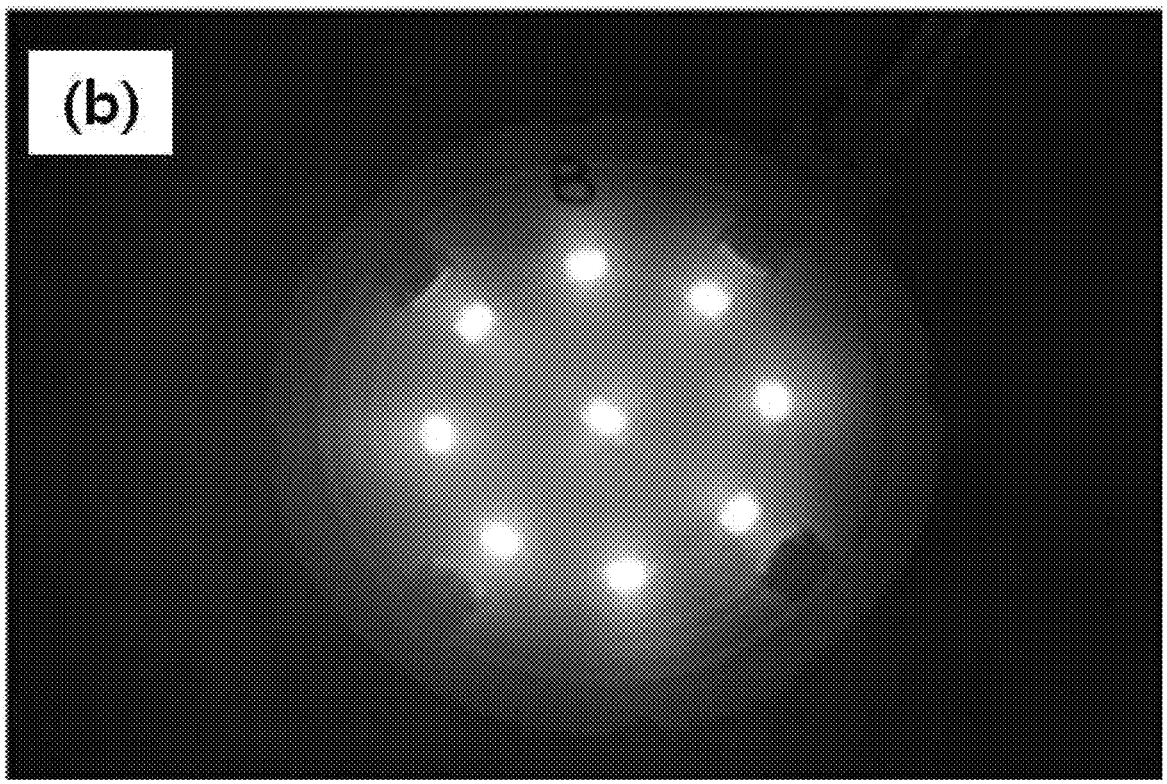

Fig. 30
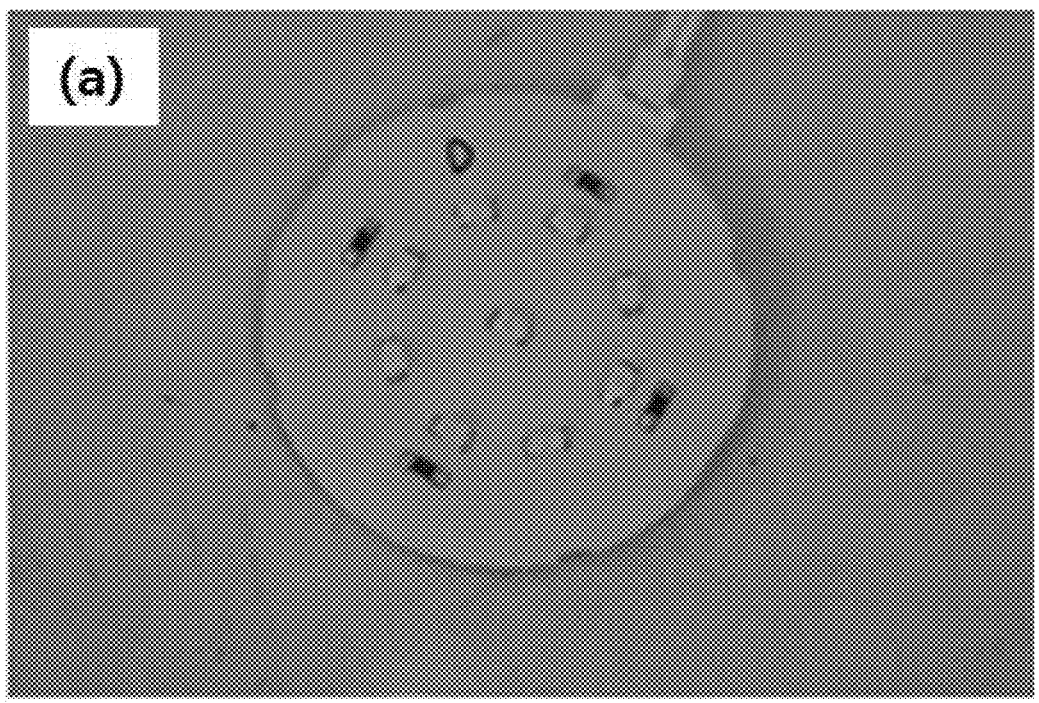
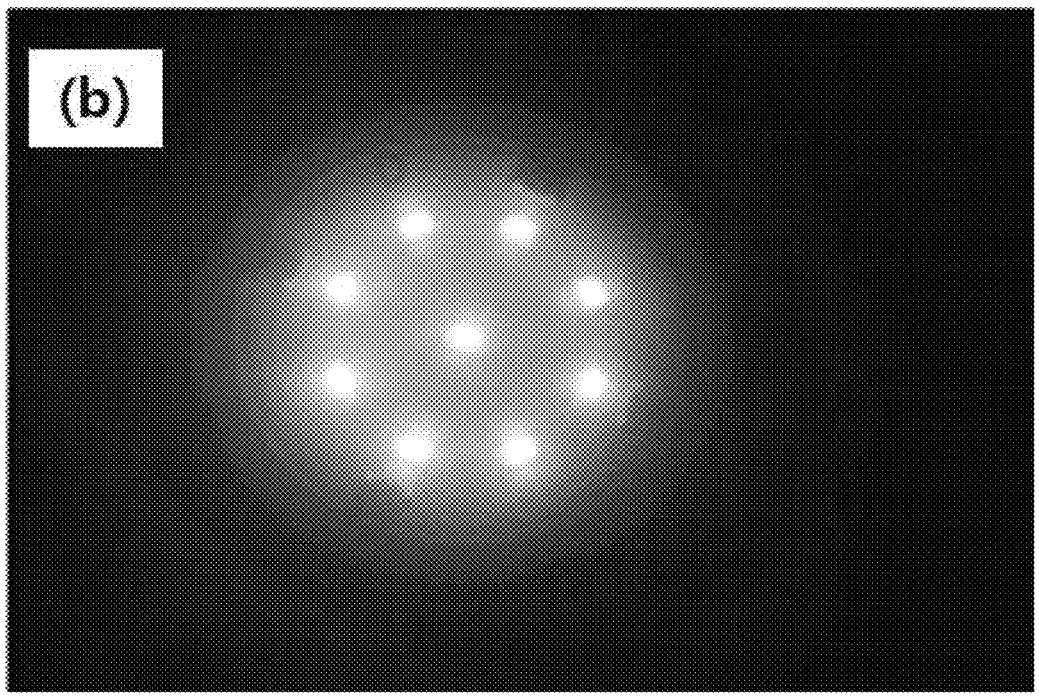

Fig. 31
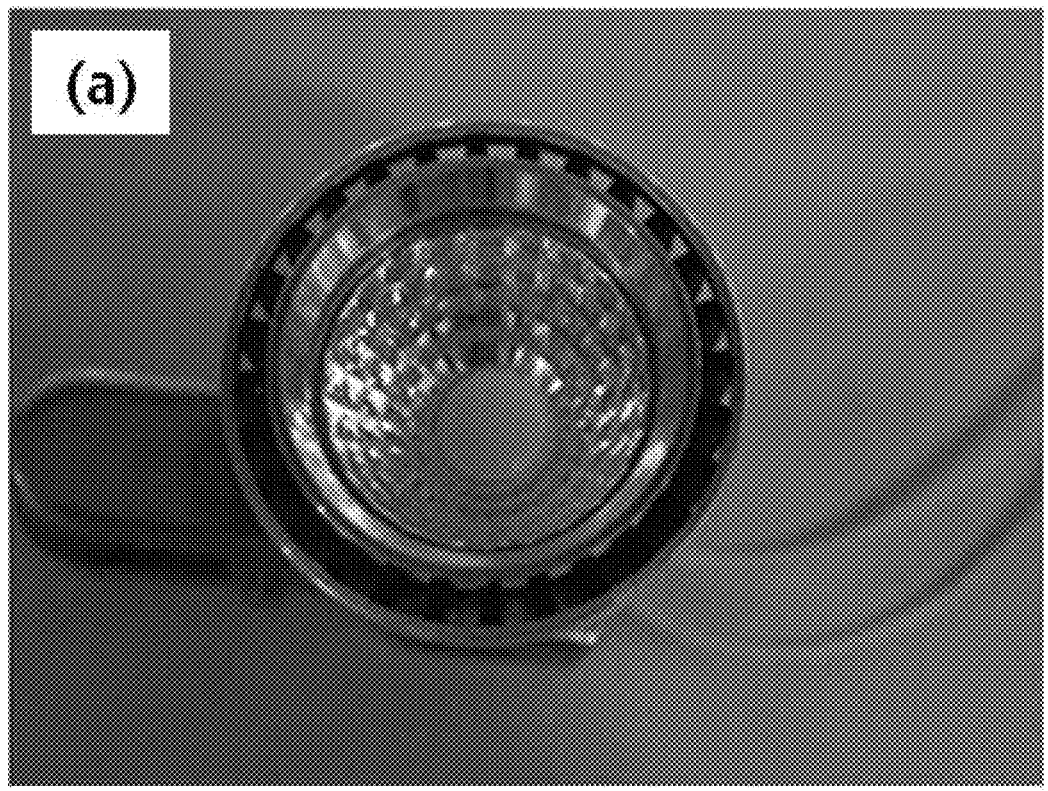

Fig. 32
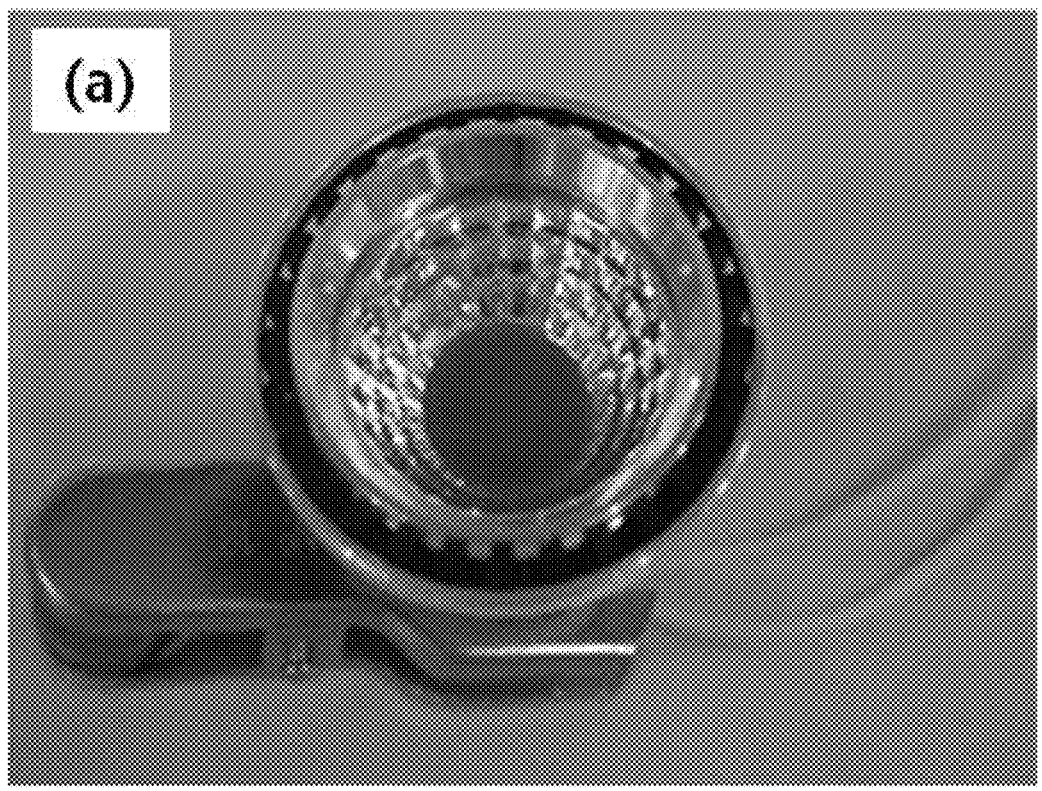
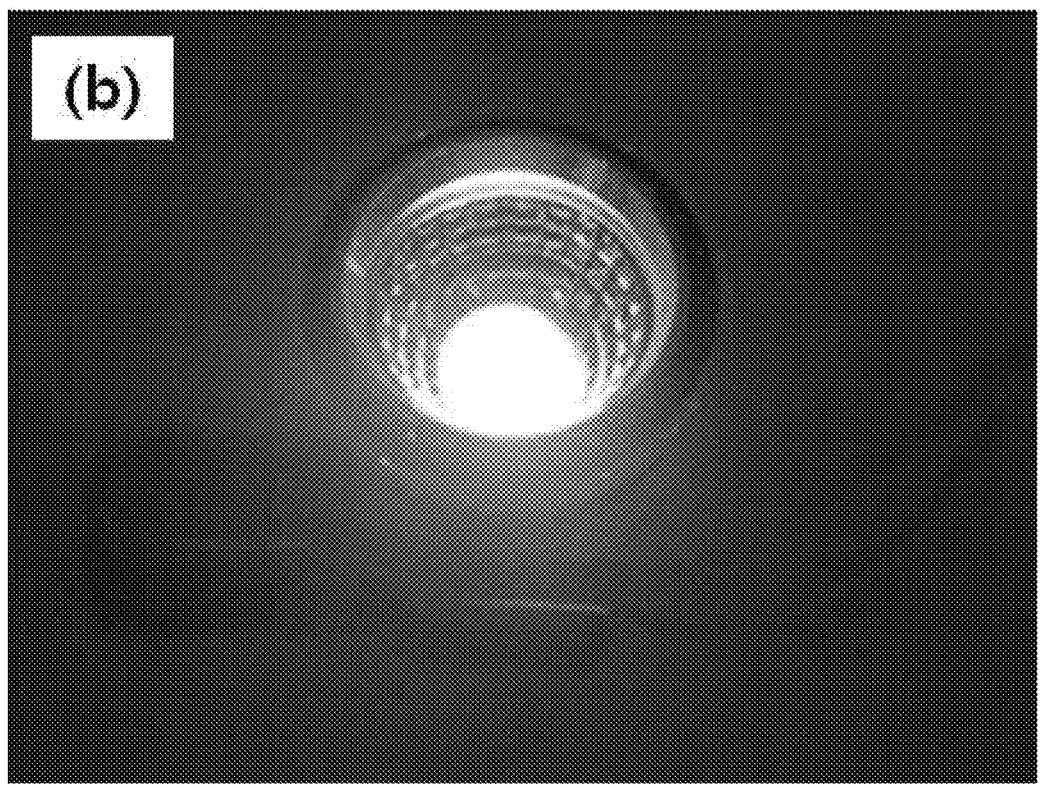

FIG. 33
(a)
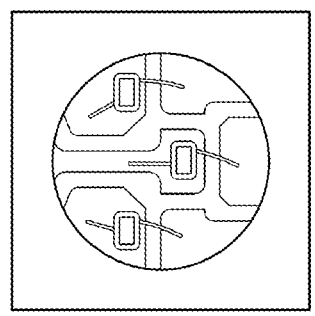
(b)
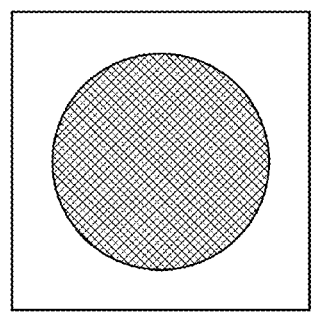

ORGANIC-INORGANIC HYBRID COATING LAYER, QUANTUM DOT NANOCAPSULE, QUANTUM DOT LIGHT EMITTING DIODE PACKAGE, AND METHOD OF FABRICATING THE SAME

BACKGROUND OF THE INVENTION

1. Field of the Invention

The present disclosure relates to an organic-inorganic hybrid coating layer, a quantum dot nanocapsule, a quantum dot light emitting diode, and a method of fabricating the same, and more specifically, to an organic-inorganic hybrid coating layer including quantum dots dispersed in a polymer matrix including acrylate-based resin and colloidal silica particles, a quantum dot nanocapsule, a quantum dot light emitting diode, and a method of fabricating the same.

2. Description of the Prior Art

Quantum dots are materials having a size of several nanometers and a semiconductor property, and may exhibit different light emitting properties according to the size. Accordingly, the quantum dots are used in solar cells, light emitting devices, sensors, light emitting indicators, biological diagnostic reagents, and the like. Recently, the application has been expected in various fields such as energy, display, safety diagnosis, and health care.

In particular, among quantum dot materials, cadmium selenide (CdSe) is used as an all-color light emitting material due to excellent light emitting properties. However, cadmium selenide (CdSe) includes cadmium and is harmful to a human body and an environment. In addition, when exposed to the air, cadmium selenide may be decomposed in a short time, and have an unstable state even at a temperature of 100° C. or higher, so intrinsic light emitting properties may be removed.

In order to compensate for the above weakness, the quantum dot may have cadmium selenide as a core, and include a semiconductor material, as a shell, formed on a surface of the core, relatively stable in the air, and having a band gap wider than that of the core.

The quantum dots are coated on a substrate so as to be used in application fields. In general, a coating layer may be prepared through a process in which a mixture of a curable monomer and a quantum dot is coated and then cured on the substrate. When the substrate is flexible, a deformation of the substrate may cause a curling phenomenon in which the coating layer is cracked or curled, or the coating layer may be easily delaminated. Accordingly, studies on a method of fabricating a coating layer, which mitigates the curling phenomenon and uniformly includes quantum dots, have been conducted.

For example, Korean Patent Registration No. 10-1918019 (Application No.: 10-2014-0168265) discloses a quantum dot film manufacturing method including: forming a quantum dot layer disposed therein with a plurality of quantum dots by electrospraying or electrospinning; and forming a barrier layer for covering the quantum dot layer on the quantum dot layer by the electrospraying or electrospinning, wherein the forming of the quantum dot layer includes integrally forming the quantum dot layer in a fused state on a light guide plate, and the forming of the barrier layer includes forming the barrier layer in a non-porous membrane form through electrospraying.

SUMMARY OF THE INVENTION

One technical problem to be solved by the present invention is to provide an organic-inorganic hybrid coating layer prepared by a simple process, and a method of fabricating the same.

Another technical problem to be solved by the present invention is to provide an organic-inorganic hybrid coating layer prevented from occurring a curling phenomenon, and a method of fabricating the same.

Still another technical problem to be solved by the present invention is to provide an organic-inorganic hybrid coating layer having excellent anti-moisture permeation and anti-oxygen permeation properties and having improved high temperature stability, and a method of fabricating the same.

One technical problem to be solved by the present invention is to provide a quantum dot nanocapsule and a method of fabricating the same.

Another technical problem to be solved by the present invention is to provide a quantum dot nanocapsule including a capsule layer excellent in anti-moisture permeation and anti-oxygen permeation properties due to crosslinking reaction of organic and inorganic components, and a method of fabricating the same.

Still another technical problem to be solved by the present invention is to provide a quantum dot nanocapsule having improved thermal and optical stability of quantum dots through encapsulation, and a method of fabricating the same.

One technical problem to be solved by the present invention is to provide a quantum dot light emitting diode package and a method of fabricating the same.

Another technical problem to be solved by the present invention is to provide a quantum dot light emitting diode package including a light conversion layer prepared by a relatively simple scheme of crosslinking the light conversion layer using light emitted from a light emitting diode, and a method of fabricating the same.

Still another technical problem to be solved by the present invention is to provide a quantum dot light emitting diode package and a method of fabricating the same, in which the quantum dot light emitting diode package includes inorganic oxide which is surface-modified with a curable functional group, resin composed of a crosslinkable material bonded to the curable functional group, and quantum dots uniformly distributed on the resin, and includes a light conversion layer having excellent light transmittance.

Still another technical problem to be solved by the present invention is to provide a quantum dot light emitting diode package for exhibiting white light by converting some of light emitted from a light emitting diode, and a method of fabricating the same.

The technical problem to be solved by the present invention is not limited to the above-described technical problems.

In order to solve the above-mentioned technical problems, the present disclosure provides a method of fabricating an organic-inorganic hybrid coating layer.

According to one embodiment, the method of fabricating the organic-inorganic hybrid coating layer includes: preparing a gel mixture including an organic precursor and colloidal silica particles; preparing a first mixed solution by heating the gel mixture; preparing a second mixed solution by adding quantum dots to the first mixed solution; and coating the second mixed solution on a substrate and irradiating light thereon to form a polymer matrix in which the organic precursor and the colloidal silica particles are crosslinked, and preparing a coating layer in which the quantum dots are dispersed in the polymer matrix, wherein the organic precursor may include at least one of dipentaerythritol pentaacrylate (DPPA) or dipentaerythritol hexaacrylate (DPHA).

According to one embodiment, the step of preparing the gel mixture may include: stirring and heating a precursor solution containing the organic precursor; modifying surfaces of the colloidal silica particles by using a crosslinkable silane compound; and preparing a gel mixture by mixing the heated precursor solution and the modified colloidal silica particles.

According to one embodiment, may further include crosslinking acrylamide on the surfaces of the modified colloidal silica particles after the step of modifying the surfaces of the colloidal silica particles.

According to one embodiment, the gel mixture may further include at least one additive of pentaerythritol acrylate (PETA), N,N-dimethylmethacrylate (DMA), and zonyl acrylate (C8F17C2(OH)4O(CO)CH2=CH2).

According to one embodiment, the quantum dot may include surface modified using trioctylphosphine (TOP).

According to one embodiment, the step of coating the second mixed solution on the substrate and irradiating light thereon may include: coating the second mixed solution on the substrate; removing a solvent by drying the coated second mixed solution; and irradiating light to a composition of the second mixed solution from which the solvent is removed.

In order to solve the above-mentioned technical problems, the present disclosure provides an organic-inorganic hybrid coating layer.

According to one embodiment, the organic-inorganic hybrid coating layer may include a polymer matrix formed by crosslinking crosslinkable silane compounds bonded to surfaces of colloidal silica particles and organic precursors, and quantum dots dispersed in the polymer matrix.

According to one embodiment, the crosslinkable silane compound may include an alkoxysilane group and an acrylic group, in which the alkoxysilane group may be bonded to a hydroxyl group on the surface of the colloidal silica particle, and the acrylic group may be bonded to an unsaturated hydrocarbon group of the organic precursor.

According to one embodiment, the crosslinkable silane compound may include an acrylic group, and further include acrylamide bonded to the acrylic group, and the polymer matrix may further include that the acrylamide and the organic precursor are crosslinked with each other.

According to one embodiment, the organic precursor may include at least one of dipentaerythritol pentaacrylate (DPPA) or dipentaerythritol hexaacrylate (DPHA).

According to one embodiment, the crosslinkable silane compound may include 4 to 20 parts based on 100 parts by weight of the colloidal silica particles.

According to one embodiment, the crosslinkable silane compound may include at least one of acrylic oxyalkyl trimethoxysilane, methacrylic oxyalkyl trimethoxysilane, methacrylic oxyalkyl triethoxysilane, methacrylic oxyalkyl trichlorosilane, phenyl trichlorosilane, phenyl trimethoxysilane, phenyl triethoxysilane, vinyl trimethoxysilane, vinyl triethoxysilane, vinyl trichlorosilane, methyltrimethoxysilane, methyltriethoxysilane, propyl trimethoxysilane, glycidoxyalkyltrimethoxysilane, glycidoxyalkyltriethoxysilane, glycidoxyalkyltrichlorosilane, perfluoroalkyltrialkoxysilane, perfluoromethyl alkyltrialkoxysilane, or perfluoroalkyl trichlorosilane.

In order to solve the above-mentioned technical problems, the present disclosure provides a method of fabricating a quantum dot nanocapsule.

According to one embodiment, the method of fabricating the quantum dot nanocapsule includes: preparing a first sol composition by mixing a first capsule composition of an organic substance and a second capsule composition of an inorganic substance; preparing a second sol composition by mixing quantum dots and additives in the first sol composition; photopolymerizing the second sol composition to form a structure in which the first capsule composition and the second capsule composition are crosslinked, and simultaneously introducing the quantum dots into the structure to form a bulk capsule structure in which the quantum dots are encapsulated into the structure; forming quantum dot microcapsules by pulverizing the bulk capsule structure; and preparing quantum dot nanocapsules by re-dispersing the quantum dot microcapsules in a solvent.

According to one embodiment, the quantum dot may include tri-octyl phosphine ligand on the surface thereof, and the preparing of the second sol composition may include removing the ligand from a surface of the quantum dot by oxidizing the ligand.

According to one embodiment, the step of forming the quantum dot microcapsules may include pulverizing the bulk capsule structure through a ball-mill process, the step of forming the quantum dot nanocapsule may include re-dispersing the quantum dot microcapsules in a dichlorobenzene solvent.

According to one embodiment, the additive may include at least one of quantum dot dispersant, photoinitiator, or photostabilizer.

According to one embodiment, the quantum dot dispersant may include at least one of methyl methacrylate (MMA), tert-butyl methacrylate (tBMA), acryloyl porpoline (ACMO), N,N'-diethylacrylamide (NDEAA), N-isopropylacrylamide (NIPAM), N,N'-diethylaminoethyl acrylate (NDAEA), N,N'-diethylaminopropyl acrylate (NDAPA), N,N'-dimethylmethacrylamide (NDMMA) or N,N'-dimethylacrylamide (DMA).

According to one embodiment, the photoinitiator may include at least one of 2,2'-demethoxy-2-phenylacetophenone (DMPA), benzophenone (BP), 2-oxo-1,2-diphenylethyl-4-methylbenzenesulfonate (BT), or (1-hydroxycyclohexyl)(phenyl)methanone (HCPM).

According to one embodiment, the photoinitiator may include at least one of 2,2'-demethoxy-2-phenylacetophenone (DMPA), benzophenone (BP), 2-oxo-1,2-diphenylethyl-4-methylbenzenesulfonate (BT), or (1-hydroxycyclohexyl)(phenyl)methanone (HCPM).

According to one embodiment, the photostabilizer may include at least one of 2(3)-t-butyl-4-hydroxytoluene (BHT), Tinuvin 123, Tinuvin 292, Tinuvin 384, or Tinuvin 400.

According to one embodiment, the step of preparing the second sol composition may further include adding an additive solvent for concentration control or an inorganic additive.

According to one embodiment, the inorganic additive may include at least one of silanediamine (SDA), polysilamine (PSA), tetraethoxysilane (TEOS), or tetraisopropoxytitanium (TIPT).

According to one embodiment, the additive solvent may include at least one of propylene glycol monomethyl ester (PGME), or propylene glycol monomethyl ester acetate (PGMEA).

In order to solve the above-mentioned technical problems, the present disclosure provides a quantum dot nanocapsule.

According to one embodiment, the quantum dot nanocapsule includes quantum dots, and a structure foamed by crosslinking a first capsule composition of an organic substance and a second capsule composition of an inorganic substance, and surrounding a surface of the quantum dot, wherein the second capsule composition includes an inorganic oxide precursor, and a modified inorganic oxide precursor which has a surface modified by a silane-based coupling agent, the structure may include that a curable functional group of the first capsule composition and the silane-based coupling agent are crosslinked.

According to one embodiment, the first capsule composition may include at least one of ethylene glycol dimethacrylate (EGDMA), tri(ethylene glycol) dimethacrylate (TEGMMA), 2-(acryloxymethyl)-2-ethylpropane-1,3-diyl diacrylate (AEDA), pentaeryth Lithol triacrylate (PETA), trimethyllopropane triacrylate (TMPTA), dipentaerythritol acrylate (DPEA), dipentaerythritol hexaacrylate (DPHA), dipentaerythritol pentaacrylate (DPPA), triethylopropane ethoxylate triacrylate (TMPET), urethane acrylate, or triazine-tris-(methacrylate).

According to one embodiment, the inorganic oxide precursor may include at least one of aluminum oxide, gallium oxide, indium oxide, silicon oxide, germanium oxide, tin oxide, palladium oxide, titanium oxide, zirconium oxide, or hafnium oxide.

According to one embodiment, the silane-based coupling agent may include at least one of (3-aminopropyl) silanetriol (APST), 3-(trimethoxysilyl) propyl methacrylate (MSPM), 3-(triethoxysilyl)propan-1-amine (TESPA), triethyl(trifluoropetyl)silane (TETFS), 3-(trimethoxysilyl)propyl methacrylate (MAPTMS), 2-(trihydroxysilyl)ethyl methacrylate (HSEM), 3-(triethoxysilyl)propane-1-amine (TEOSPA), trimethoxy(vinyl)silane (VTMS), N-(3-(triethoxysilyl)propyl)acrylamide (ALPTMS) or (triethoxysilyl)methyl acrylate (AMTMS).

In order to solve the above-mentioned technical problems, the present disclosure provides a quantum dot light emitting diode package.

According to one embodiment, the quantum dot light emitting diode package includes: a package body formed therein with a concave groove; a metal substrate disposed on a lower surface of the concave groove; a reflector disposed on a side surface of the concave groove; a light emitting diode disposed on the metal substrate; and a light conversion layer covering the light emitting diode, wherein the light conversion layer may include resin formed by bonding a curable functional group on a surface of inorganic oxide with a crosslinkable material, and quantum dots dispersed on the resin.

According to one embodiment, the light emitting diode may include a flip-chip type light emitting diode.

According to one embodiment, the light conversion layer may include that some of light emitted from the light emitting diode are converted to emit white light.

According to one embodiment, the light emitting diode may include a blue light emitting diode, and the light conversion layer may include a red light emitting quantum dot and a green light emitting quantum dot.

According to one embodiment, the light emitting diode may include a blue light emitting diode, and the light conversion layer may include a yellow light emitting quantum dot for converting light emitted from the blue light emitting diode into white light.

According to one embodiment, the light conversion layer may include at least one quantum dot having a light emitting peak wavelength in a region having a wavelength longer than a light emitting peak wavelength of the light emitting diode.

According to one embodiment, the quantum dot may include at least one of CdS, CdSe, CdTe, ZnS, ZnSe, ZnTe, ZnO, HgS, HgSe, HgTe, GaN, GaP, GaAs, GaSb, AlN, AlP, AlAs, AlSb, InP, InAs, or InSb.

According to one embodiment, the light conversion layer may further include a light scattering agent.

According to one embodiment, the light scattering agent may include at least one of air bubbles, glass beads or polymer beads.

In order to solve the above-mentioned technical problems, the present disclosure provides a method of fabricating a quantum dot light emitting diode package.

According to one embodiment, the method of fabricating the quantum dot light emitting diode package includes: preparing a preliminary package structure including a package body famed therein with a concave groove, a metal substrate disposed on a lower surface of the concave groove, a reflector disposed on a side surface of the concave groove, and a light emitting diode disposed on the metal substrate; and forming a light conversion layer covering the light emitting diode of the preliminary package structure, wherein the light conversion layer may include resin formed by bonding a curable functional group on a surface of inorganic oxide with a crosslinkable material, and quantum dots dispersed on the resin.

According to one embodiment, the step of forming the light conversion layer may include: preparing quantum dot ink including the quantum dot, inorganic oxide having a curable functional group, and a crosslinkable material; injecting the quantum dot ink into the concave groove in which the light emitting diode is formed; and foaming resin in which the curable functional group and the crosslinkable material are crosslinked by using light emitted from the light emitting diode, and forming the light conversion layer including the quantum dots dispersed in the resin.

According to one embodiment, the crosslinkable material may include at least one of oligoacrylate, siloxane-based acrylate, polysilazane, or silicone polymer resin.

The method of fabricating the organic-inorganic hybrid coating layer according to the embodiments of the present invention includes: preparing a gel mixture including an organic precursor and colloidal silica particles; preparing a first mixed solution by heating the gel mixture; preparing a second mixed solution by adding quantum dots to the first mixed solution; and coating the second mixed solution on a substrate and irradiating light thereon to form a polymer matrix in which the organic precursor and the colloidal silica particles are crosslinked, and preparing a coating layer in which the quantum dots are dispersed in the polymer matrix, wherein the organic precursor may be at least any one of dipentaerythritol pentaacrylate (DPPA) or dipentaerythritol hexaacrylate (DPHA).

The organic precursor may be uniformly mixed with the colloidal silica particles. In addition, the colloidal silica particle may have a surface modified with a crosslinkable silane compound, and accordingly, the modified colloidal silica particle and the organic precursor may be crosslinked. Accordingly, the colloidal silica particles are prevented from being agglomerated, so that the coating layer can be prepared to be optically transparent. In addition, as described above, the formed polymer matrix prevents a curling phenomenon, and accordingly, the coating layer can be prepared to have a thin thickness and excellent barrier properties.

In other words, the coating layer can have excellent moisture permeability and oxygen permeability properties, and have high temperature stability. Accordingly, the coating layer can easily prevent the quantum dots from being decomposed according to external environments such as moisture, oxygen, and high temperature.

In addition, the coating layer includes the non-polar organic precursor, and the modified colloidal silica particles, and accordingly, the quantum dots having surfaces modified with the non-polar material can be easily dispersed.

The method of fabricating the quantum dot nanocapsule according to the embodiments of the present invention may include: preparing a first sol composition by mixing a first capsule composition of an organic substance and a second capsule composition of an inorganic substance; preparing a second sol composition by mixing quantum dots and additives in the first sol composition; photopolymerizing the second sol composition to form a structure in which the first capsule composition and the second capsule composition are crosslinked, and simultaneously introducing the quantum dots into the structure to form a bulk capsule structure in which the quantum dots are encapsulated into the structure; forming quantum dot microcapsules by pulverizing the bulk capsule structure; and preparing quantum dot nanocapsules by re-dispersing the quantum dot microcapsules in a solvent.

The step of preparing the first sol composition may include preparing the first sol composition, in which the first capsule composition and the second capsule composition are uniformly dispersed, through a surface chemical reaction between the first capsule composition and the second capsule composition. Accordingly, the first sol composition can easily disperse the quantum dots therein. In other words, the quantum dots in the first sol composition can be easily stabilized.

The second capsule composition may include inorganic oxide precursor, and a silane-based coupling agent bonded to a surface of the inorganic oxide precursor. Accordingly, in the step of photopolymerizing the second sol composition, the prepared structure may include bonding of the silane-based coupling agent with the first capsule composition between the inorganic oxide precursors. In other words, the structure is an inorganic oxide formed by bonding the inorganic oxide precursor, and may include pores famed by bonding of organic substances between the inorganic oxide precursors.

Accordingly, the quantum dots can be easily provided in the pores, so that the stability of the quantum dot can be improved. Accordingly, the prepared bulk capsule structure is subjected to the grinding and the re-dispersing with a solvent, which are relatively simple processes, so that the quantum dot nanocapsules can be prepared.

The method of fabricating the quantum dot light emitting diode package according to the embodiments of the present invention includes: preparing a preliminary package structure including a package body formed therein with a concave groove, a metal substrate disposed on a lower surface of the concave groove, a reflector disposed on a side surface of the concave groove, and a light emitting diode disposed on the metal substrate; and forming a light conversion layer covering the light emitting diode.

The step of forming the light conversion layer may include: preparing quantum dot ink including the quantum dot, inorganic oxide having a curable functional group, and a crosslinkable material; injecting the quantum dot ink into the concave groove in which the light emitting diode is formed; and forming resin in which the curable functional group and the crosslinkable material are crosslinked by using light emitted from the light emitting diode, and forming the light conversion layer including the quantum dots dispersed in the resin.

The resin may provide photo-stability and heat-stability to the quantum dots. Accordingly, the quantum dot light emitting diode may have a structure in which the light conversion layer comes into direct contact with the light emitting diode. In addition, the resin may have moisture permeability and anti-oxygen properties. Accordingly, the resin can easily prevent a phenomenon in which the quantum dots are degraded and decomposed by light, heat, moisture, and oxygen.

In addition, the resin may be easily formed by light emitted from the light emitting diode. Accordingly, process costs of forming the light conversion layer can be easily reduced.

BRIEF DESCRIPTION OF THE DRAWINGS

FIG. 10 is an image before/after ultraviolet (UV) irradiation of the organic-inorganic hybrid coating layer according to the embodiments of the present invention.

FIGS. 22 to 24 photographs obtained by photographing the fabricating process of the quantum dot light emitting diode package according to the embodiments of the present invention.

FIGS. 25 to 28 are photographs obtained by photographing on-chip application results of using 0.5 W-LED of the quantum dot light emitting diode package according to the embodiments of the present invention.

FIGS. 29 and 30 are photographs obtained by photographing on-chip application results of using 8 W-LED of the quantum dot light emitting diode package according to the embodiments of the present invention.

FIGS. 31 and 32 are photographs obtained by photographing on-chip application results of using 8 W-LED of the quantum dot light emitting diode package according to the embodiments of the present invention.

FIG. 33 is a photograph obtained by photographing on-chip application results of using 0.2 W blue bare LED of the quantum dot light emitting diode package according to the embodiments of the present invention.

DETAILED DESCRIPTION OF THE EXEMPLARY EMBODIMENTS

Hereinafter, exemplary embodiments of the present invention will be described in detail with reference to the accompanying drawings. However, the technical idea of the present invention is not limited to the exemplary embodiments described herein and may be embodied in other forms. Further, the embodiments disclosed thoroughly and completely herein may be provided such that the idea of the present invention can be fully understood by those skilled in the art.

Herein, when one component is mentioned as being on another component, it signifies that the one component may be placed directly on another component or a third component may be interposed therebetween. Further, in drawings, thicknesses of films and regions may be exaggerated to effectively describe the technology of the present invention.

In addition, although terms such as first, second and third are used to describe various components in various embodiments of the present specification, the components should not be limited by the tams. The above tams are used merely to distinguish one component from another.

Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it should be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof.

In addition, in the following description of the embodiments of the present invention, the detailed description of known functions and configurations incorporated herein will be omitted when it possibly makes the subject matter of the present invention unclear unnecessarily.

An organic-inorganic hybrid coating layer and a method of fabricating the same according to the embodiments of the present invention will be described with reference to FIGS. 1 to 14.

Figure 1:
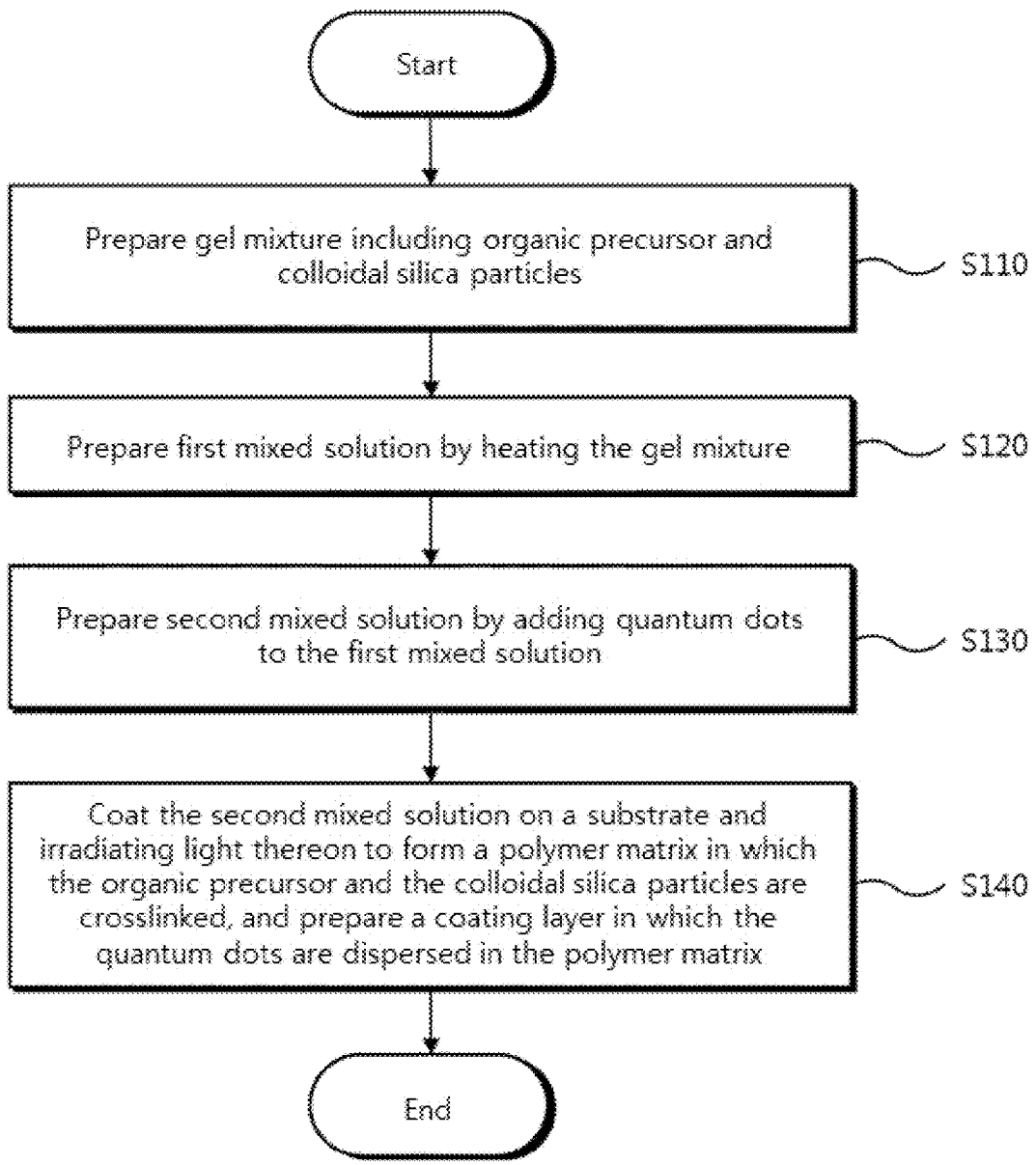
FIG. 1 is a flow chart for illustrating a method of fabricating an organic-inorganic hybrid coating layer according to the embodiments of the present invention.
Figure 2:
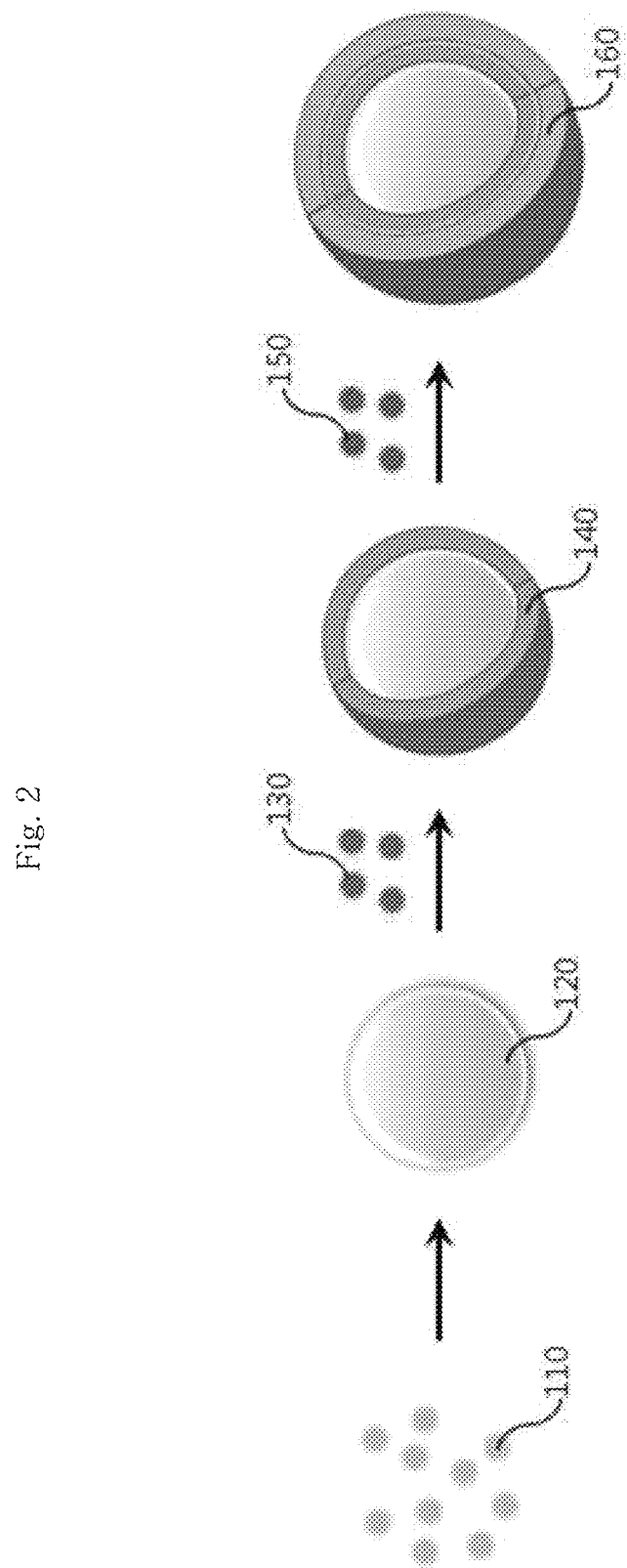
FIGS. 2 and 3 are views for explaining a method of fabricating a polymer matrix according to the embodiments of the present invention.
Figure 3:
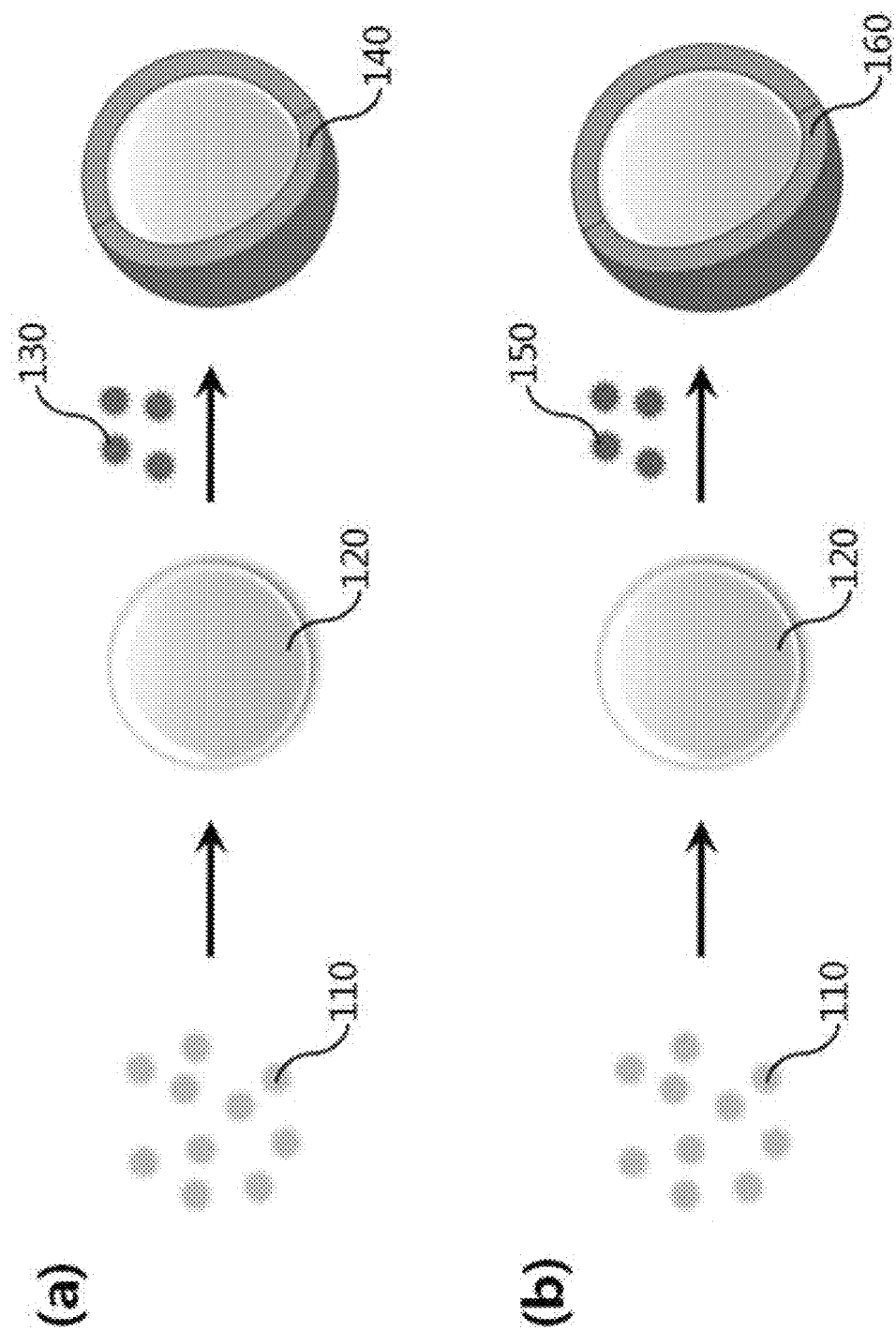
Figure 4:
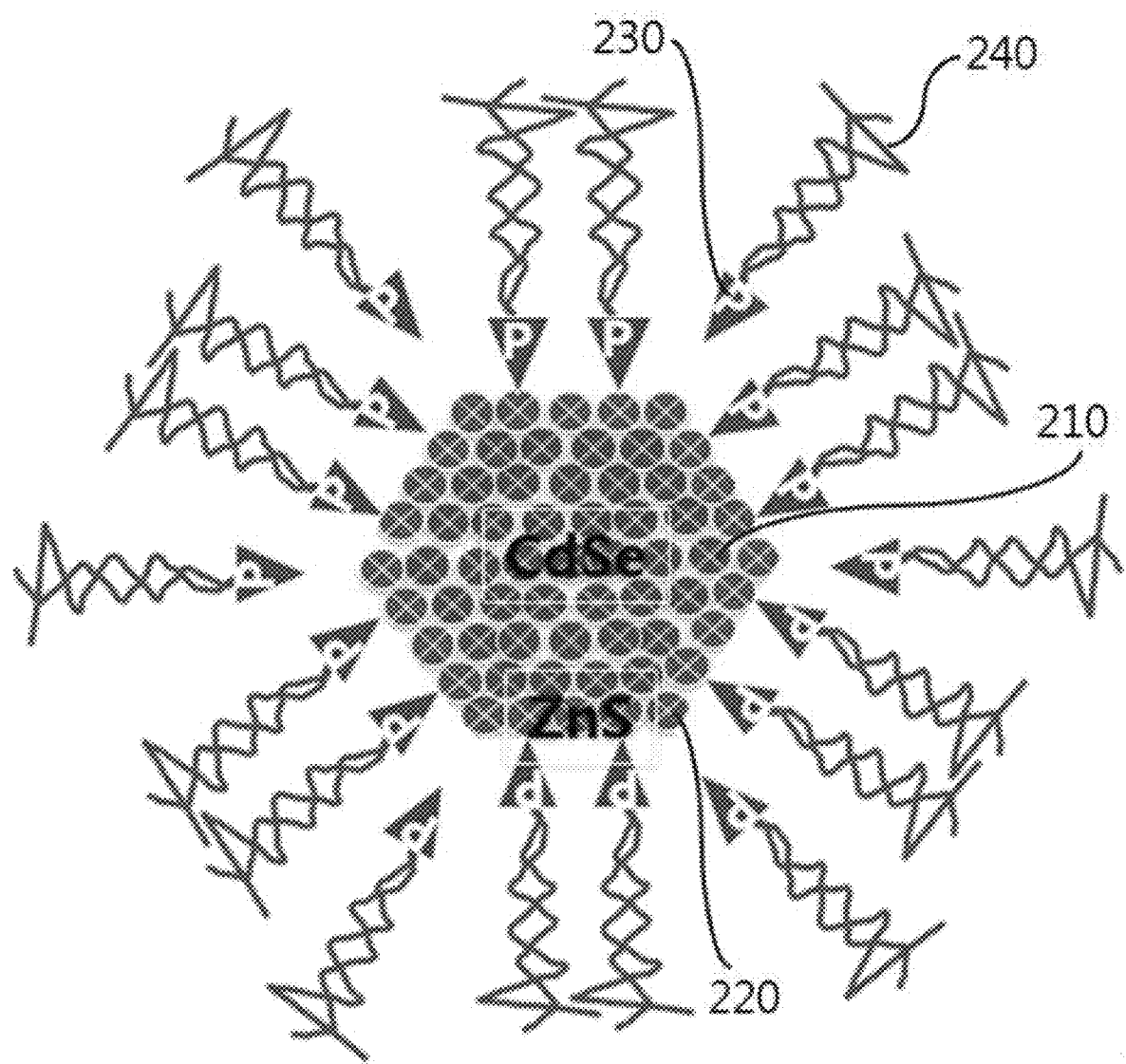
FIG. 4 is a view showing a schematic image of the organic-inorganic hybrid coating layer according to the embodiments of the present invention.

FIG. 1 is a flow chart for illustrating a method of fabricating an organic-inorganic hybrid coating layer according to the embodiments of the present invention. FIGS. 2 and 3 are views for explaining a method of fabricating a polymer matrix according to the embodiments of the present invention. FIG. 4 is a view showing a schematic image of the organic-inorganic hybrid coating layer according to the embodiments of the present invention.

Referring to FIGS. 1 to 3, a gel mixture including an organic precursor and colloidal silica particles 120 may be prepared (S110);

Specifically, for example, the organic precursor may include at least one of dipentaerythritol pentaacrylate (DPPA) represented by the following <Formula 1>, or dipentaerythritol hexaacrylate (DPHA) represented by the following <Formula 2>. In other words, the organic precursor may be 5 equivalents or 6 equivalents of acrylate-based resin. When the organic precursor includes both of the dipentaerythritol pentaacrylate (DPPA) and the dipentaerythritol hexaacrylate (DPHA), the mixing molar ratio may range from 1:1 to 1:10.

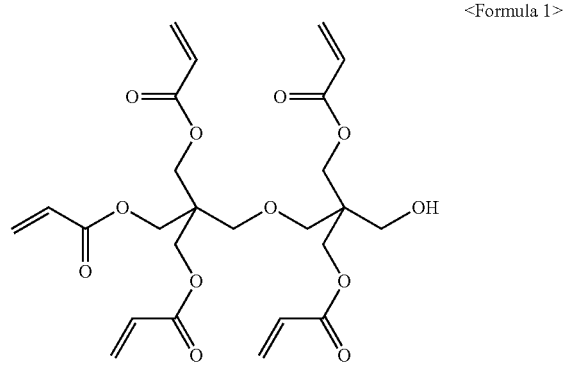

<Formula 1>

<Formula 2>

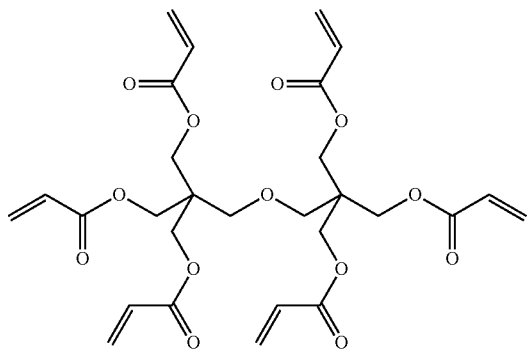

In general, the organic precursor may include the dipentaerythritol pentaacrylate (DPPA) alone. However, the dipentaerythritol pentaacrylate (DPPA) and the dipentaerythritol hexaacrylate (DPHA) may have physical properties similar to each other. Accordingly, even when the dipentaerythritol hexaacrylate (DPHA) is included more, or the dipentaerythritol pentaacrylate (DPPA) is all replaced with the dipentaerythritol hexaacrylate (DPHA) the organic precursor may obtain similar or identical properties.

The organic precursor may have toxic less than organic precursors used in the related art, may exhibit excellent physical properties that the curing phenomenon is prevented. The organic precursor may have excellent adhesion on the substrate, and may have excellent processability. In addition, when bonded with the colloidal silica particles 120, the organic precursor may easily stabilize the colloidal silica particles 120. Accordingly, the coating composition including the organic precursors and the colloidal silica particles 120 may have improved physical properties such as barrier properties, adhesion, weather resistance, curling resistance, and pollution resistance.

The colloidal silica particles 120 may be silica particles having a particle diameter larger than those of molecules or ions, and dispersed in a liquid medium to have a colloidal state. In other words, the colloidal silica particles 120 may be in a non-aggregated state, and accordingly, may be uniformly dispersed in the solvent. Accordingly, the coating composition including the colloidal silica particles 120 may be prepared in the form of a thin film having excellent light transmittance.

As shown in FIG. 2, the colloidal silica particles 120 may be prepared by reacting the silica precursor 110. For example, the silica precursor 110 may be at least one selected from silicon tetrachloride, ethyl silicate, water glass, or finely divided silica, and the colloidal silica particles 120 may be prepared by any one of an electrodialysis scheme or a sol-gel scheme.

For example, the colloidal silica particles 120 may have an average particle diameter of 5 nm to 1000 nm, specifically 10 nm to 50 nm. Unlike the above description, when the average particle diameter is less than 5 nm, the size of the colloidal silica particles 120 is very small, and the processability may be deteriorated. In addition, when the average particle diameter is more than 1000 nm, the dispersibility of the colloidal silica particles 120 may be lowered, and accordingly, optical properties of the coating composition including the colloidal silica particles 120 may be deteriorated. In other words, the coating composition may not be optically transparent.

However, as described above, when the average particle diameter of the colloidal silica particles 120 nm is 5 to 1000 nm, the colloidal silica particles 120 may be easily dispersed, and accordingly, the transparency of the coating composition may be easily improved as described above.

In addition, the colloidal silica particles 120 may be dispersed in the liquid medium, and accordingly, a sol having flowability may be prepared. The colloidal silica particles 120 may be represented by the following <Formula 3>. In other words, the colloidal silica particles 120 may have a hydroxyl group (OH) on the surface. Specifically, for example, the liquid medium may be at least any one of water, alcohol-aqueous solution, lower aliphatic alcohol, toluene, ethylene glycol, dimethyl acetamide or formamide.

<Formula 3>

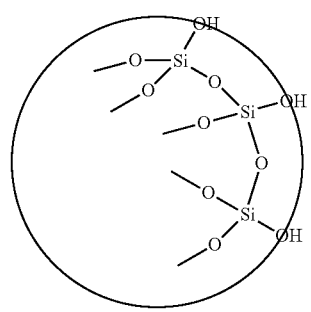

Accordingly, when the liquid medium is water, the colloidal silica particles 120 may have negative charges generated on the surface, so as to be easily dispersed in the liquid medium. Specifically, for example, the sol in which the colloidal silica particles 120 are dispersed in water as the liquid medium may be at least any one selected from Nalco 2327, Nalco 1040, Nalco 1060, Nalco 1030, Nalco 1115, or the like.

Unlike the above description, when the silica particles in a powder state other than the colloidal silica particles 120 are mixed in the gel mixture, it may not be easy to uniformly disperse the organic material precursor and the silica particles. Specifically, for example, the silica particles in a powder state may be either fumed-silica or silica gel.

However, as described above, when the colloidal silica particles 120 are in a sol state dispersed in an aqueous solution, the gel mixture may have a form in which the colloidal silica particles 120 and the organic precursor are uniformly dispersed. Accordingly, as described above, the transparency of the coating composition may be easily improved.

The colloidal silica particles 120 may be replaced with inorganic oxide other than the silica particles. For example, the inorganic oxide may be at least one of titania, alumina, zirconia, vanadia, chromia, iron oxide, antimony-oxide, or tin-oxide. Alternatively, for another example, any one of the inorganic oxides may be included in or doped with another inorganic oxide.

Specifically, for example, the colloidal silica particles 120 may be the colloidal silica particles 120 having a surface modified with a crosslinkable silane compound. For example, a curable functional group and an alkoxysilane group may be included at both ends of the crosslinkable silane compound. The modified colloidal silica particles 120 may be prepared by bonding the hydroxyl group and the alkoxysilane group, and accordingly, the modified colloidal silica particles 120 represented by the following <Formula 4> may contain a curable functional group on the surface.

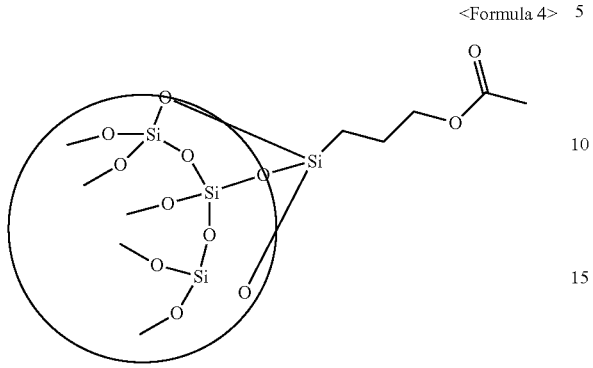

<Formula 4>

For example, the crosslinkable silane compound may be at least any one of acrylic oxyalkyl trimethoxysilane, methacrylic oxyalkyl trimethoxysilane, methacrylic oxyalkyl triethoxysilane, methacrylic oxyalkyl trichlorosilane, phenyl trichlorosilane, phenyl trimethoxysilane, phenyl triethoxysilane, vinyl trimethoxysilane, vinyl triethoxysilane, vinyl trichlorosilane, methyltrimethoxysilane, methyltriethoxysilane, propyl trimethoxysilane, glycidoxyalkyltrimethoxysilane, glycidoxyalkyltriethoxysilane, glycidoxyalkyltrichlorosilane, perfluoroalkyltrialkoxysilane, perfluoromethyl alkyltrialkoxysilane, or perfluoroalkyl trichlorosilane.

Specifically, for example, the crosslinkable silane compound may be provided with 4 to 20 parts based on 100 parts by weight of the colloidal silica particles 120. Unlike the above description, when less than 4 parts by weight are provided, the dispersibility of the colloidal silica particles 120 may be reduced, and when more than 20 parts by weight are provided, barrier properties of the coating composition may be deteriorated.

However, as described above, when the crosslinkable silane compound is provided in an amount of 4 to 20 parts by weight based on 100 parts by weight of the colloidal silica particles 120, the colloidal silica particles 120 may be easily dispersed without agglomeration of the colloidal silica particles 120. Accordingly, as described above, the transparency and the barrier properties of the coating composition may be easily improved.

In addition, the modified colloidal silica particles 120 may further include acrylamide bonded with the crosslinkable silane compound. The modified colloidal silica particles 120 may be represented by the following <Formula 5>. The acrylamide may prevent a curling phenomenon of the coating composition. Accordingly, a curling resistance of the coating composition may be easily improved.

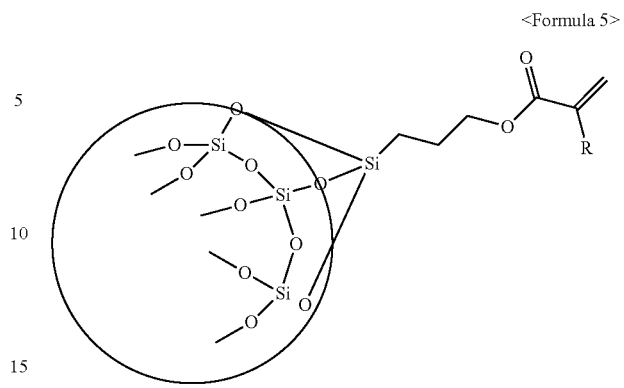

<Formula 5>

The modified colloidal silica particles 120 prepared in the above manner may exhibit excellent optical properties. In addition, the modified colloidal silica particles 120 may be easily improved in properties such as water repellency, antioxidant, heat dissipation, photochromic, and surface strength. Accordingly, the modified colloidal silica particles 120 may be coated on the substrate so as to be used as a barrier layer.

The gel mixture may be prepared by mixing an organic precursor solution with the modified colloidal silica particles 120. The organic material precursor solution may be prepared by heating the organic material precursor. For example, The gel mixture may include 100 parts by weight of the colloidal silica particles 120, 10 to 80 parts by weight of the organic precursor may be provided based on 100 parts by weight of the colloidal silica particles 120, and specifically, 30 to 60 parts by weight may be provided.

According to one embodiment, the gel mixture may include a structure prepared by the reaction mechanism shown in FIG. 2. Specifically, as described above, the prepared colloidal silica particles 120 may react with first organic material precursors 130 (for example, dipentaerythritol pentaacrylate (DPPA)), and accordingly, first oligomers 140 in which some of the first organic material precursors 130 are bonded to surfaces of the colloidal silica particles 120 with a low degree of polymerization may be prepared. After the first oligomers 140 are prepared, the first oligomers 140 may react with the second organic material precursors 150 (for example, dipentaerythritol hexaacrylate (DPHA)), and accordingly, second oligomers 160 in which the second organic material precursors 150 are bonded to surfaces of the first oligomers 140 may be prepared. In other words, the gel mixture may include a structure of the colloidal silica particles 120, the first oligomers 140 surrounding the colloidal silica particles 120, and the second oligomers 160 surrounding the first oligomers 140.

According to another embodiment, the gel mixture may include a structure prepared by the reaction mechanism shown in FIG. 3. Specifically, the colloidal silica particles 120 may react with the first organic material precursors 130 (for example, dipentaerythritol pentaacrylate (DPPA)) or the second organic material precursors 150 (for example, dipentaerythritol Hexaacrylate (DPHA)), and accordingly, the first oligomers 140 or the second oligomers 160 may be prepared on the surfaces of the colloidal silica particles 120. In other words, the gel mixture may include at least one of a structure of the colloidal silica particles 120, and the first oligomers 140 surrounding the colloidal silica particles 120, or a structure of the colloidal silica particles 120 and the second oligomers 160 surrounding the colloidal silica particles 120.

As described above, the organic precursors react in the gel mixture to have a low degree of polymerization, so that the oligomers may be prepared. Methanol in equivalent amounts the same as the organic precursors used for preparing the oligomers may be formed. Accordingly, the gel mixture may include methanol.

The gel mixture may further include at least one additive of pentaerythritol acrylate (PETA) represented by the following <Formula 6>, and N,N'-dimethylacrylamide (DMA) or fluorine compounds represented by the following <Formula 7>. Specifically, the additive may be added in the step of preparing the organic precursor solution. In other words, the organic precursor solution may be prepared by heating the mixture of the organic precursor and the additive. The organic precursor and the additive may be materials having a high viscosity, and accordingly, the organic precursor solution may be prepared by heating to a temperature at which the viscosity of the organic precursor and the additive decreases. Specifically, for example, the organic precursor solution may be prepared after heated at a temperature of 49° C. or higher.

For example, 10 to 60 parts by weight of the pentaerythritol acrylate (PETA) and N,N'-dimethylacrylamide (DMA) may be included relative to 100 parts by weight of the colloidal silica particles 120, and accordingly, the curling phenomenon of the coating composition may be alleviated.

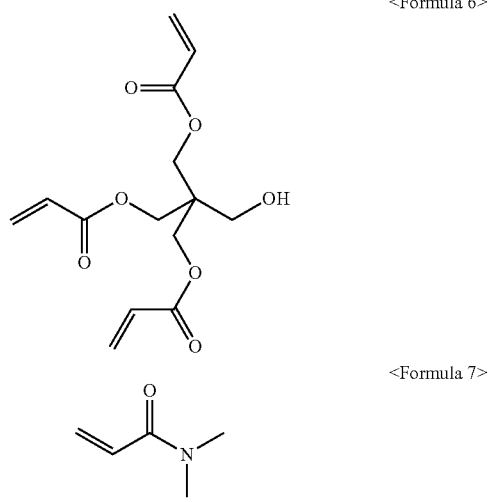

<Formula 6>

<Formula 7>

Alternatively, for another example, the fluorine compound may include 1 to 20 parts by weight based on 100 parts by weight of the colloidal silica particles 120. The fluorine compound may have both hydrophobicity and oleophobicity. Specifically, for example, the fluorine compound may include both fluorinated silane residue and hydrolyzable silane residue. Accordingly, the fluorine compound may be easily bonded to the surface of the colloidal silica particles 120, and may improve heat dissipation properties of the coating composition.

Specifically, after the crosslinkable silane compound is bonded to the surface of the colloidal silica particles 120, the fluorine compound may be mixed with the modified colloidal silica particles 120. Unlike the above description, when the crosslinkable silane compound is added into the solution in which the colloidal silica particles 120 and the fluorine compound are mixed, the colloidal silica particles 120 may be agglomerated.

However, as described above, when the modified colloidal silica particles 120 is mixed with the fluorine compound, the fluorine compound may be easily bonded to the surface of the modified colloidal silica particles 120, and accordingly, the heat dissipation properties of the coating composition may be easily improved. Specifically, for example, the fluorine compound may be zonyl acrylate (C8F17C2(OH) 4O(CO)CH2=CH2) represented by the following <Formula 8>.

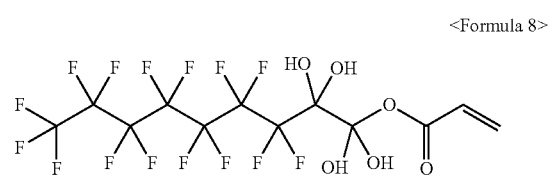 [SMILES: C=CC(=O)OC(O)(O)C(O)(O)C(F)(F)C(F)(F)C(F)(F)C(F)(F)C(F)(F)C(F)(F)C(F)(F)F]

<Formula 8>

Referring to FIG. 1, the first mixed solution may be prepared by heating the gel mixture (S120).

As described above, some of the organic precursors and the modified colloidal silica particles 120 may react in the gel mixture. In other words, some of the organic precursors may react to form the oligomer. Accordingly, the gel mixture may include organic precursors that do not participate in the reaction for forming the oligomer, and the modified colloidal silica particles 120. In addition, the gel mixture may include the methanol produced by the reaction for forming the oligomer, and the colloidal silica particles 120 having the modified surface to which the oligomer is bonded.

When the gel mixture is heated, the methanol may be removed. At the same time, the first mixed solution in which the organic precursors, the modified colloidal silica particles 120, and the colloidal silica particles 120 having the modified surface to which the oligomer is bonded are uniformly mixed may be prepared. Specifically, for example, the gel mixture may be heated to a temperature of 49° C. or higher. In other words, the colorless and transparent first mixed solution may be prepared by heating the white gel mixture.

The second mixed solution may be prepared by adding quantum dots to the first mixed solution (S130).

The second mixed solution may include the first mixed solution, the quantum dots, and a photoinitiator.

Accordingly, the coating composition including the second mixed solution may be prepared. Specifically, the second mixed solution may be prepared by dropwise adding a solution formed by dispersing the quantum dots in a chloroform solvent into the first mixed solution. Unlike the above description, when a large amount of the quantum dots are added at once, the quantum dots may not be uniformly distributed in the second mixed solution.

However, as described above, when the quantum dots are dropwise added, the quantum dots may be uniformly distributed in the second mixed solution, and accordingly, the optical transparency of the coating composition may be easily improved as described above.

Specifically, for example, the photoinitiator may be at least any one of 2,2'-dimethoxy-2-phenylacetophenone (DMPA), 2-oxo-1,2-diphenylethyl-4-methylbenzenesulfonate (BT), benzophenone (BP), or (1-hydroxycyclohexyl)(phenyl)methanone (Irgacure 184).

The quantum dot may have a core-shell structure. For example, the quantum dot may include cadmium selenide (CdSe) as a quantum dot core 210, and zinc sulfide (ZnS) as a quantum dot shell 220.

In addition, the quantum dot may include a capping layer 230 on a surface thereof. For example, the capping layer 230 may be trioctylphosphine (TOP) represented by the following <Formula 9>.

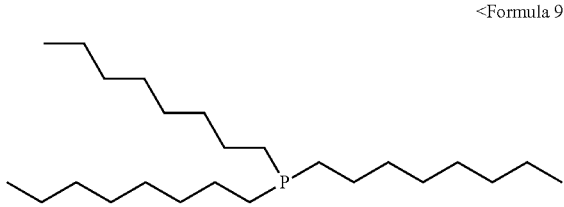

<Formula 9>

The trioctylphosphine may be a non-polar compound, and accordingly, may prevent the quantum dots from being combining with moisture in the air and decomposed. Unlike the above description, when the capping layer 230 is a polar compound, the polar compound may be easily combined with the moisture, and accordingly, the quantum dots may be decomposed by the moisture. However, as described above, the capping layer 230 may be the non-polar compound, and accordingly, the quantum dots may be easily prevented from being decomposed.

Referring to FIGS. 1 and 4, a polymer matrix 240 in which the organic precursor and the colloidal silica particles 120 are crosslinked may be formed by coating the second mixed solution on a substrate and irradiating light thereon, and a coating layer in which the quantum dots are dispersed in the polymer matrix 240 may be prepared (S140).

The step of preparing the coating layer may include: coating the second mixed solution on the substrate; thermally treating the coated second mixed solution to remove a solvent; and irradiating light to a composition of the second mixed solution from which the solvent is removed.

The step of coating the second mixed solution may include flow-coating the second mixed solution on the substrate. In other words, the second mixed solution is sprayed from a fixed nozzle, simultaneously the substrate may pass under the nozzle, and accordingly, the second mixed solution may be coated on the substrate. Specifically, for example, the coating layer may be prepared by any one of a flow coater method or a curtain coater method. For example, the above substrate may be any one selected from plastic, glass, ceramic, and the like.

The step of thermally treating the coated second mixed solution may include fabricating a thin film by removing and drying the solvent contained in the coated thin film of the second mixed solution. As described above, the second mixed solution may include the chloroform solvent used for dispersion of the quantum dots. Accordingly, the chloroform solvent may be removed by thermally treating the thin film. Specifically, for example, the thin film may be dried after heated in an oven or hot plate at 60° C. for 3 minutes.

Unlike the above description, the step of thermally treating the thin film may not be included. In other words, after the thin film is prepared, light may be continuously irradiated onto the thin film. In this case, a phenomenon in which a surface of the thin film is cracked may occur.

However, as described above, when the thin film is thermally treated and light is irradiated to the dried thin film, the surface of the photo-cured thin film, that is, the coating layer may not be cracked. Accordingly, the coating layer having improved barrier properties may be easily prepared.

the step of irradiating the light to the dried composition of the second mixed solution from which the solvent is removed may include irradiating light on the dried thin film to prepare the polymer matrix 240 in which the modified colloidal silica particles 120 and the organic precursor are crosslinked. The quantum dot may be uniformly dispersed in the polymer matrix 240.

Specifically, for example, the second mixed solution may include the modified colloidal silica particles 120, dipentaerythritol pentaacrylate (DPPA), and pentaerythritol acrylate (PETA) as an additive. In this case, the composition of the second mixed solution may be schematically represented as in the following <Formula 10> to <Formula 12>. Specifically, the modified colloidal silica particles 120 may be represented by the following <Formula 10>, the dipentaerythritol pentaacrylate (DPPA) may be represented by the following <Formula 11>, and the pentaerythritol acrylate (PETA) may be represented by the following <Formula 12>.

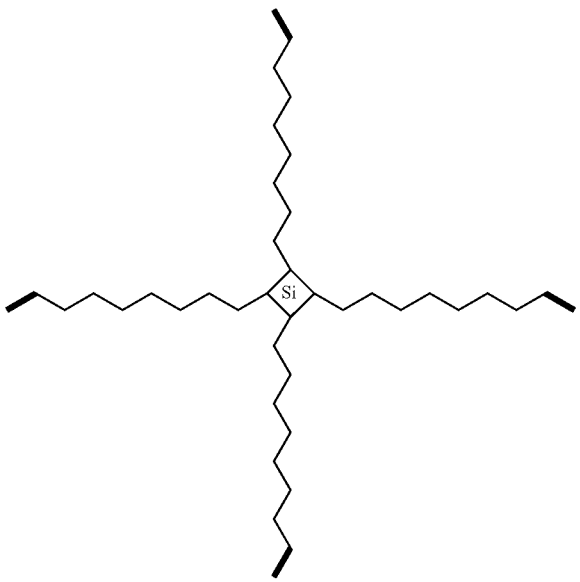

<Formula 10>

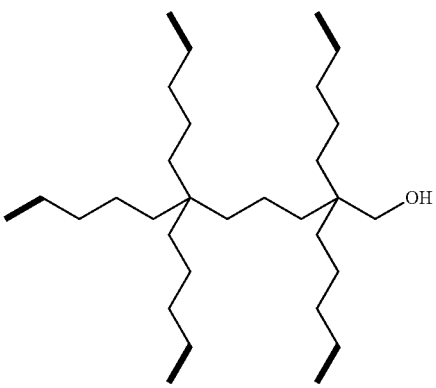

<Formula 11>

-continued

<Formula 12>

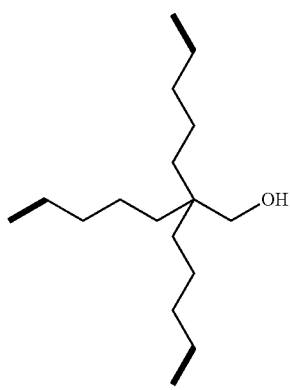

Accordingly, as described above, when light is irradiated to the dried thin film, the modified colloidal silica particles 120, the organic precursor, and the additive may be cured. In other words, the polymer matrix 240 may be formed after the modified colloidal silica particles 120, the organic material precursor, and the additive are crosslinked.

As described above, the prepared polymer matrix 240 may be formed by a HOMO polymerization reaction or an exchange polymerization reaction between the modified colloidal silica particles 120, the organic material precursor, and the additive.

Specifically, when the polymer matrix 240 is formed by the HOMO polymerization reaction, a coupling reaction between the same compositions may be carried out. For example, the HOMO polymerization reaction may occur between the modified colloidal silica particles 120 and the modified colloidal silica particles 120 represented by the following <Formula 13>.

<Formula 13>

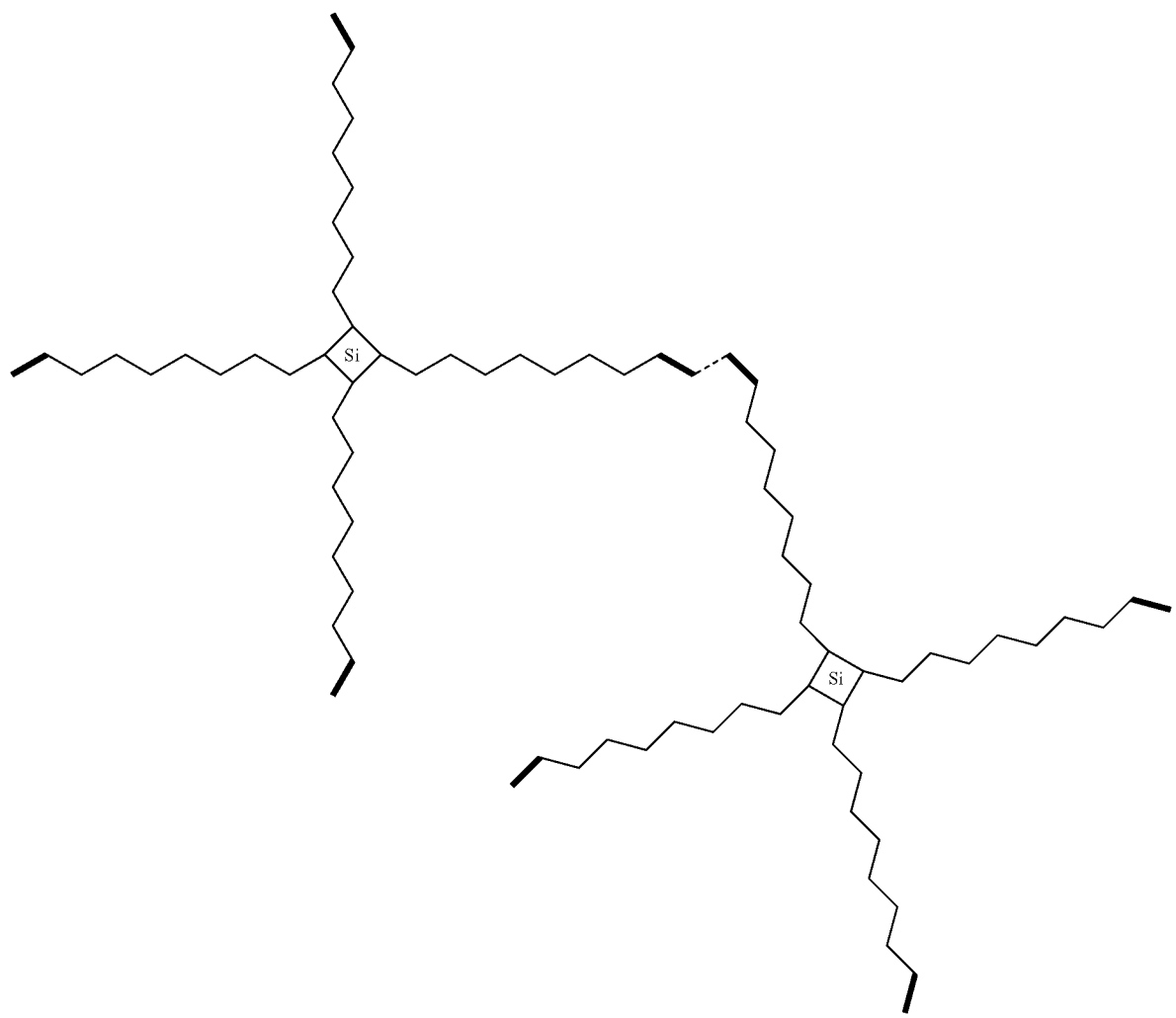

For another example, the HOMO polymerization reaction may occur between the organic precursor and the organic precursor represented by the following <Formula 14>.

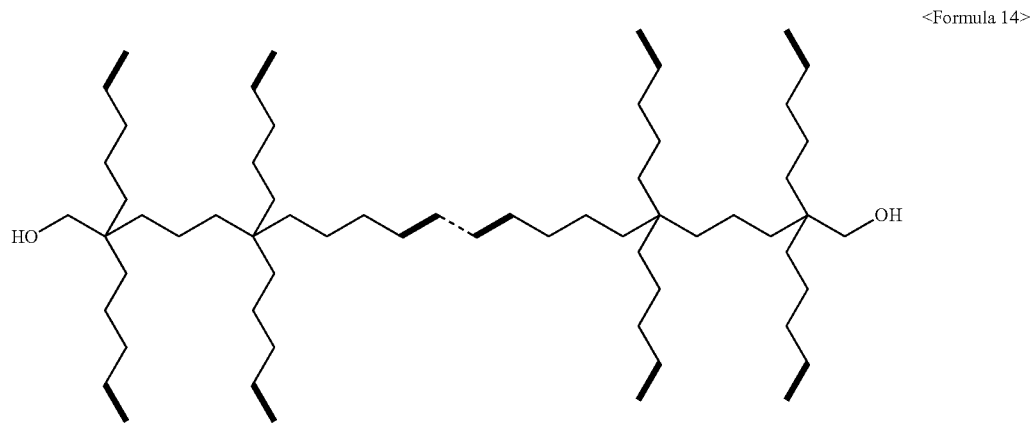

<Formula 14>

For still another example, the HOMO polymerization reaction may occur between the additive and the additive represented by the following <Formula 15>.

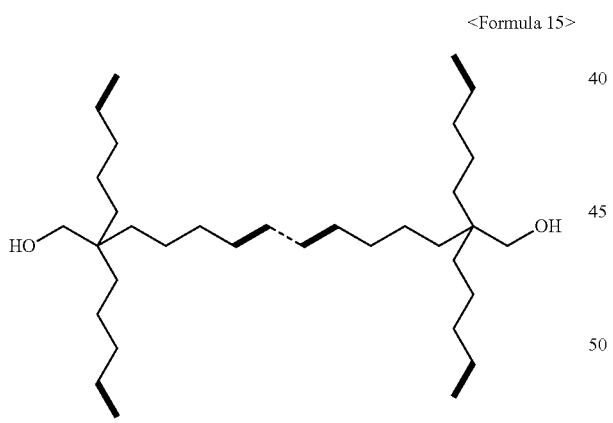

<Formula 15>

In addition, when the polymer matrix 240 is formed by the exchange polymerization reaction, a bonding reaction between different compositions may be carried out. Specifically, for example, the exchange polymerization reaction may occur between the modified colloidal silica particles 120 represented by the following <Formula 16> and the organic precursor.

<Formula 16>
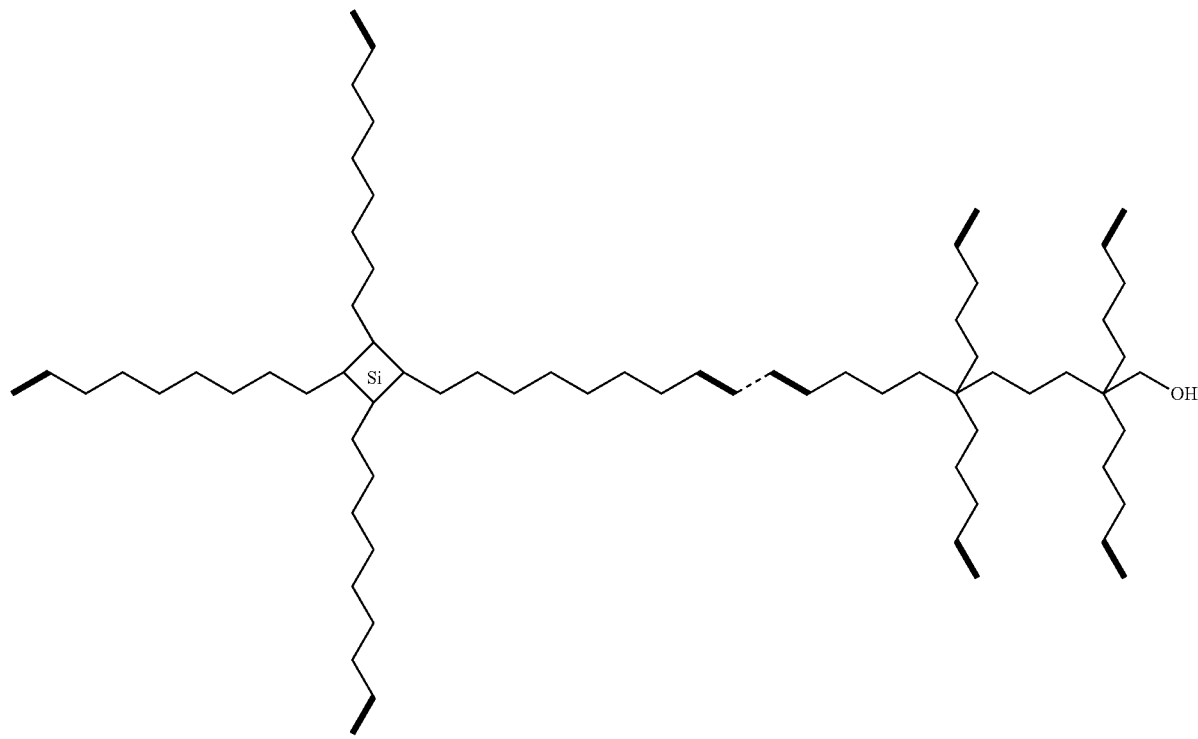
For another example, the exchange polymerization reaction may occur between the modified colloidal silica particles 120 represented by the following <Formula 17> and the additive.
<Formula 17>
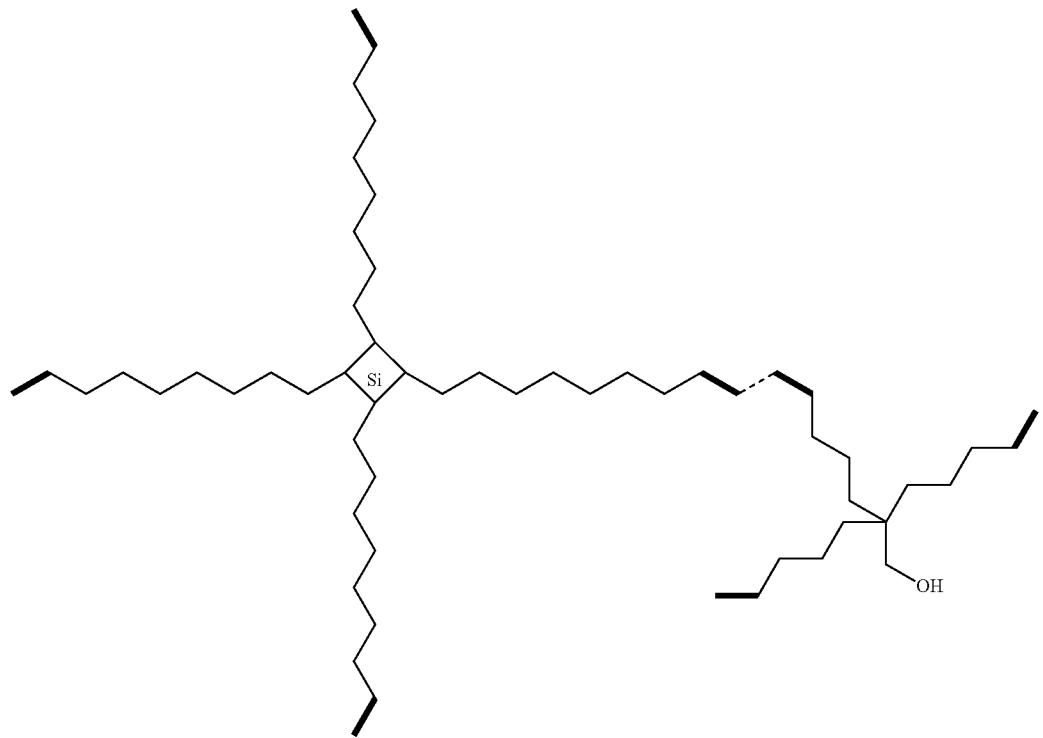

For still another example, the exchange polymerization reaction may occur between the additive represented by the following <Formula 18> and the organic precursor.

<Formula 18>

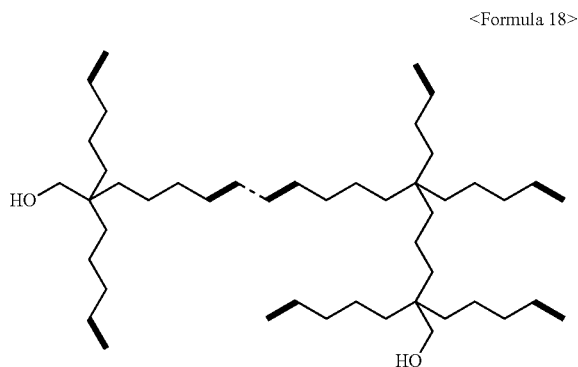

For still another example, any one of the curable functional groups of the modified colloidal silica particles 120 represented by the following <Formula 19> may be exchange polymerized with the organic precursor, and another one of the curable functional groups may be exchange polymerized with the additive.

pound may contain an acrylic group, and the acrylic group and the unsaturated hydrocarbon group of the organic precursor are bonded, so that the polymer matrix 240 may be formed. As described above, the modified colloidal silica particles 120 may further include the acrylamide on the surface thereof. In other words, the acrylic group may be bonded to the acrylamide. Accordingly, the polymer matrix 240 may include bonding of the acrylamide and the organic precursor.

The organic precursor may be uniformly dispersed with the colloidal silica particles 120, and accordingly, the colloidal silica particles 120 may be prevented from being agglomerated. In other words, the coating layer may be optically transparent. In addition, the colloidal silica particles 120 may have the surface which is modified, and accordingly, the polymerization reaction with the organic material precursor may occur. Accordingly, the coating layer may include the polymer matrix 240 in which organic and inorganic materials are bonded.

In general, the quantum dot may easily lose the light emitting properties in an air, moisture, or ultraviolet (UV) light condition. However, when the quantum dots are distributed in the polymer matrix 240 according to the embodiments of the present invention, the stability of the quantum dot can be improved.

<Formula 19>

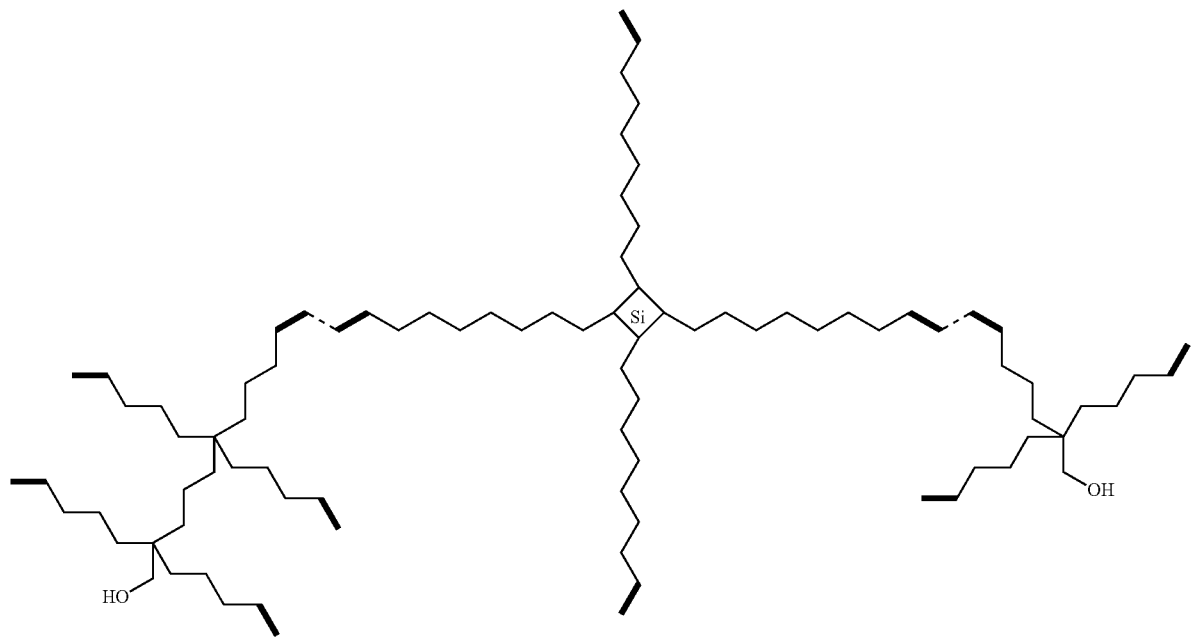

Accordingly, as shown in FIG. 4, the coating layer, which includes the quantum dot famed with the core-shell structure, the capping layer 230 on the surface of the quantum dot, and the polymer matrix 240 formed on the surface of the capping layer 230, may be formed.

As described above, the polymer matrix 240 may have a shape in which the modified colloidal silica particles 120 and the organic precursor are crosslinked. Specifically, the modified colloidal silica particles 120 may have a hydroxy group on the surface thereof, and the hydroxy group and the alkoxysilane group of the crosslinkable silane compound may be bonded. In addition, the crosslinkable silane com- In addition, the quantum dot may have the surface modified by the non-polar material, and accordingly, the organic precursor may include the non-polar curable functional group. Accordingly, the quantum dots may be uniformly dispersed in the polymer matrix 240.

In other words, the coating layer may include the modified colloidal silica particles 120 as a barrier layer of the quantum dot. Specifically, for example, the coating layer may be easily used in a thermo-curable or thermo-plastic product group. The plastic product group has excellent properties such as stiffness, dimensional stability, transparency, and impact resistance, but may be decomposed by moisture, air and ultraviolet (UV). Accordingly, the coating layer may be easily provided as a barrier material for the plastic product group. For example, the plastic product group may be any one selected from camera lenses, spectacle lenses, binocular lenses, retroreflective sheets, car windows, building windows, train windows, boat windows, aircraft windows, headlights and taillights for transportation, display cases, ship hulls, road pavement signs, overhead projectors, stereo cabinet doors, stereo covers, furniture, bus stop plastics, television screens, computer screens, clock covers, instrument gauge covers, optical and magneto-optical recording discs, and the like. In addition, a base material of the plastic product group may be any one selected from polycarbonate, polymethacrylate, polyurethane, polyester, polyamide, polyimide phenoxy, phenolic resin, cellulose resin, polystyrene, styrene copolymer, epoxy, or the like. The coating layer may be provided on a surface of the plastic product group through any one process selected from spin coating, gravure coating, flow coating, spray coating, brush or roller-used coating, screen printing, knife coating, curtain coating, slide curtain coating, extrusion, rubber roller coating, and the like.

Hereinafter, evaluation results will be described with respect to the method of fabricating an organic-inorganic hybrid coating layer and properties thereof according to a specific experimental example of the present invention.

Preparation of Organic-Inorganic Hybrid Coating Layer According to Experimental Example Dipentaerythritol pentaacrylate (DPPA) as the organic precursor, 3-methacrylic oxypropyl trimethoxysilane as the crosslinkable silane compound, Igacure 184 as the photoinitiator, and CdSe@ZnS as the quantum dot were prepared.

Herein, 65 g of dipentaerythritol pentaacrylate (DPPA) was provided to a reaction vessel and heated to 49° C., so that a precursor solution was prepared.

A first mixture was prepared by adding 100 g of silica (88% of solid content 40%, average particle diameter 20 nm, commercially available as Nalco 2327 of Nal Corporation of Naperville, Ill.) was added to the precursor solution.

A second mixture was prepared by adding 15 g of 3-methacrylic oxypropyl trimethoxysilane (commercially available as A174 manufactured by Union Carbide Corporation) to the first mixture.

A third mixture was prepared by adding 0.3 g of butylated hydroxy toluene (BHT) as a photostabilizer and 0.04 g of phenothiazine as another photostabilizer into the second mixture.

a stripping process is performed to remove most of water and methanol in the third mixture by gently vacuum distilling the third mixture at a pressure range of 80 mmHg to 120 mmHg in a temperature range of 50° C. to 54° C., and accordingly, a solid content was generated.

When the stripping process is significantly completed, the solid was distilled by using a solvent mixture obtained by mixing isopropyl alcohol (IPA) and distilled water in the weight ratio of 14:1, until the solid has the content of 50%.

The solid content diluted to 50% was further diluted to 25% by using the solvent mixture.

A coating solution was prepared by adding 1.5 g of Irgacure 184 (commercially available as Irgacure 184 manufactured by Ciba Geigy Corporation in Horton, N.Y.), and CdSe@ZnS quantum dots to the solid content diluted to 25%.

The coating solution was prepared as a barrier layer having a thickness of 2.5 mm on a polyethylene terephthalate (PET) substrate through a conventional flow coating technique for a ceramic composition.

A drying process was performed to remove most of the isopropyl alcohol by flash-drying the coated substrate in an air circulation oven at a temperature of 60° C. for 2.5 minutes. After the drying process, a high-pressure mercury lamp (commercially available as QC 1202 manufactured by PPG Industries in Plainfield, Ill.) is used, so that the barrier layer was cured inside an ultraviolet light processor. The curing was subject to 20 m/min, 400 V, 100 mJ/cm2 and atmospheric conditions.

Accordingly, the organic-inorganic hybrid coating layer adhered on the substrate transparent and emitting red light upon irradiation with an ultraviolet (UV) lamp was prepared according to an experimental example.

Figure 5:
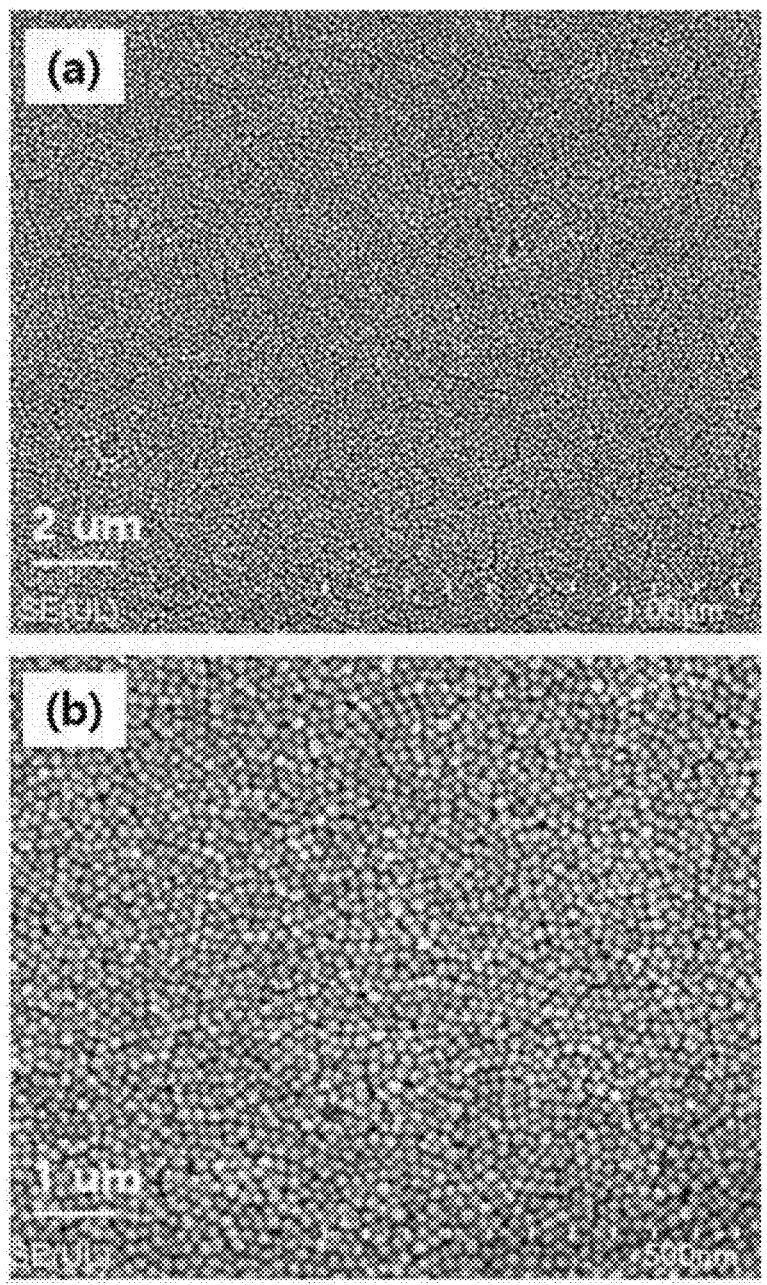
FIG. 5 is a scanning electron microscope (SEM) image of an intermediate produced during fabricating the organic-inorganic hybrid coating layer according to the embodiments of the present invention.

FIG. 5 is a scanning electron microscope (SEM) image of an intermediate produced during fabricating the organic-inorganic hybrid coating layer according to the embodiments of the present invention.

Referring to FIG. 5, a surface image of the intermediate formed during the fabricating process of the coating layer can be confirmed. As shown in FIGS. 2 and 3, the intermediate may include the organic precursor oligomerized on the surface of the modified colloidal silica particles.

As shown in FIG. 5, it can be seen that the modified colloidal silica particles are uniformly dispersed in the intermediate. Accordingly, it can be seen that the organic precursor uniformly distributes the modified colloidal silica particles.

Figure 6:
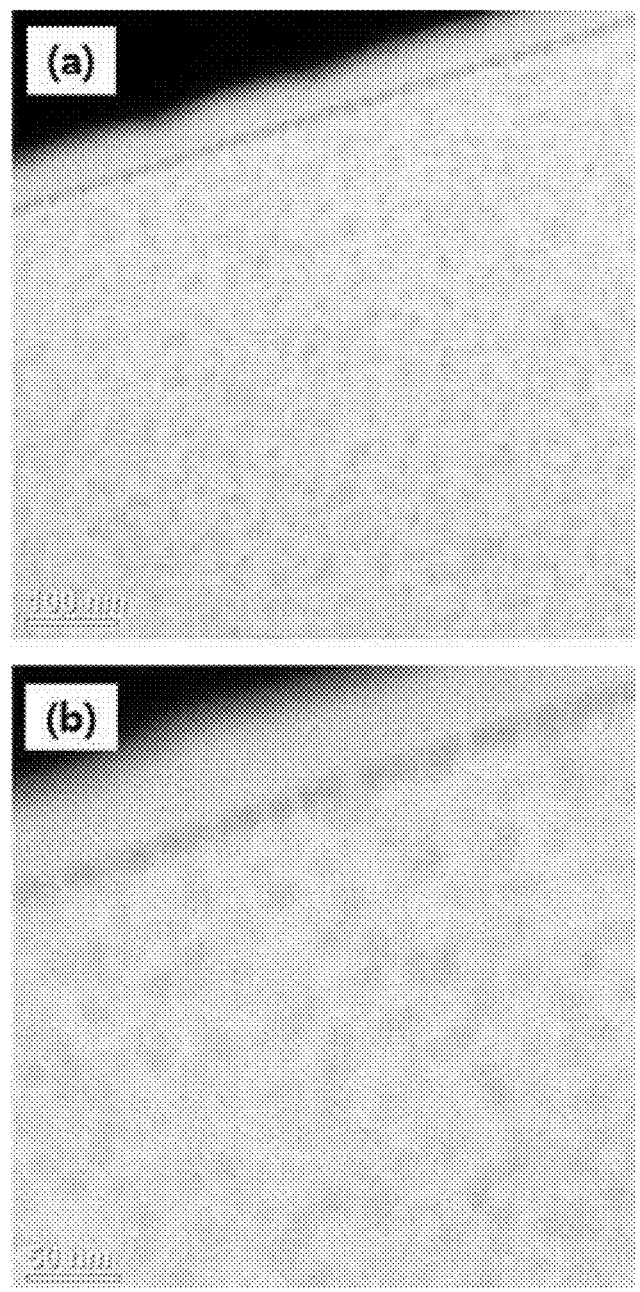
FIG. 6 is a transmission electron microscope (TEM) image of the intermediate produced during fabricating the organic-inorganic hybrid coating layer according to the embodiments of the present invention.

FIG. 6 is a transmission electron microscope (TEM) image of the intermediate produced during fabricating the organic-inorganic hybrid coating layer according to the embodiments of the present invention.

Referring to FIG. 6, an internal image of the intermediate described above with reference to FIG. 5 can be seen.

As described above, with reference to FIG. 5, it can be seen that both the surface and the inside of the intermediate uniformly contains the modified colloidal silica particles.

Figure 7:
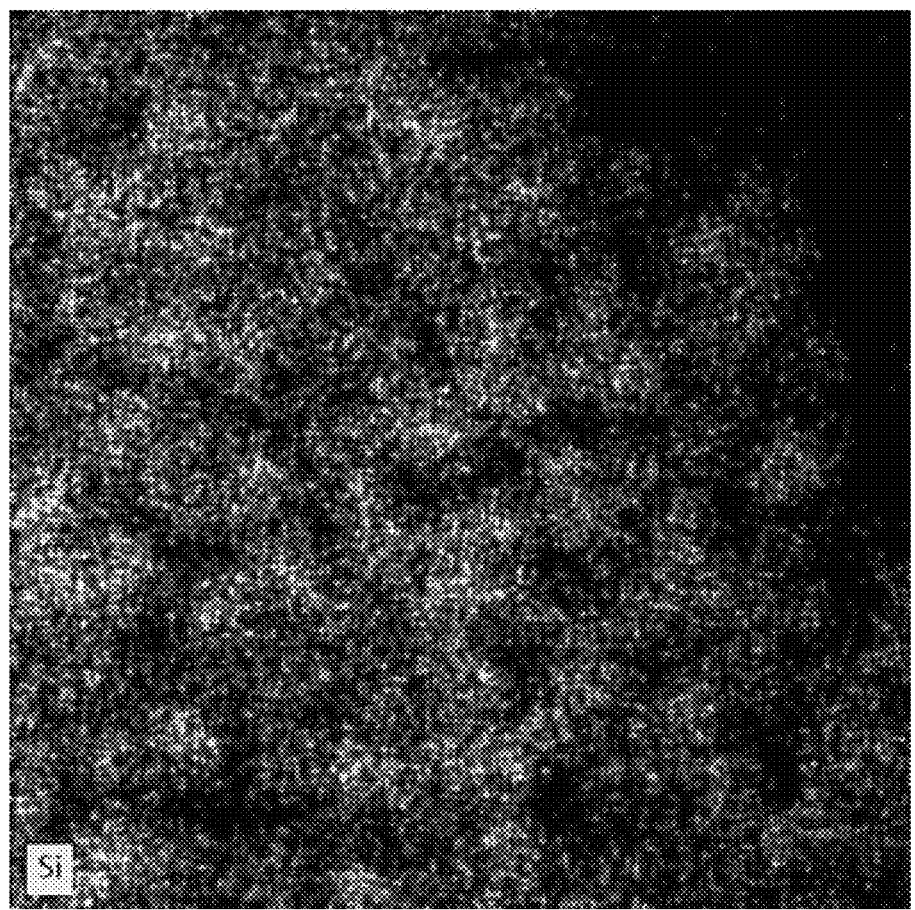
FIG. 7 is a view showing a result of energy dispersive spectroscopy (EDX) of the intermediate produced during fabricating the organic-inorganic hybrid coating layer according to the embodiments of the present invention.

FIG. 7 is a view showing a result of energy dispersive spectroscopy (EDX) of the intermediate produced during fabricating the organic-inorganic hybrid coating layer according to the embodiments of the present invention.

Referring to FIG. 7, the distribution of silicon elements Si of the colloidal silica particles distributed in the intermediate described above with reference to FIGS. 5 and 6 can be seen.

As shown in FIG. 7, it can be seen that the intermediate uniformly contains the silicon elements. In other words, as described above, with reference to FIGS. 5 and 6, it can be seen that the modified colloidal silica particles are uniformly dispersed inside the intermediate.

Figure 8:
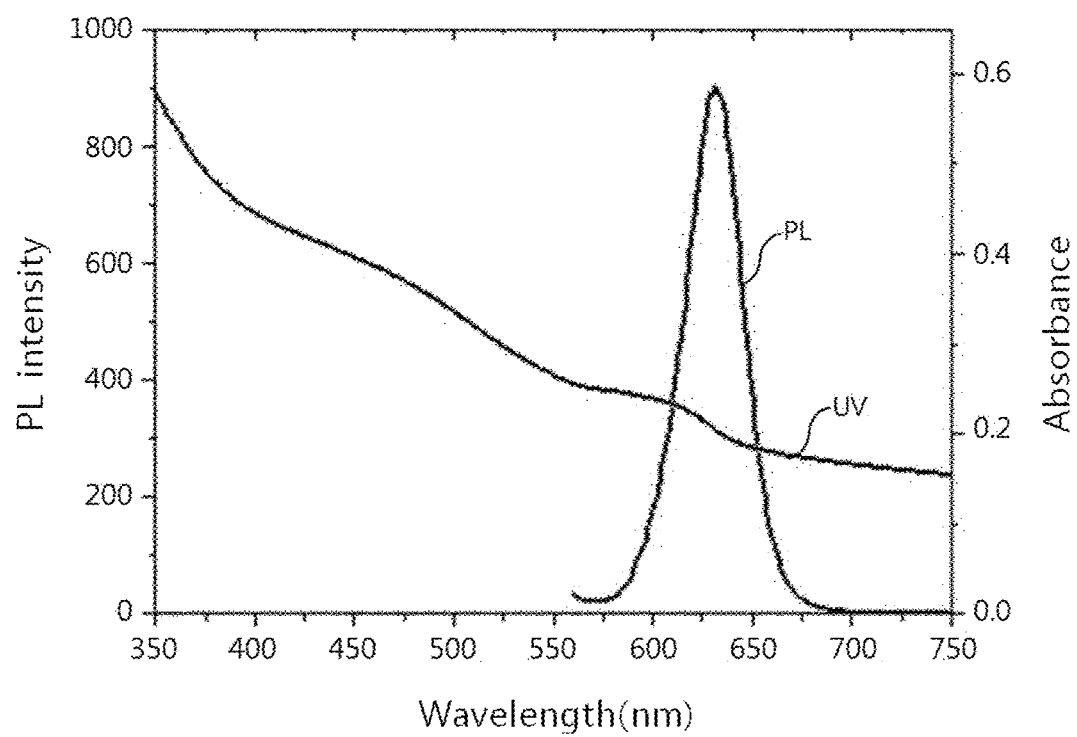
FIGS. 8 and 9 are graphs showing light emitting and absorbing spectra of quantum dots during fabricating the organic-inorganic hybrid coating layer according to the embodiments of the present invention.
Figure 9:
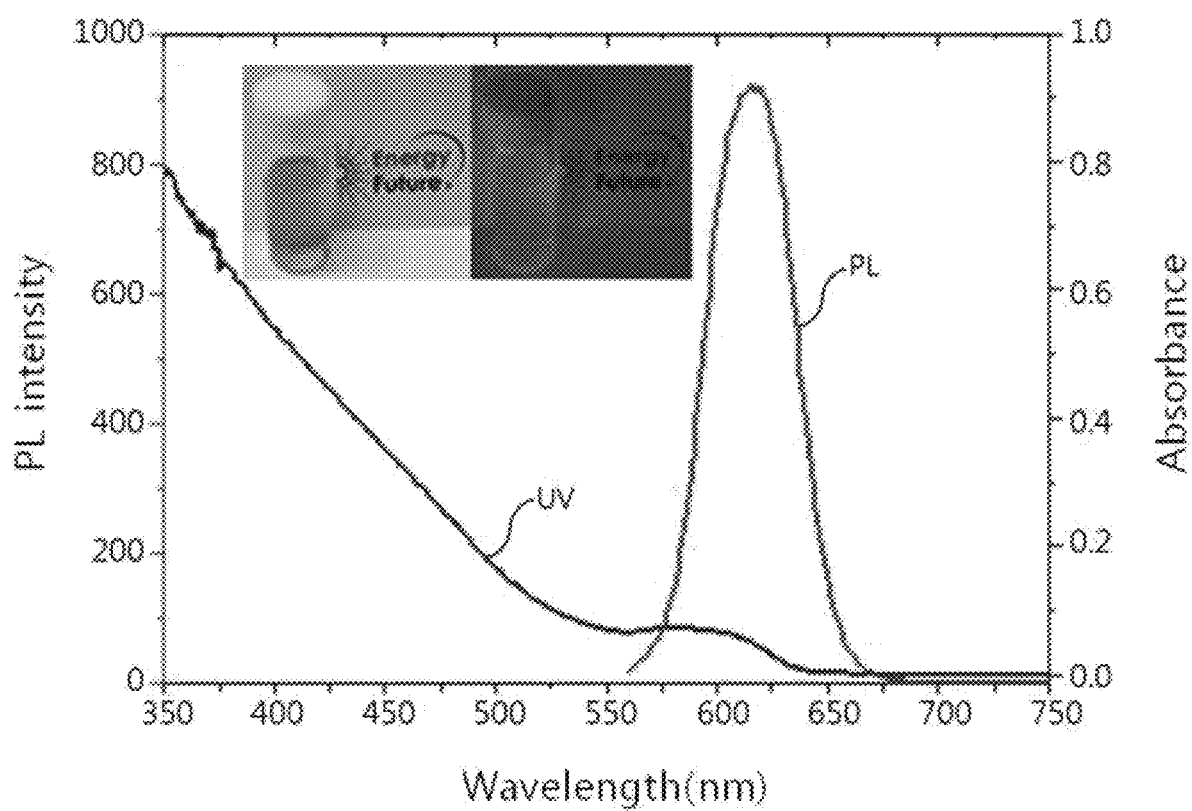

FIGS. 8 and 9 are graphs showing light emitting and absorbing spectra of quantum dots during fabricating the organic-inorganic hybrid coating layer according to the embodiments of the present invention.

Referring to FIGS. 8 and 9, the light emitting and absorbing spectra of the quantum dots included in the coating layer can be observed. The spectra shown in FIGS. 8 and 9 were measured under different measurement conditions with respect to the same quantum dot.

As shown in FIGS. 8 and 9, it can be seen that the quantum dot has a light emitting peak in the range of 620 nm to 630 nm. In addition, it can be seen that the quantum dot exhibits an absorption in a wavelength region lower than the light emitting peak.

Images inserted in FIG. 9 may represent before and after ultraviolet rays are irradiated to the solution containing the quantum dots. Accordingly, when the ultraviolet rays are irradiated to the quantum dots, it can be seen that light is uniformly emitted over the entire region.

The light emitting quantum yield of the quantum dot may be calculated by the following <Equation 1>.

$$Q = Q_R \frac{OD_R}{OD} \frac{I}{I_R} \frac{n_R^2}{n^2} \quad \text{<Equation 1>}$$

Q is the quantum yield, OD is the optical density, I is the integrated light intensity, n is the refractive index of the solvent, and R is the reference sample.

The quantum dots of blue, green, orange, and red light emission calculated according to the above <Equation 1> may have light emitting quantum yields of 0.47, 0.59, 0.96, and 0.71, respectively.

FIG. 10 is an image before/after ultraviolet (UV) irradiation of the organic-inorganic hybrid coating layer according to the embodiments of the present invention.

Referring to FIG. 10, the light emitting images before and after ultraviolet irradiation of the coating layer including the red-emitting quantum dots can be seen.

As shown in FIG. 10, it can be seen that the coating layer is easily attached to the substrate. Accordingly, as shown in FIG. 10 (b), it was confirmed that the coating layer emits light in the same area as the substrate.

Figure 11:
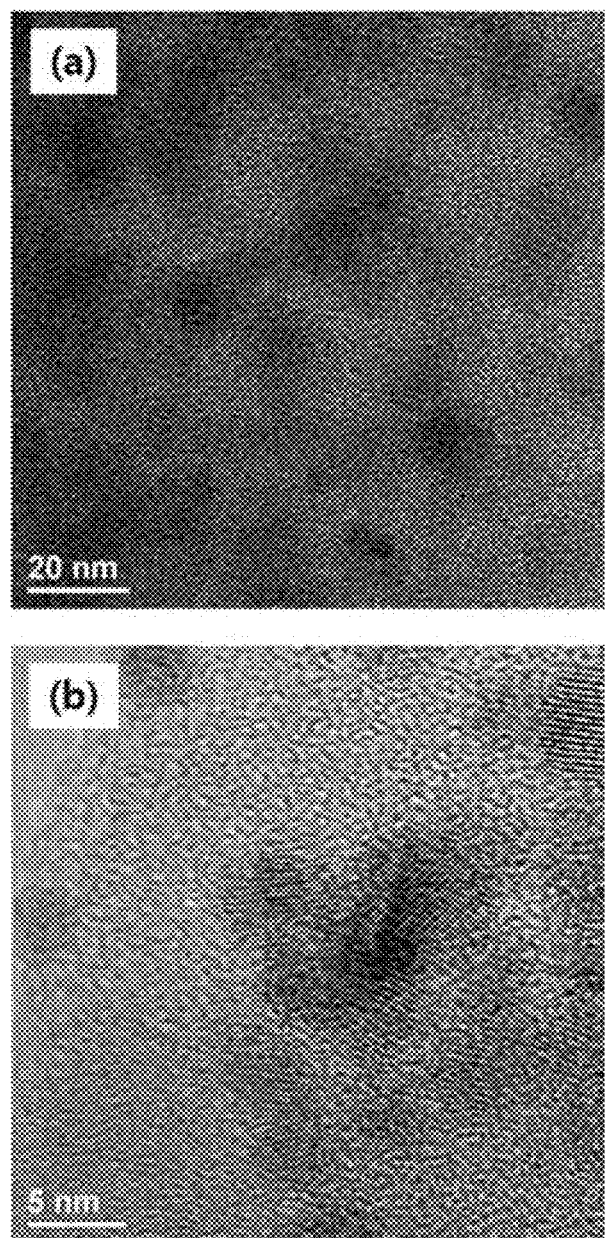
FIG. 11 is a transmission electron microscope (TEM) image of the organic-inorganic hybrid coating layer according to the embodiments of the present invention.

FIG. 11 is a transmission electron microscope (TEM) image of the organic-inorganic hybrid coating layer according to the embodiments of the present invention.

Referring to FIG. 11, the internal image of the coating layer can be seen. The coating layer may have a shape in which the intermediate described above with reference to FIG. 6 and the quantum dots are mixed, and the organic precursor and the modified colloidal silica particles are photocured. Like the intermediate shown in FIG. 6, it can be seen that the modified colloidal silica particles and the quantum dots are uniformly distributed in the coating layer.

Figure 12:
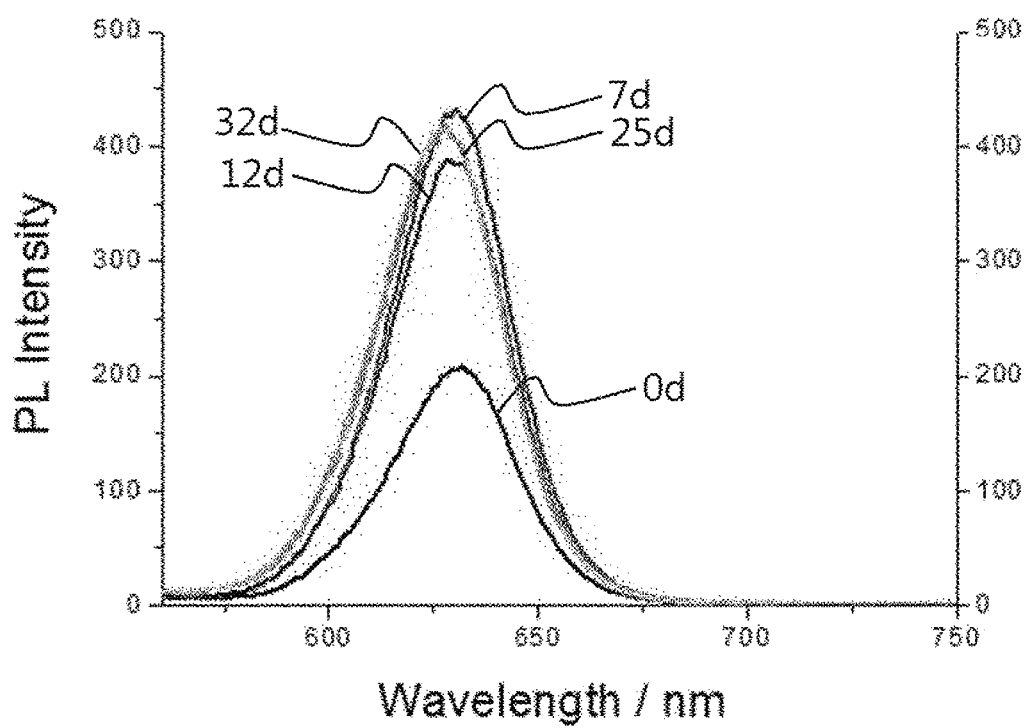
FIG. 12 is a graph showing a light emitting spectrum according to a thickness of the organic-inorganic hybrid coating layer according to the embodiments of the present invention.

FIG. 12 is a graph showing a light emitting spectrum based on time of the organic-inorganic hybrid coating layer according to the embodiments of the present invention.

Referring to FIG. 12, it can be seen that the coating layer has the same light emitting peak regardless of time. In addition, it was confirmed that the coating layer had substantially the same light emitting intensity regardless of time.

Figure 13:
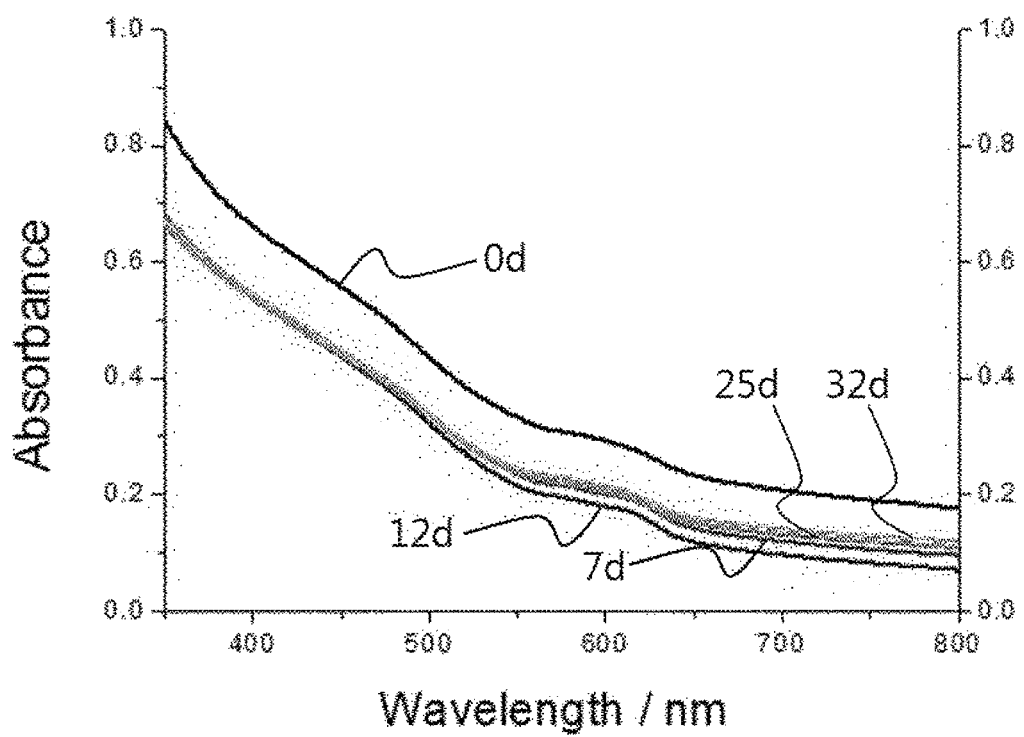
FIG. 13 is a graph showing a light absorbing spectrum according to the thickness of the organic-inorganic hybrid coating layer according to the embodiments of the present invention.

FIG. 13 is a graph showing a light absorbing spectrum based on time of the organic-inorganic hybrid coating layer according to the embodiments of the present invention.

Referring to FIG. 13, the absorption spectrum of the coating layer shown in FIG. 12 can be observed. As described above, in FIG. 12, it can be seen that the coating layer exhibits an absorption peak in the same wavelength region regardless of the time.

Figure 14:
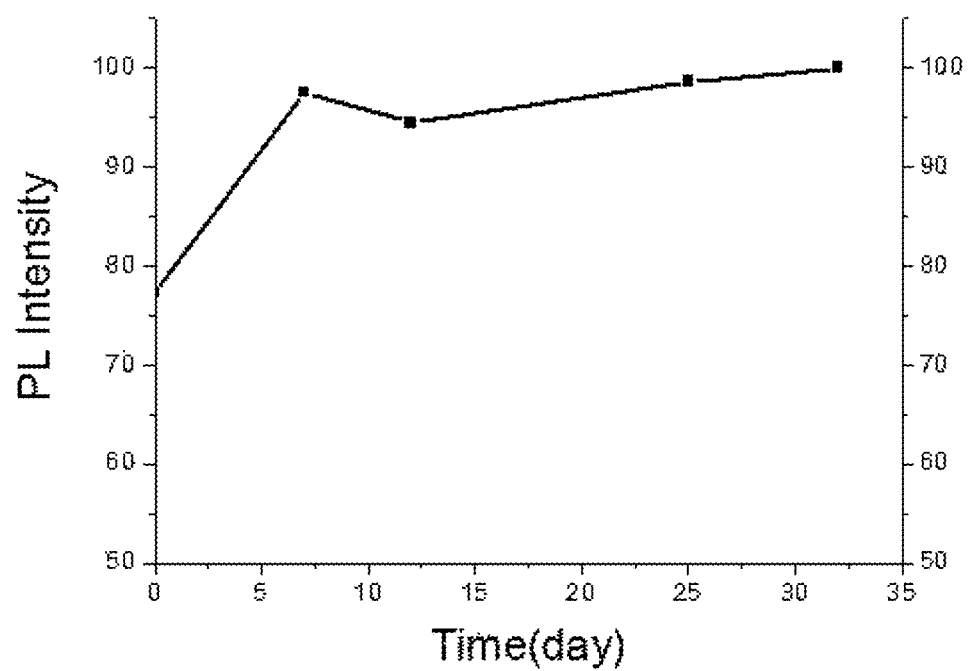
FIG. 14 is a graph showing a relative light emitting area based on time of the organic-inorganic hybrid coating layer according to the embodiments of the present invention.

FIG. 14 is a graph showing a relative light emitting intensity based on time of the organic-inorganic hybrid coating layer according to the embodiments of the present invention.

Referring to FIG. 14, the relative light emitting intensity over time of the coating layer coated on the substrate can be seen.

As shown in FIG. 14, it can be seen that the light emitting intensity of the coating layer is increased linearly for about one week after coated. After one week, it was confirmed that the light emitting intensity of the coating layer was substantially constant. In other words, the organic-inorganic hybrid coating layer may be cured over time, and at this point, the light emitting intensity of the coating layer may be increased.

Hereinafter, the quantum dot nanocapsule according to the embodiments of the present invention and the method of fabricating the same will be described with reference to FIGS. 15 to 19.

Figure 15:
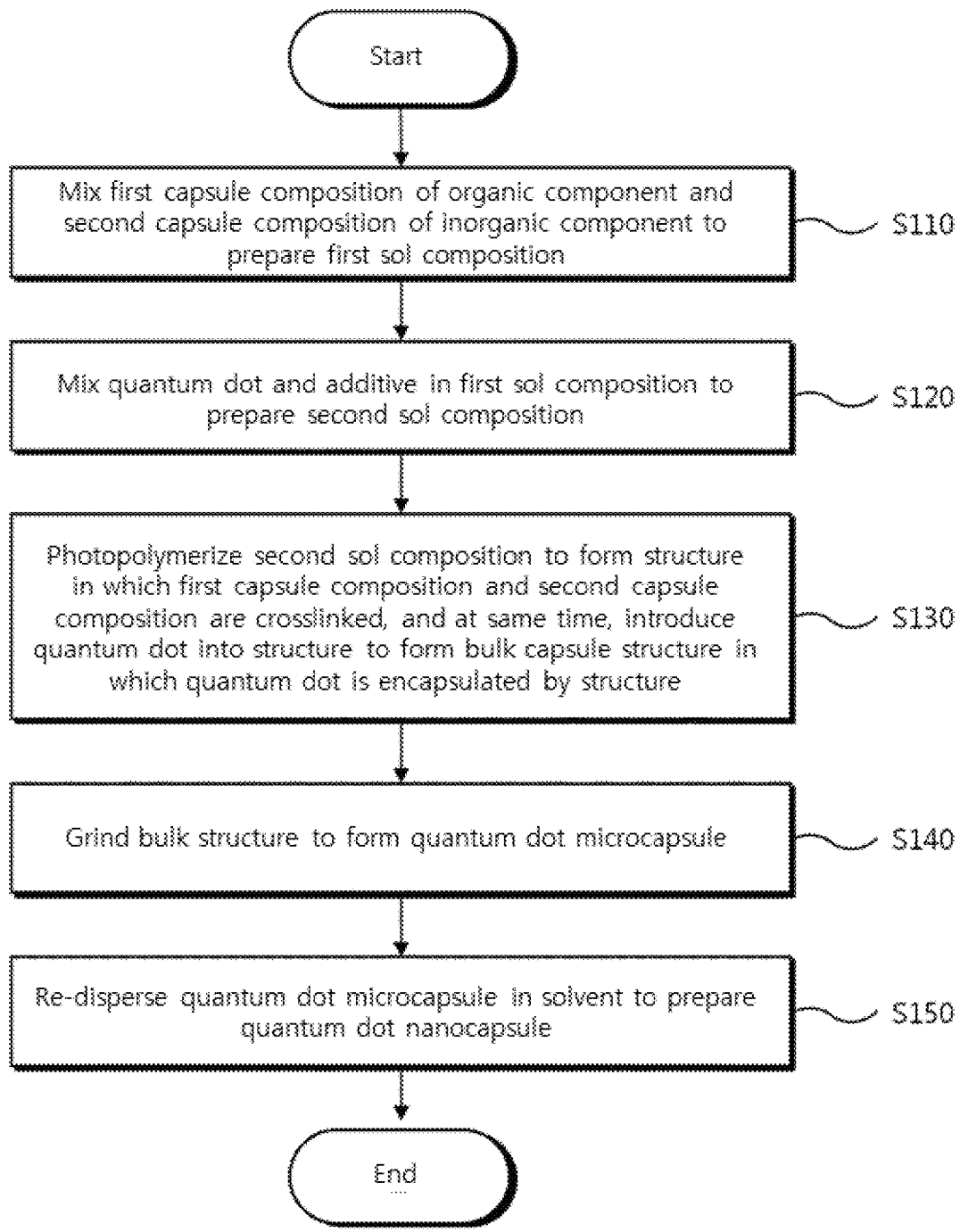
FIG. 15 is a flow chart for explaining a method of fabricating quantum dot nanocapsules according to the embodiments of the present invention.

FIG. 15 is a flow chart for explaining a method of fabricating quantum dot nanocapsules according to the embodiments of the present invention. FIGS. 16 to 19 are views for explaining the method of fabricating quantum dot nanocapsules according to the embodiments of the present invention.

Figure 16:
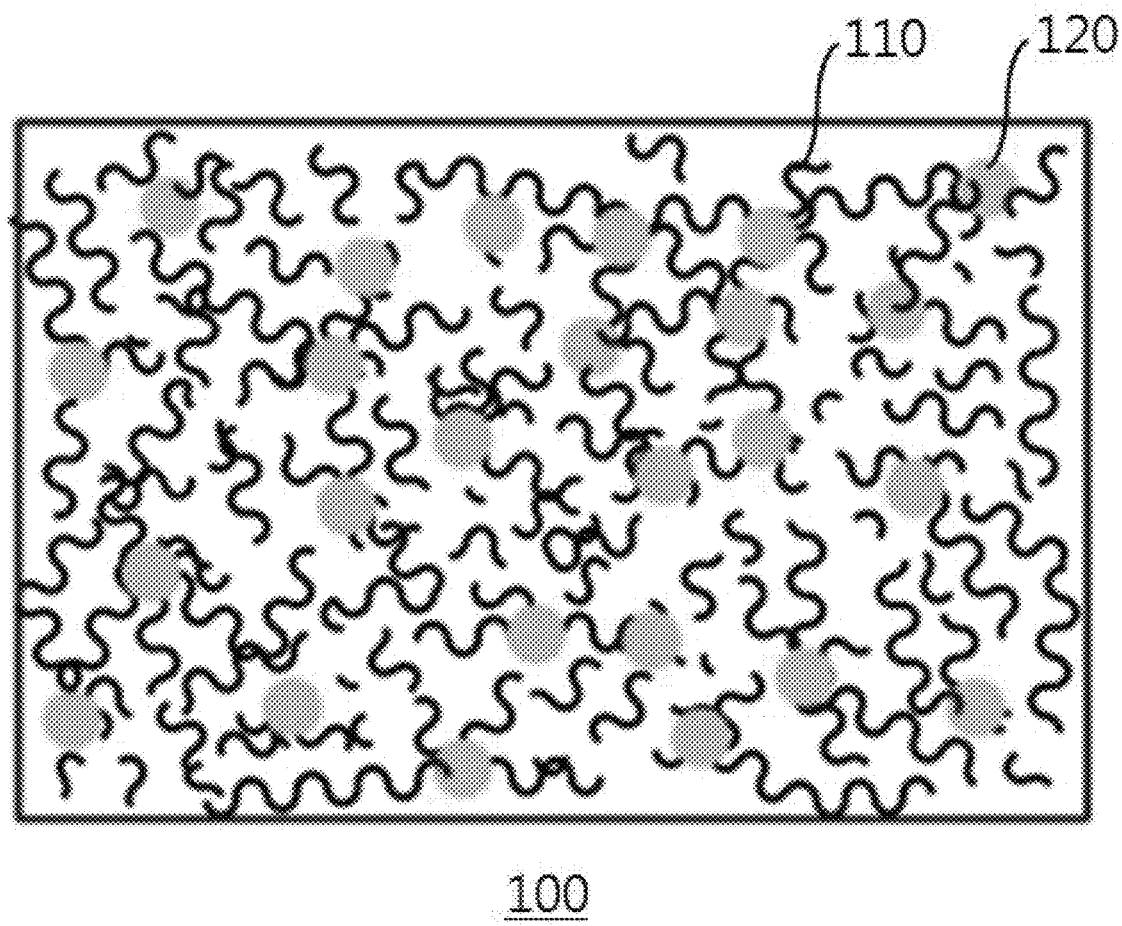
FIGS. 16 to 19 are views for explaining the method of fabricating quantum dot nanocapsules according to the embodiments of the present invention.

Referring to FIGS. 15 and 16, a first sol composition 100 may be prepared by mixing the first capsule composition 100 of the organic component and the second capsule composition 120 of the inorganic component (S110).

The first capsule composition 100 may be at least any one of oligoacrylate, urethane acrylate, epoxy acrylate, oligoepoxide, or triazine-tris-methylacrylate.

For example, the oligoacrylate may be at least any one of ethylene glycol dimethacrylate (EGDMA) represented by the following <Formula 1>, tri(ethylene glycol)dimethacrylate (TEGMMA) represented by the following <Formula 2>, 2-(acryloyloxymethyl)-2-ethylpropane-1,3-diyl diacrylate (AEDA) represented by the following <Formula 3>, pentaerythritol triacrylate (PETA) represented by the following <Formula 4>, trimethylolpropane triacrylate (TMPTA) represented by the following <Formula 5>, dipentaethitol acrylate (DPEA) represented by the following <Formula 6>, dipentaerythritol hexaacrylate (DPHA) represented by the following <Formula 7>, dipentaerythritol pentaacrylate (DPPA) represented by the following <Formula 8>, or trimethylolpropane ethoxylate triacrylate (TMPET) represented by the following <Formula 9>.

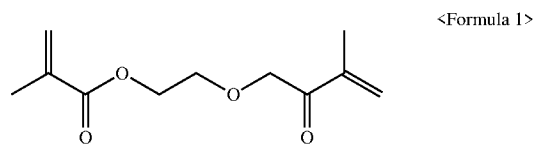

<Formula 1>

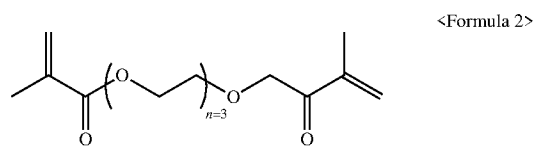

<Formula 2>

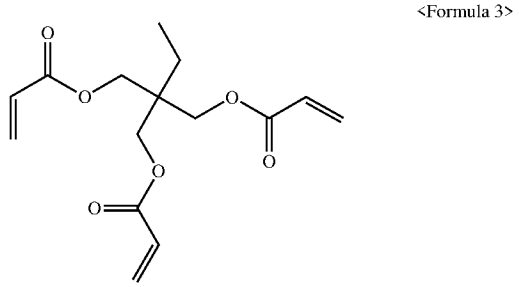

<Formula 3>

<Formula 4>
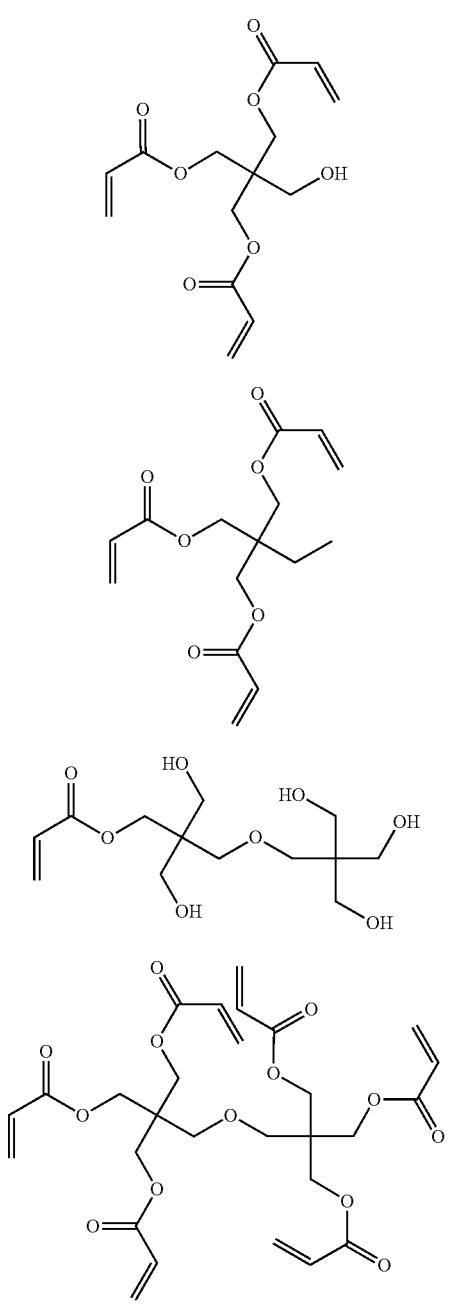
<Formula 5>
<Formula 6>
<Formula 7>
<Formula 8>
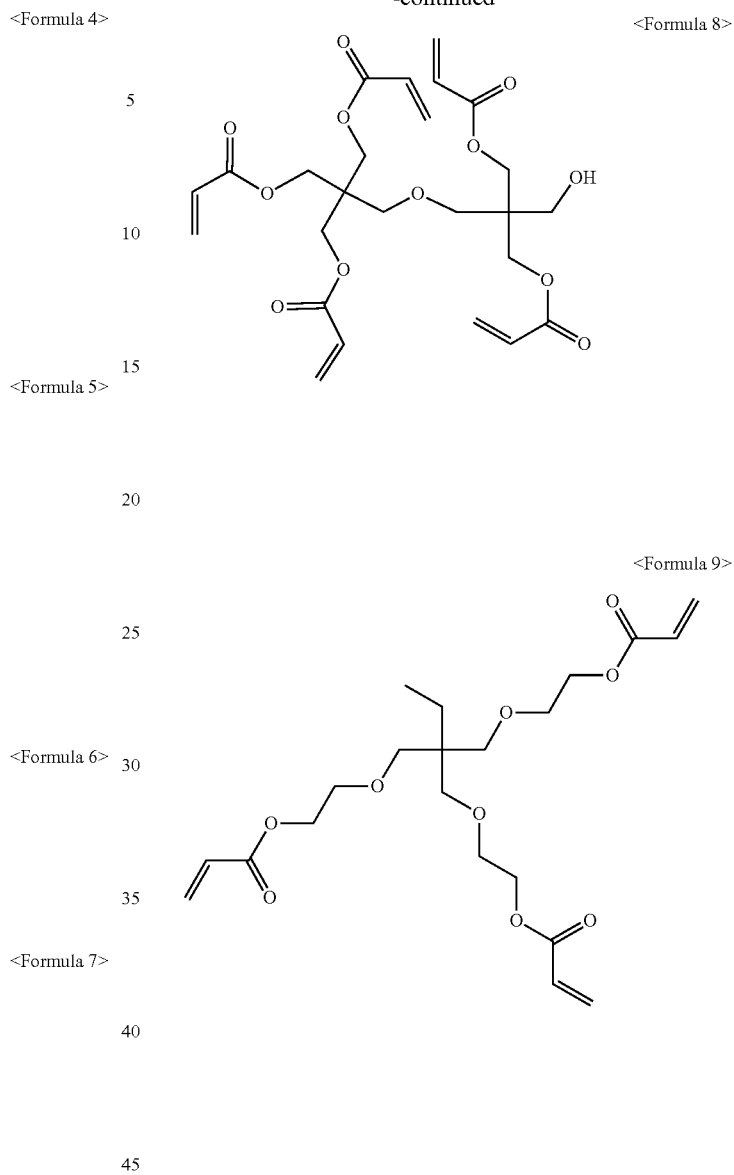
<Formula 9>
For another example, the urethane acrylate may be at least any one of urethane acrylate represented by the following <Formula 10>, or urethane acrylate resin represented by the following <Formula 11>.
<Formula 10>
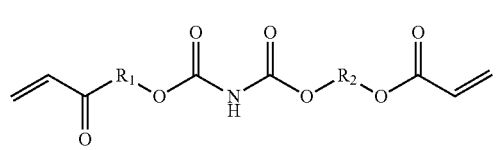
<Formula 11>
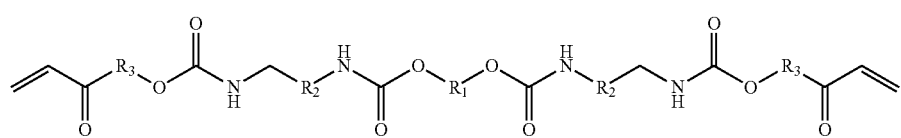

R1, R2, and R3 may be saturated hydrocarbon having 1 to 20 carbon atoms.

For still another example, the epoxy acrylate may be oxirane-2-ylmethyl methacrylate (OMMA) represented by the following <Formula 12>.

<Formula 12>

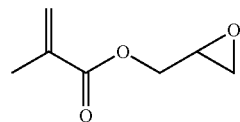

For still another example, the oligoepoxide may be 7-oxabicyclo[4,1,0]heptan-3-ylmethyl-7-oxabicyclo[4,1,0]haptan-3-carboxylate (OHOHC) represented by the following <Formula 13>.

<Formula 13>

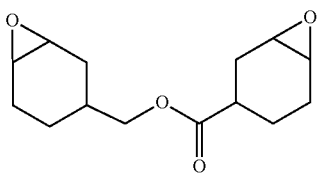

For still another example, the triazine-tris-methylacrylate may be an organic material represented by the following <Formula 14>, and specifically, may be at least one of the organic materials represented by the following <Formula 15> to <Formula 18>.

<Formula 14>

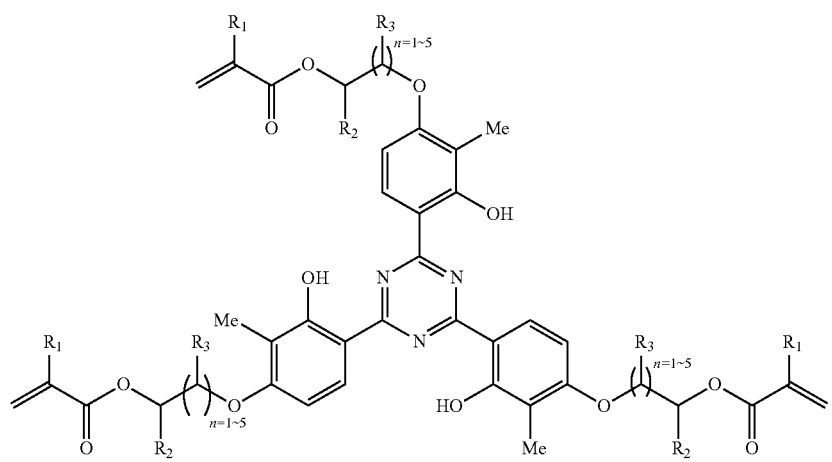

<Formula 15>

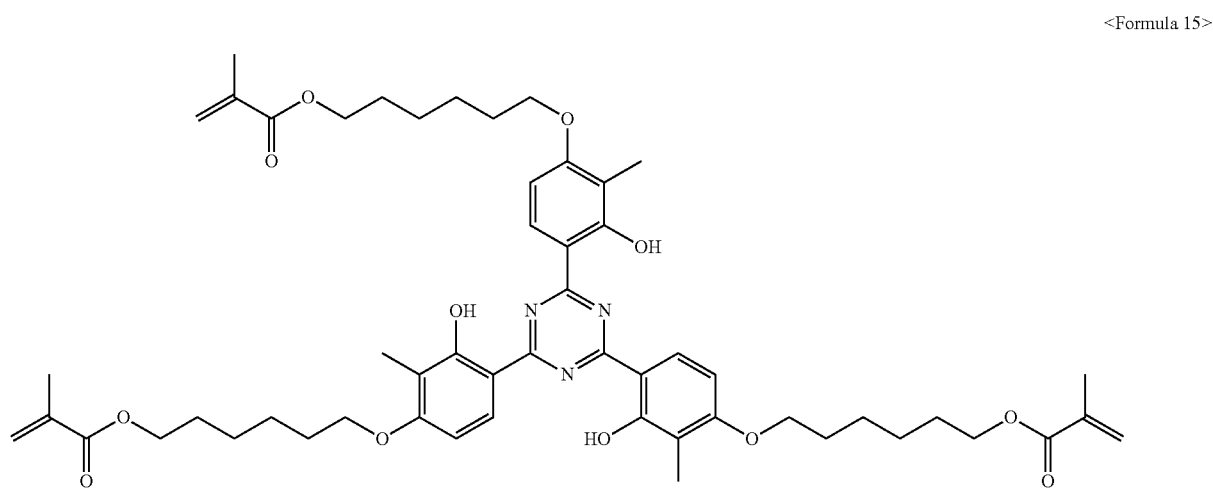

-continued

<Formula 16>

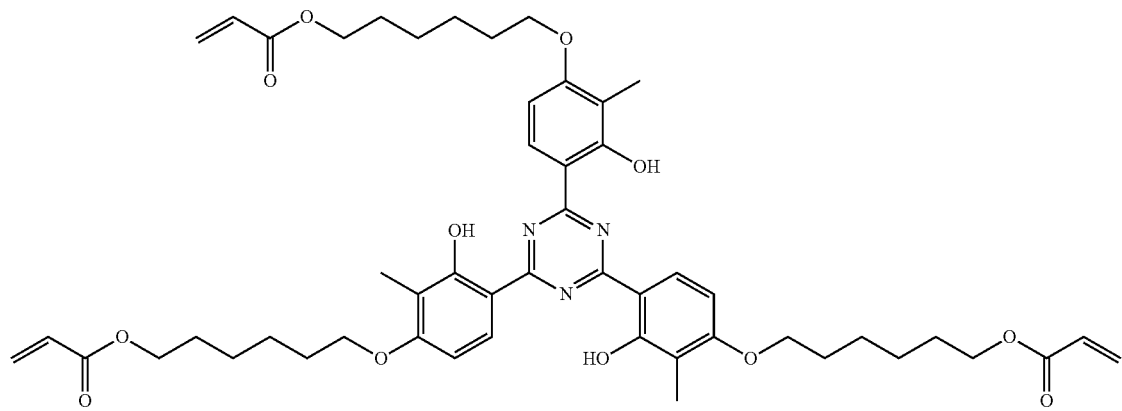

<Formula 17>

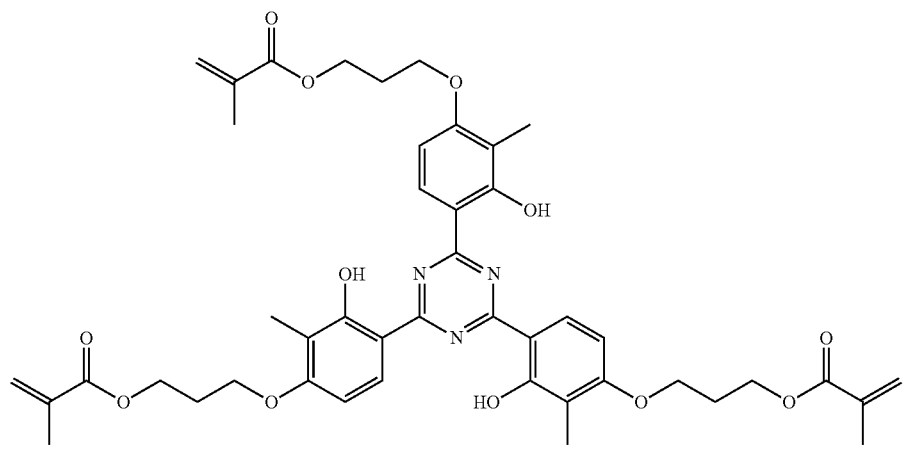

<Formula 18>

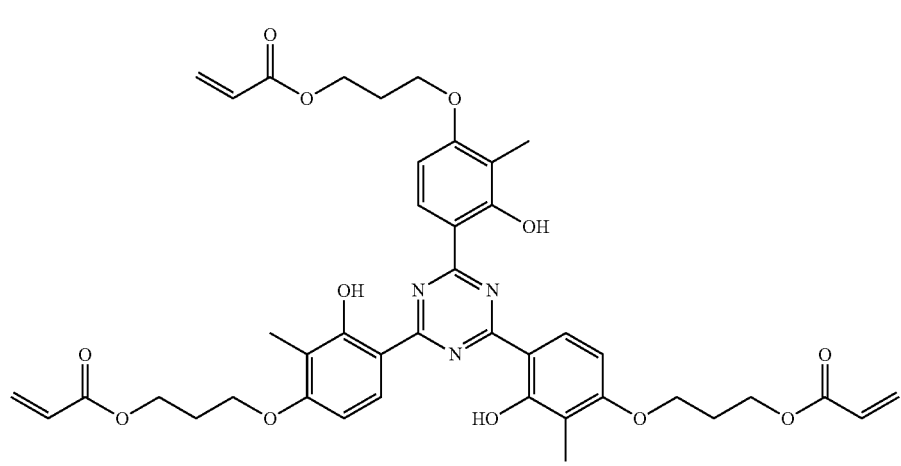

In addition, the first capsule composition 100 may include a thiol-ene coupling agent. The thiol-ene coupling agent may be used for curing the first capsule composition 100. In other words, the thiol-ene coupling agent may be introduced between at least one organic material among oligoacrylate, urethane acrylate, epoxy acrylate, oligoepoxide, or triazine-tris-methylacrylate, and accordingly, the first capsule composition 100 may be easily crosslinked.

For example, the thiol-ene coupling agent may be at least any one of tri(ethylene glycol)divinyl ester (TEGDVE) represented by the following <Formula 19>, triallyl-1,3,5-triazine-2,4,6-trione (TTT) represented by the following <Formula 20>, 1,6-hexane bis(3-mercaptopropionate) (HD-SH) represented by the following <Formula 21>, trans-1,4-cyclohexanedimethyl bis(mercaptopropionate) (CHDM-SH) represented by the following <Formula 22>, 4,4'-isopropylidenedicyclohexane bis(mercaptopropionate) (HBPA-SH) represented by the following <Formula 23>, or 2-ethyl-2-((3-mercaptopropanoyloxy)methyl)propane-1,3-diyl bis(3-mercaptopropanoate) (EMPMP) represented by the following

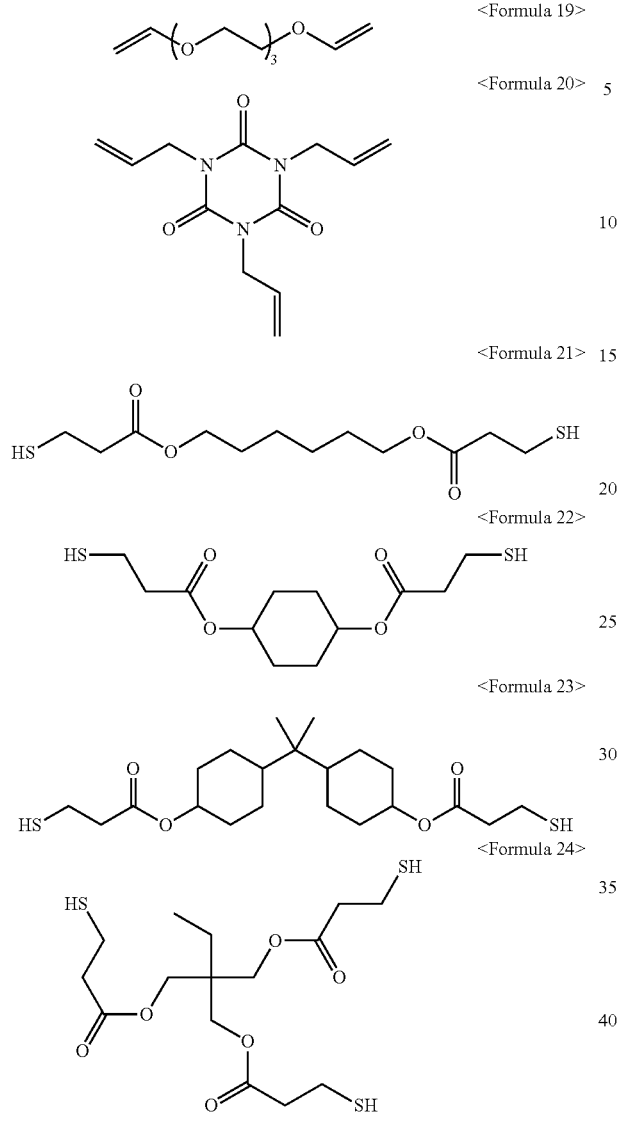

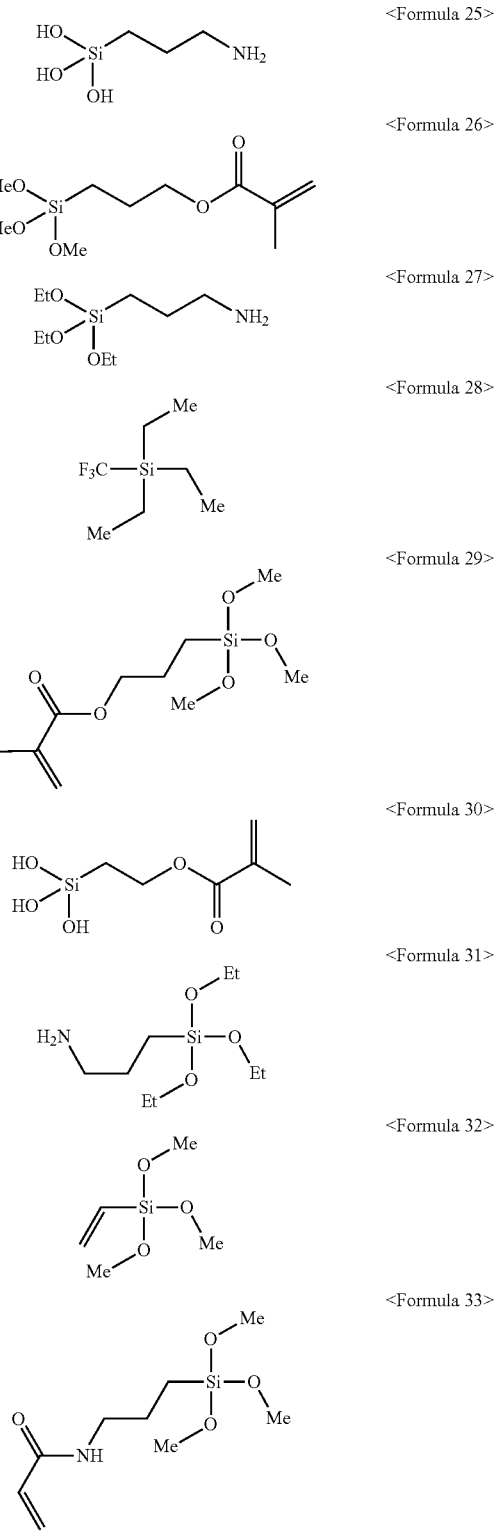

The second capsule composition 120 may include inorganic oxide precursor, and a silane-based coupling agent modified to the surface of the inorganic oxide precursor.

For example, the inorganic oxide precursor may be at least any one of silicon oxide, aluminum oxide, gallium oxide, indium oxide, germanium oxide, tin oxide, palladium oxide, titanium dioxide, zirconium oxide, or hafnium oxide. When the inorganic oxide precursor is at least any one of silicon oxide or aluminum oxide, the inorganic oxide precursor may be relatively easily bonded to the silane-base coupling agent.

In addition, for example, the silane-based coupling agent may be at least any one of (3-aminopropyl)silanetriol (APST) represented by the following <Formula 25>, 3-(trimethoxysilyl)propyl methacrylate (MSPM) represented by the following <Formula 26>, 3-(triethoxysilyl)propan-1-amine (TESPA) represented by the following <Formula 27>, triethyl(trifluorophetyl)silane (TETFS) represented by the following <Formula 28>, 3-(trimethoxysilyl)propyl methacrylate (MAPTMS) represented by the following <Formula 29>, 2-(trihydroxysilyl)ethyl methacrylate (HSEM) represented by the following <Formula 30>, 3-(triethoxysilyl)propan-1-amine (TEOSPA) represented by the following <Formula 31>, trimethoxy(vinyl)silane (VTMS) represented by the following <Formula 32>, N-(3-(triethoxysilyl)propyl) acrylamide (ALPTMS) represented by the following <Formula 33>, or (triethoxysilyl)methyl acrylate (AMTMS) represented by the following <Formula 34>.

-continued

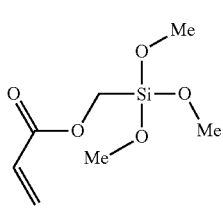
<Formula 34>

Specifically, for example, when the inorganic oxide precursor is silicon oxide and the silane-based coupling agent is 3-(trimethoxysilyl)propyl methacrylate (MAPTMS) represented by <Formula 29>, the second capsule composition 120 represented by the following <Formula 35> may have a structure in which a trimethoxysilyl group of the 3-(trimethoxysilyl)propyl methacrylate (MAPTMS) is removed, and the resulting propyl methacrylate is bonded to the silicon element of the silicon oxide.

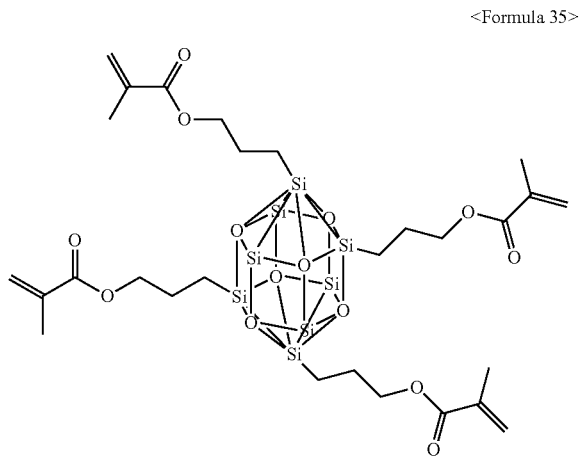
<Formula 35>

Specifically, the first sol composition 100 may be formed through a surface chemical reaction between the first capsule composition and the second capsule composition. Accordingly, in the first sol composition 100, the first capsule composition 110 and the second capsule composition 120 may be uniformly mixed, so as to have a transparent sol state.

Unlike the above description, when the first capsule composition 110 and the second capsule composition 120 are mixed physically only, the first capsule composition 110 and the second capsule composition 120 may not be uniformly mixed. In addition, the mixture of the first capsule composition 110 and the second capsule composition 120 may be in an opaque state.

However, as described above, when the surface chemical reaction between the first capsule composition 110 and the second capsule composition 120 is performed, some of the first capsule composition 110 and the second capsule composition 120 may be chemically bonded. Accordingly, the first sol composition 100, which includes a monomer produced by combining the first capsule composition 100 with the second capsule composition 120, may be prepared.

In other words, the first sol composition 100 may be prepared by the surface chemical reaction in the non-uniformly mixed physical mixture of the first capsule composition 110 and the second capsule composition 120. Accordingly, the first sol composition 100 may be produced by the optical property change for allowing the opaque physical mixture to become transparent through the surface chemical reaction.

Figure 17:
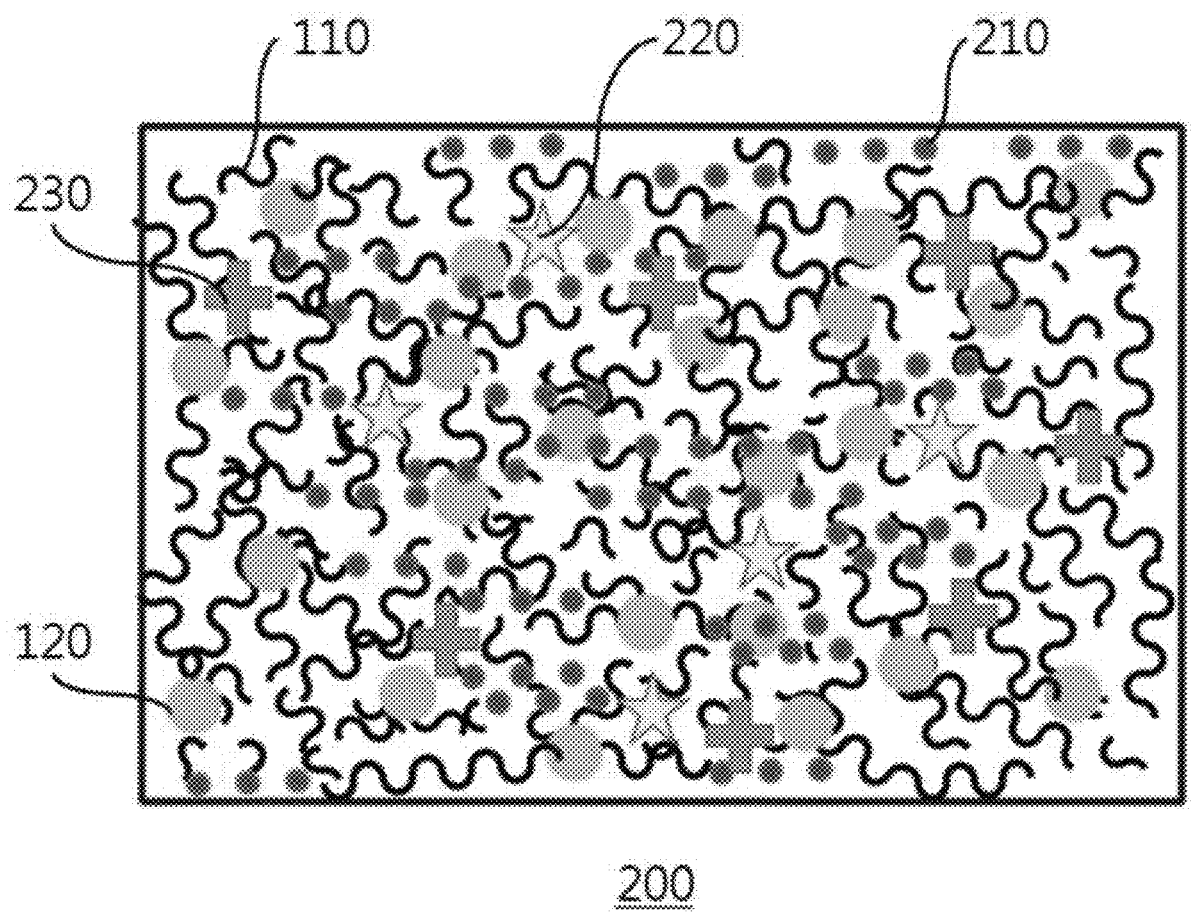
Figure 18:
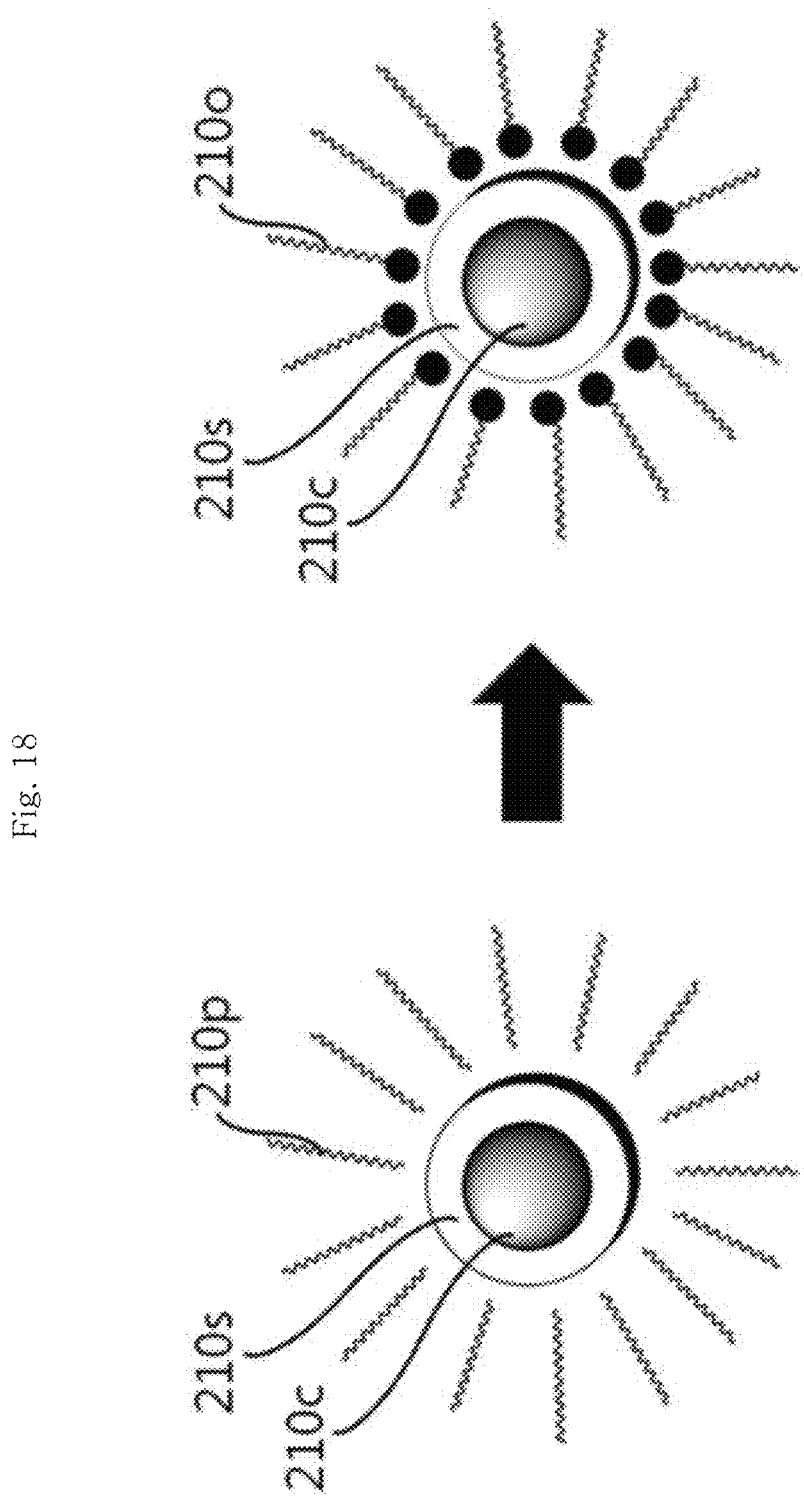

Referring to FIGS. 15, 17 and 18, the second sol composition 200 may be prepared by mixing the quantum dots 210 and additives 220 and 230 in the first sol composition 100 (S120).

Specifically, for example, as shown in FIG. 17, the quantum dot 210 may include a quantum dot core 210c, and a quantum dot shell 210s surrounding the quantum dot core 210c, and the quantum dot 210 may have a structure in which the ligand 210p is bonded to the surface thereof. The ligand 210p may be oxidized when reacted with oxygen in the air. Accordingly, the quantum dot 210 may include the oxidized ligand 210o bonded to the surface of the quantum dot shell 210s. The oxidized ligand 210o may have a lower coupling force with the quantum dot 210 than the ligand 210p. In other words, the ligand 210p may have the increased polarity while being oxidized, and accordingly, the coupling force with the non-polar quantum dot 210 may be reduced. Accordingly, the ligand may be removed from the surface of the quantum dot 210, and at the same time, the first capsule composition 110 may be bonded to the surface of the quantum dot 210 from which the oxidized ligand 210o is removed.

For example, the quantum dot core 210c may be cadmium selenite (CdSe), the quantum dot shell 210s may be zinc sulfide (ZnS), the ligand 210p may be tri-octyl phosphine represented by the following <Formula 36>, and the oxidized ligand 210o may be tri-octyl phosphine oxide represented by the following <Formula 37>.

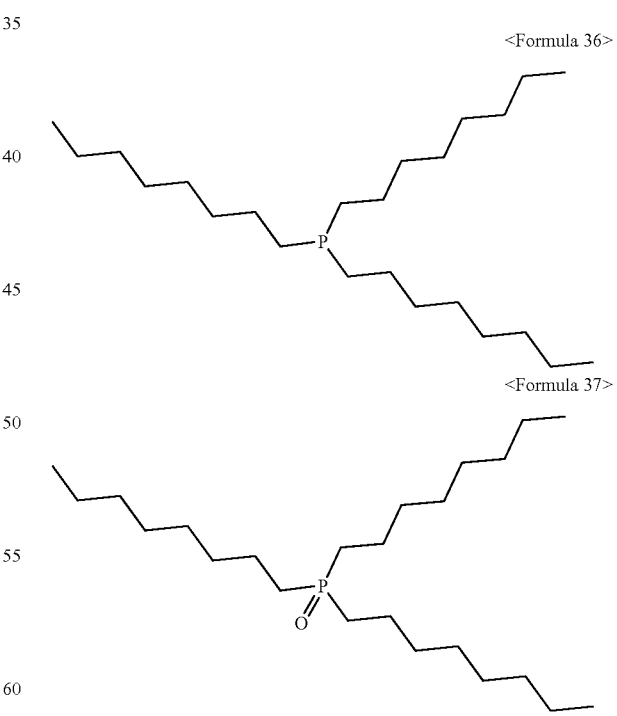

<Formula 36>

<Formula 37>

The additives 220 and 230 may include at least one of a quantum dot dispersant, a photo initiator, a photo stabilizer, or an anti-fouling material. Specifically, the quantum dot dispersant may be used to easily disperse the quantum dots 210 in the first sol composition 100. For example, the quantum dot dispersant may have a low molecular weight, and may be at least any one of acrylate or acrylamide. The quantum dot dispersant may maintain the structure stably, but may have reactivity by the radical formed in the photopolymerization step described below. Accordingly, in the photopolymerization step described below, the bonding between the first capsule composition 110 and/or the second capsule composition 120 with quantum dots 210 may be improved.

For example, the acrylate may be at least any one of methyl methacrylate (MMA) represented by the following <38>, or tert-butyl methacrylate (tBMA) represented by the following <Formula 39>.

<Formula 38>

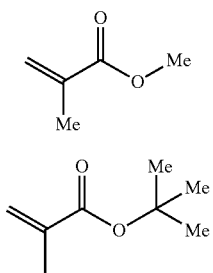

<Formula 39>

Alternatively, for another example, the acrylamide may be at least any one of acryloyl porpoline (ACMO) represented by the following <Formula 40>, N,N'-diethylacrylamide (NDAPA) represented by the following <Formula 41>, N-isopropylacrylamide (NIPAM) represented by the following <Formula 42>, N,N'-diethylaminoethyl acrylate (NDAEA) represented by the following <Formula 43>, N,N'-diethylaminopropyl acrylate (NDAPA) represented by the following <Formula 44>, N,N'-dimethylmethacrylamide (NDMMA) represented by the following <Formula 45>, or N,N'-dimethylacrylamide (DMA) represented by the following <Formula 46>.

<Formula 40>

<Formula 41>

<Formula 42>

<Formula 43>

<Formula 44>

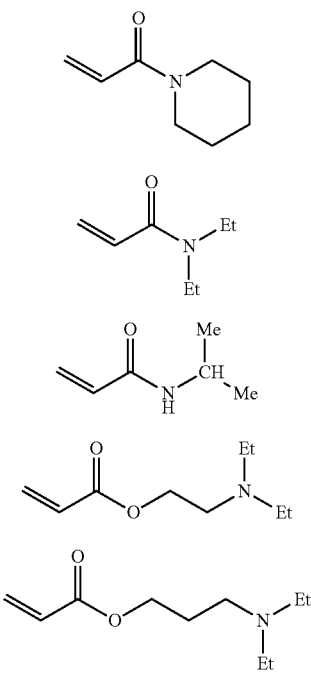

<Formula 45>

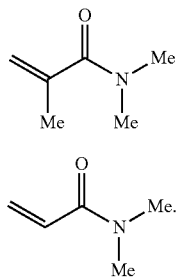

<Formula 46>

The photoinitiator forms a radical by the light irradiated in the photopolymerization step described later, and may be a material that does not photochromate the quantum dots 210. For example, the photoinitiator may be at least any one of 2,2'-demethoxy-2-phenylacetophenone (DMPA) represented by the following <Formula 47>, benzophenone (BP) represented by the following <Formula 48>, 2-oxo-1,2-diphenylethyl-4-methylbenzenesulfonate (BT) represented by the following <Formula 49>, or (1-hydroxycyclohexyl)(phenyl)methanone (HCPM) represented by the following <Formula 50>.

<Formula 47>

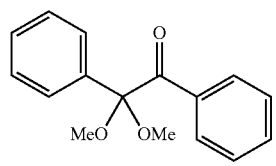

<Formula 48>

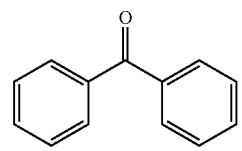

<Formula 49>

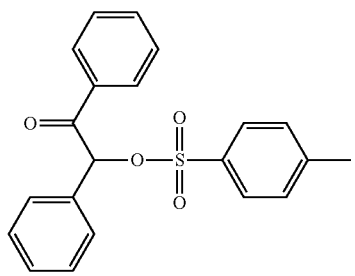

<Formula 50>

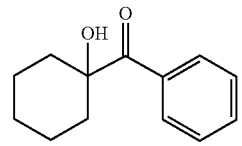

The photostabilizer may provide light stability of the quantum dots 210 in the photopolymerization step described below. For example, the photostabilizer may be at least any one of 2(3)-t-butyl-4-hydroxytoluene (BHT) represented by the following <Formula 51>, Tinuvin 123 represented by the following <Formula 52>, Tinuvin 292 represented by the following <Formula 53>, Tinuvin 384 represented by the following <Formula 54>, or Tinuvin 400 represented by the following <Formula 55>.

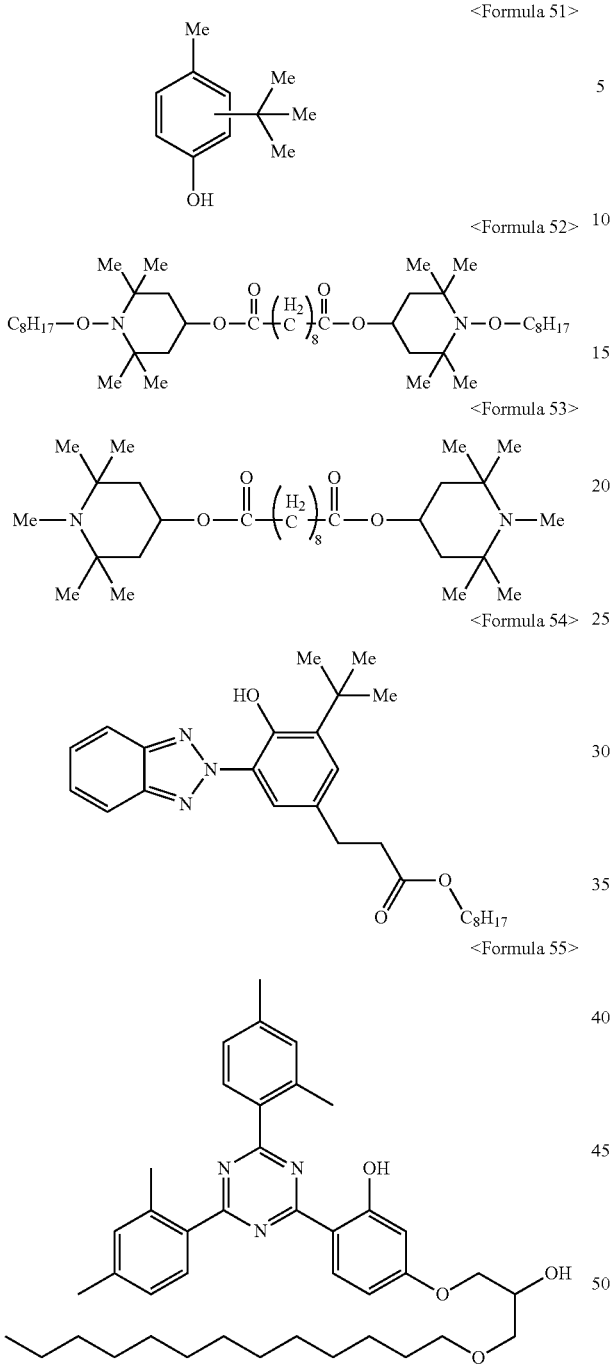

In the photopolymerization step described below, the anti-fouling material may be crosslinked with the first capsule composition 110 and the second capsule composition 120, and accordingly, may provide contamination resistance to the prepared bulk capsule structure 400. For example, the anti-fouling material may be a fluorine-based material. Specifically, for example, the anti-fouling material may be zonyl acrylate represented by the following <Formula 56>.

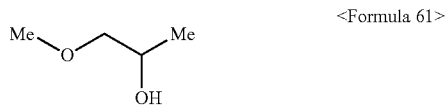

The second sol composition 200 may further include an inorganic additive or an additive solvent. Specifically, the inorganic additive may promote the preparation of the bulk capsule structure 400 described below. For example, the inorganic additive may be at least any one of silandiamine (SDA) represented by the following <Formula 57>, polysilamine (PSA) represented by the following <Formula 58>, tetraethoxysilane (TEOS) represented by the following <Formula 59>, or tetraisopropoxytitanium (TIPT) represented by the following <Formula 60>.

The additive solvent may adjust the concentration of the second sol composition 200. For example, the additive solvent may be at least any one of propylene glycol monomethyl ester (PGME) represented by the following <Formula 61>, or propylene glycol monomethyl ester acetate (PGMEA) represented by the following <Formula 62>.

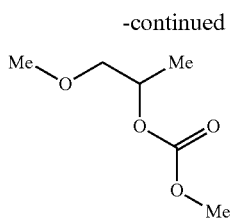

<Formula 62>

Accordingly, as shown in FIG. 3, the second sol composition 200 in which the first capsule composition 110, the second capsule composition 120, the quantum dots 210, and the additives 220 and 230 are uniformly dispersed may be prepared.

Figure 19:
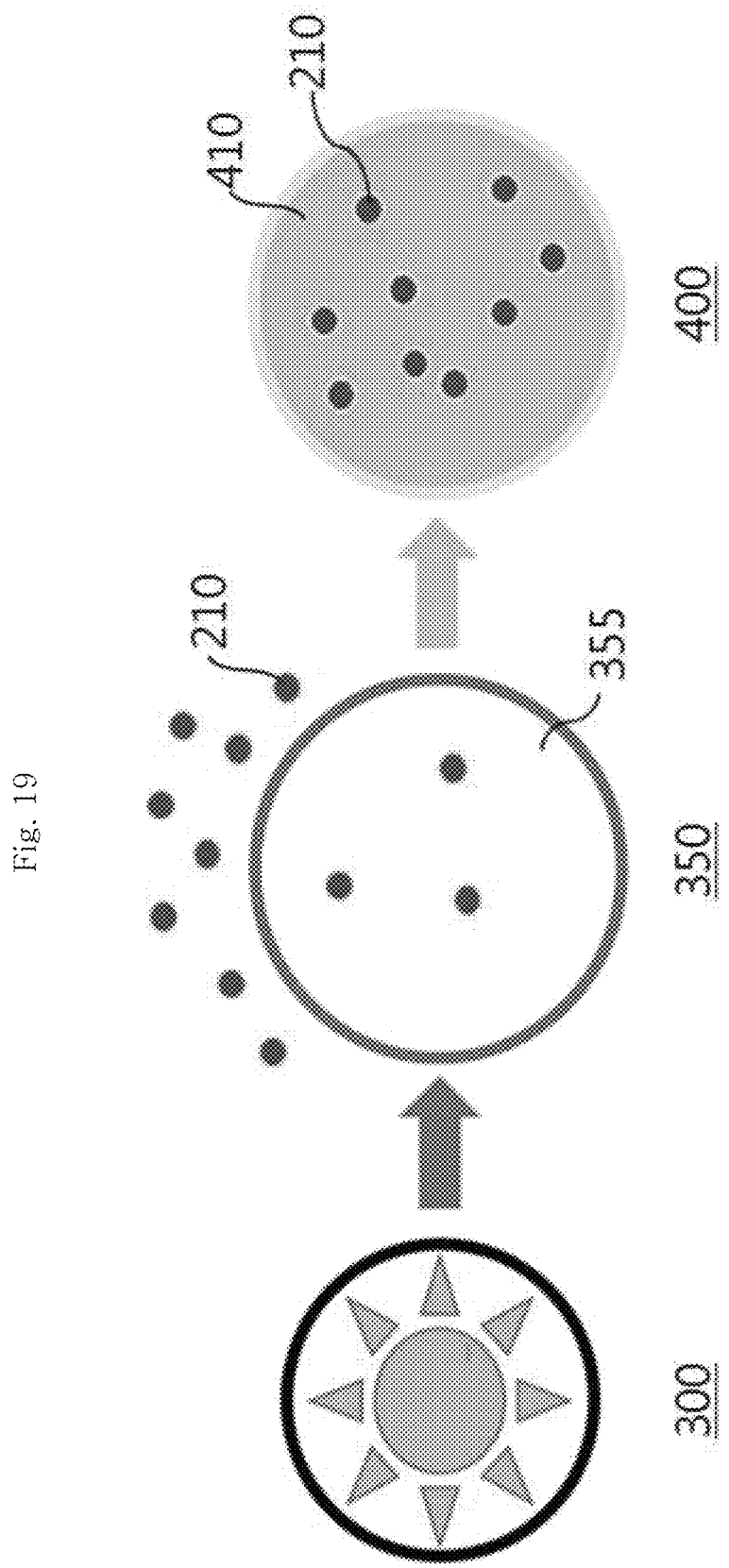

Referring to FIGS. 15 and 19, the second sol composition 200 may be photopolymerized to form a structure 410 in which the first capsule composition 110 and the second capsule composition 120 are crosslinked, and simultaneously, the quantum dots 210 may be introduced into the structure to form a bulk capsule structure 400 in which the quantum dots 210 are encapsulated into the structure 410 (S130).

Specifically, the quantum dot 210 may be decomposed at a high temperature of 100° C. or higher. Accordingly, the bulk capsule structure 400 may be prepared by photopolymerizing the second sol composition 200. The photopolymerization may be ultraviolet (UV) polymerization, and a radical generation temperature of the ultraviolet polymerization may be lower than a radical generation temperature of thermal polymerization. Specifically, for example, the radical generation temperature of the ultraviolet polymerization may be room temperature, and the radical generation temperature of the thermal polymerization may be 150° C. or higher, or 200° C. or higher. Accordingly, in the photopolymerization step, the quantum dot 210 may have light stability. In other words, the quantum dot 210 may be easily encapsulated without being decomposed.

In addition, the quantum dot 210 according to the embodiments of the present invention may include the ligand 210p, and accordingly, may have light stability. Accordingly, the second sol composition 200 may not further include the photostabilizer.

As shown in FIG. 19, the step of forming the bulk capsule structure 400 may include forming a structure precursor 300; introducing the quantum dots 210 into the expanded structure precursor 355 to form a bulk capsule structure precursor 350; and foaming the bulk capsule structure 400 in which the quantum dots 210 are encapsulated. The polymerization between the first capsule precursor 110 and the second capsule precursor 120 may proceed, and the structure precursor 300, the expanded structure precursor 355, and the bulk capsule structure 400 may be sequentially prepared.

The step of forming the structure precursor 300 may include forming, by light irradiation, a bond between the first capsule compositions 100, a bond between the second capsule compositions 120, and a bond between the first capsule composition 100 and the second capsule composition. In other words, the polymerization reaction between the silane-based coupling agent and/or the first capsule composition 100 on the surface of the inorganic oxide precursor may occur. Accordingly, the structure precursor 300 may be inorganic oxide having pores through crosslinkage between the silane-based coupling agent and/or the first capsule composition 100.

The first sol composition 100 described above with reference to FIGS. 15 and 17 may also include a bond between the first capsule composition 110 and the second capsule composition 120. However, unlike the first sol composition 100, the structure precursor 300 may be formed with a chemical bond between the photoinitiator famed with the radical by light irradiation and the first capsule composition 110 or the second capsule composition 120, and accordingly, the radical may move to the first capsule composition 110 or the second capsule composition 120 bonded with the photoinitiator. In other words, unlike the first sol composition 100, a bond between the first capsule composition 110 and the second capsule composition 120 may be formed in the structure precursor 300 by the radical.

The step of forming the bulk capsule structure precursor 350 may include: preparing the expanded structure precursor 355; and introducing the quantum dots 210 into the expanded structure precursor 355. Specifically, the radical reaction between the first capsule precursor 110 and/or the second capsule precursor 120 may be performed inside the structure precursor 300, and accordingly, the expanded structure precursor 355 may be prepared. At the same time, the quantum dots 210 may be introduced into the expanded structure precursor 355, and accordingly, the bulk capsule structure precursor 350 may be famed.

The step of forming the bulk capsule structure 400 may include encapsulating the quantum dots 210 through the chemical bond between the quantum dots 210 introduced into the bulk capsule structure precursor 350 and the first capsule composition 110 or the second capsule composition 120. As described above, with reference to FIG. 18, the first capsule composition 110 may be bonded to the surface of the quantum dot 210. Accordingly, the quantum dot 210 may be easily bonded to the first capsule composition 110 or the second capsule composition 120. In other words, the bulk capsule structure 400 may include the quantum dot 210 and the structure 410 surrounding the quantum dot 210. The structure 410, as described above, may be formed by crosslinking the first capsule composition 110 and the second capsule composition 120.

Referring to FIG. 15, the quantum dot microcapsules may be formed by pulverizing the bulk capsule structure 400 (S140).

Specifically, for example, the quantum dot microcapsules may be prepared by pulverizing the bulk capsule structure 400 through a ball-mill process. The bulk capsule structure 400 and a ball may be provided in a ball-mill apparatus, and the rotation of the ball-mill apparatus may cause friction between the bulk capsule structure 400 and the ball, so that the quantum dot microcapsules may be formed. For example, the ball may be at least any one of a forged ball, a chrome ball, an alumina ball, a zirconia ball, or a ceramic ball.

The quantum dot nanocapsules may be prepared by re-dispersing the quantum dot microcapsules in a solvent (S150).

Specifically, the quantum dot microcapsules may have a shape in which the quantum dot nanocapsules are aggregated. Accordingly, the agglomerated quantum dot nanocapsules may be dissolved in the solvent. For example, the solvent may be dichloro benzene.

Accordingly, the quantum dot nanocapsule may include a capsule film formed by crosslinking the quantum dot 210 and the first capsule composition 110 and/or the second capsule composition to surround the surface of the quantum dots 210. As described above, the capsule film may be generated after the bulk capsule structure 400 is pulverized and re-dispersed in the solvent. The second capsule composition may include a silane-based coupling agent on the surface of the inorganic oxide precursor, and accordingly, the capsule film may be formed after the curable functional group of the first capsule composition 110 and/or the silane-based coupling agent are crosslinked.

According to the embodiment of the present invention, the first sol composition 100 in which the first capsule composition 110 and the second capsule composition 120 are uniformly mixed may be prepared. In addition, the quantum dots 210 may be uniformly dispersed in the first sol composition 100.

In the quantum dot 210, the oxidized ligand 210o may be removed on the surface of the quantum dot, and the first capsule composition 110 may be bonded to the position from which the oxidized ligand 210o is removed. Accordingly, the quantum dots 210 and the first capsule composition 110 and/or the second capsule composition 120 may be easily crosslinked.

Accordingly, the bulk capsule structure 400 prepared in the above manner may have a structure in which the surface of the quantum dot 210 is encapsulated with the first capsule composition 110 and the second capsule composition 120. As described above, the prepared structure 410 may have excellent anti-moisture permeation and anti-oxygen permeation properties. In addition, the structure 410 may provide thermal and photo stability to the quantum dots 210 included therein. Accordingly, in addition to the encapsulation of the quantum dots 210, the structure 410 may be easily applied to industrial fields, such as organic light emitting diodes (OLED), IT information devices, energy devices, biosensors, imaging sensors, and drug delivery materials, that require extreme barrier properties.

In addition, the bulk capsule structure 400 may be easily formed into the quantum dot nanocapsules after pulverized to have a micro size and re-dispersed in the solvent. Accordingly, the quantum dot nanocapsules can be easily prepared by the relatively simple process.

Hereinafter, evaluation results will be described with respect to the method of fabricating the quantum dot nanocapsules and properties thereof according to a specific experimental example of the present invention.

Preparation of Quantum Dot Nanocapsule According to Experimental Example

Dipentaerythritol pentaacrylate (DPPA) represented by <Formula 8> as a first capsule composition, silicon oxide as an inorganic oxide precursor (88% of solid content 40%, average particle diameter 20 nm. 'Nalco 2327' manufactured by Nalco Corporation in Naperville, Ill.), 3-(trimethoxysilyl)propyl methacrylate (MSPM) represented by <Formula 26> as a silane-based coupling agent (using 'A174' of Union Carbide Corporation), 2(3)-t-butyl-4-hydroxytoluene (BHT) represented by the above <Formula 51> as a photostabilizer, acryloyl porpoline (ACMO) represented by the above <Formula 40> as a quantum dot dispersant, (1-hydroxycyclohexyl)(phenyl)methanol (HCPM) represented by the above <Formula 50> as a photoinitiator ('Irgacure 184' of Ciba Geigy Corporation in Horton of New York is used), and CdSe@ZnS as a quantum dot were prepared.

A first mixture was prepared by heating 65 g of the dipentaerythritol pentaacrylate (DPPA) at a temperature of 49° C., and adding 100 g of the silicon oxide.

A second mixture was prepared by mixing 15 g of the 3-(trimethoxysilyl)propyl methacrylate (MSPM) to the first mixture.

A third mixture was prepared by adding 0.3 g of the 2(3)-t-butyl-4-hydroxytoluene (BHT) as the photostabilizer and 0.04 g of phenothiazine as another photostabilizer into the second mixture.

A dried product was prepared by removing most of water and methanol contained in the third mixture by gently vacuum distilling the third mixture at a pressure range of 80 mmHg to 120 mmHg in a temperature range of 50° C. to 54° C.

When the drying process is significantly completed, the solid was distilled by using a solvent mixture obtained by mixing isopropyl alcohol (IPA) and distilled water in the weight ratio of 14:1, until the solid has the content of 50%.

The mixed solvent was again provided to the mixture having the solid content of 50% and diluted such that the solid content becomes 25%.

The red light emitting quantum dots were dispersed in a chloroform solvent by using the acryloyl porpoline (ACMO).

A coating solution was prepared by mixing a solution obtained by dispersing the quantum dots in the mixture having the solid content of 25%, and 1.5 g of the (1-hydroxycyclohexyl)(phenyl)methanol (HCPM).

The coating solution was coated to have a thickness of 2.5 mm on a polyethylene terephthalate (PET) substrate.

Most of the isopropyl alcohol was removed by flash drying the coated substrate in an air circulation oven at a temperature of 60° C. for 2.5 minutes.

After the drying process, a high-pressure mercury lamp (using 'QC 1202' of PPG Indestries in Plainfield of Illinois) was used, so that the dried coating was cured. The curing was subject to 20 m/min, 400 V, 100 mJ/cm2 and atmospheric conditions.

After the curing process, the transparent bulk capsule structure was prepared on the substrate.

After the bulk capsule structure was removed from the substrate by a film scraping process and pulverized, so that the quantum dot microcapsules were prepared.

The quantum dot microcapsules were provided in the dichlorobenzene solvent, so that the quantum dot nanocapsules were prepared.

Hereinafter, the quantum dot light emitting diode package and the method of fabricating the same according to the embodiments of the present invention will be described with reference to FIGS. 20 to 34.

Figure 20:
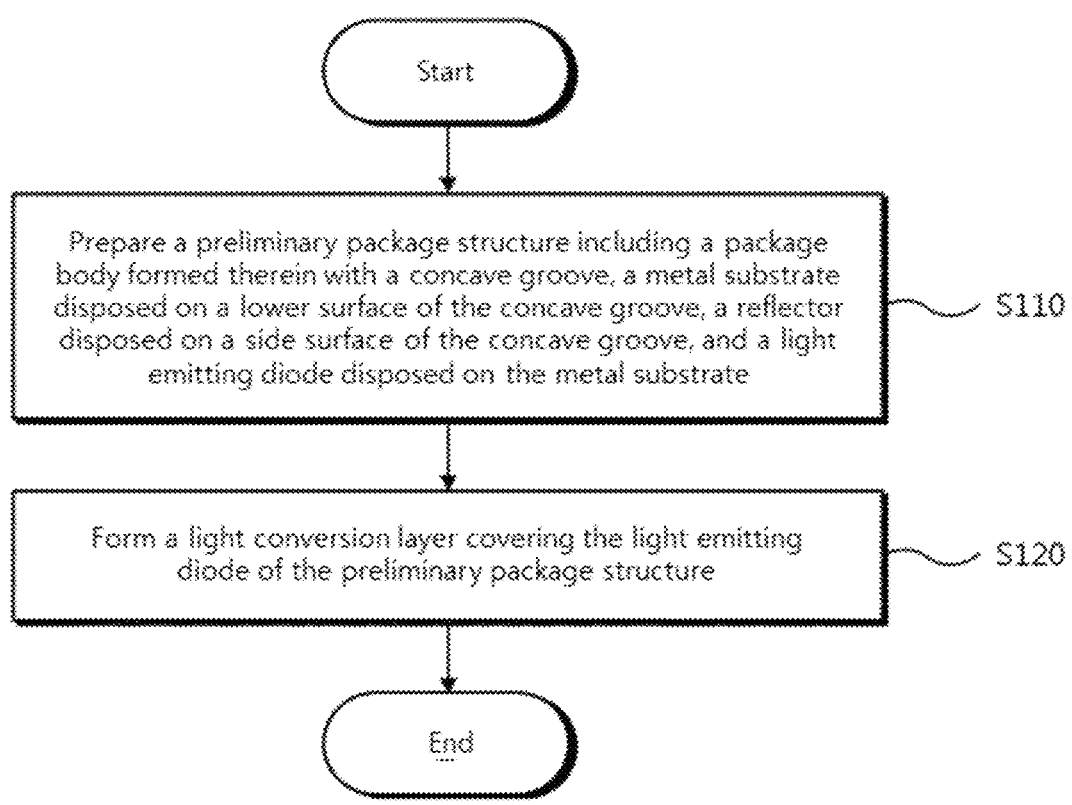
FIG. 20 is a flow chart for explaining a method of fabricating a quantum dot light emitting diode package according to the embodiments of the present invention.
Figure 21:
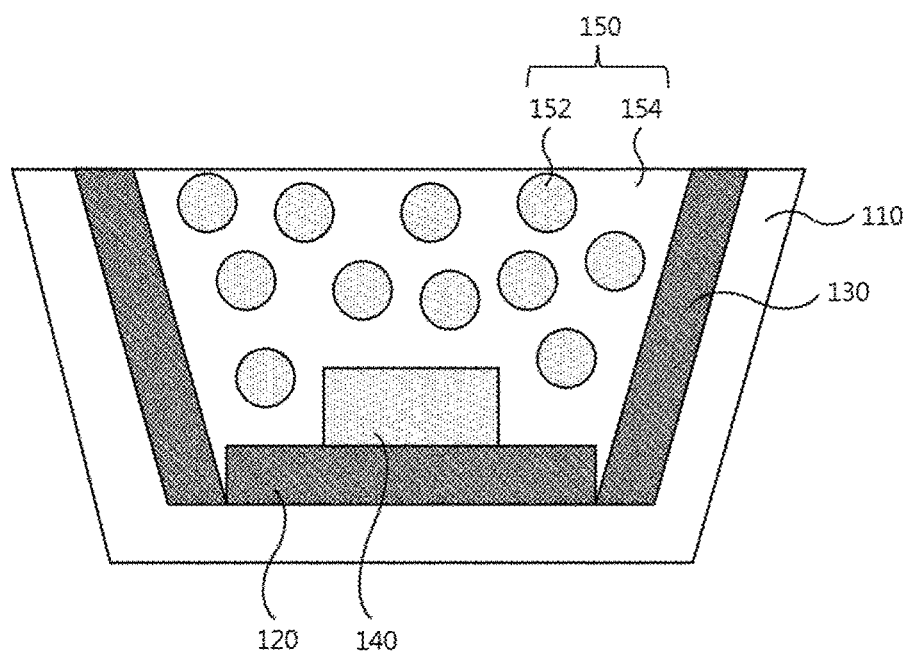
FIG. 21 is a schematic sectional view of the quantum dot light emitting diode package according to the embodiments of the present invention.
Figure 22:
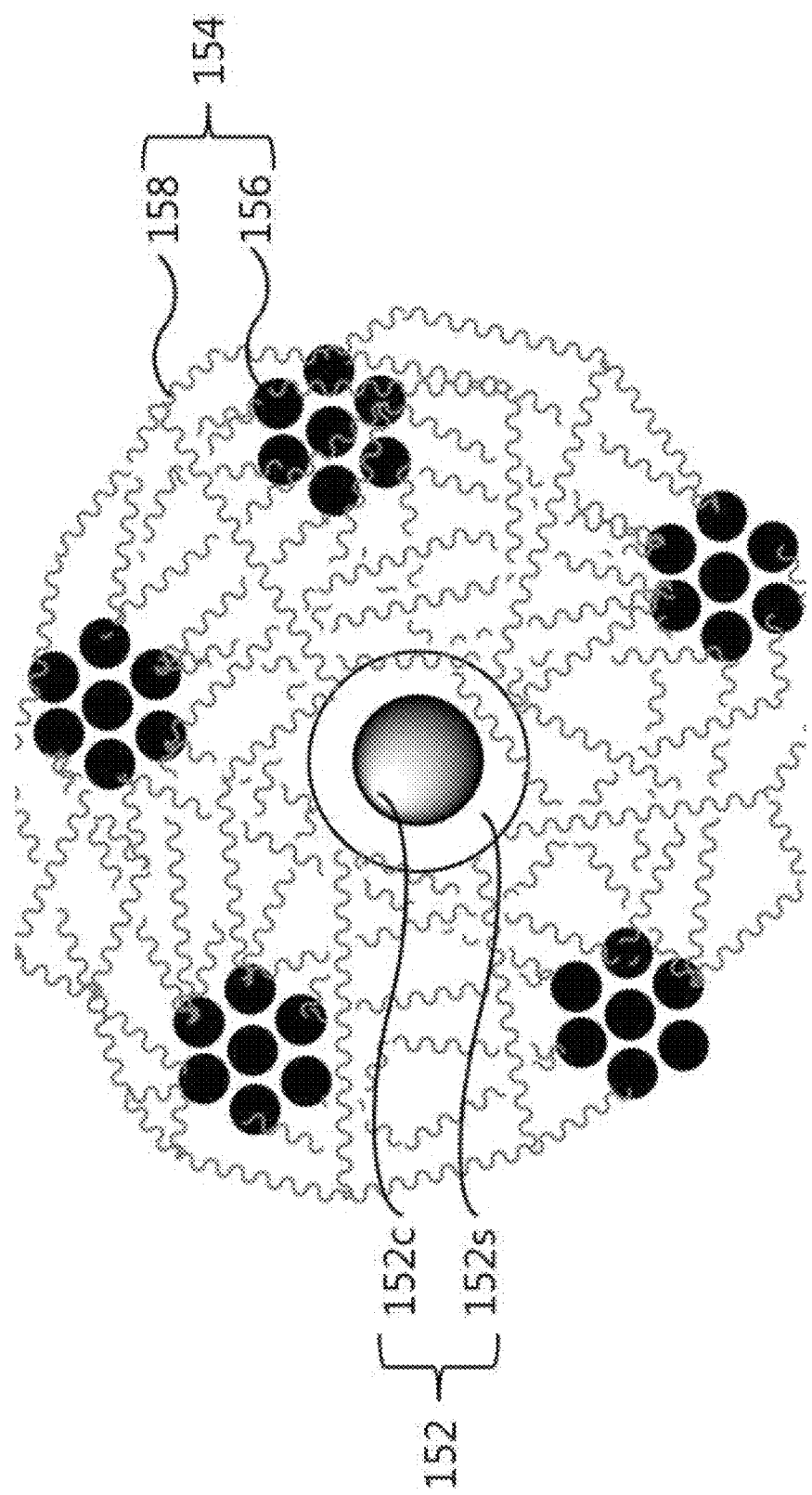

FIG. 20 is a flow chart for explaining a method of fabricating a quantum dot light emitting diode package according to the embodiments of the present invention. FIG. 21 is a schematic sectional view of the quantum dot light emitting diode package according to the embodiments of the present invention. FIG. 22 is a view showing a coupling structure of the light conversion layer of the quantum dot light emitting diode package according to the embodiments of the present invention.

Referring to FIGS. 20 and 21, a preliminary package structure, which includes a package body 110 formed therein with a concave groove, a metal substrate 120 disposed on a lower surface of the concave groove, a reflector 130 disposed on a side surface of the concave groove, and a light emitting diode 140 disposed on the metal substrate, may be prepared (S110).

The package body 110 may have a mounting groove formed on a lower surface thereof. In addition, the package body 110 may be formed with an electrode on a lower surface thereof. In other words, the package body 110 may include the electrode on the opposite side of the concave groove. The package body 110 may electrically connect the electrode and the light emitting diode 140 provided therein through the mounting groove. Accordingly, the package body 110 may be formed of an insulating material. For example, the insulating material may be at least any one selected from epoxy-based resin, polyimide-based resin, and the like.

The metal substrate 120 may be provided between the light emitting diode 140 and the electrode. Accordingly, the metal substrate 120 may facilitate the electrical connection between the light emitting diode 140 and the electrode. The metal substrate 120 may have high thermal conductivity, and accordingly, may easily release heat generated during operations of the light emitting diode 140. In other words, the metal substrate 120 may provide a heat dissipation effect. For example, the metal substrate 120 may include at least any one metal selected from copper, aluminum, and the like.

The reflector 130 may be formed on a side surface of the package body 110. In the package body 110, the sectional area of an opening may be larger than that of the lower surface. In other words, the package body 110 may be formed to have an obtuse angle between the lower surface and the side surface. Accordingly, the reflector 130 may easily condense light emitted from the light emitting diode 140 provided inside the package body 110.

Specifically, the reflector 130 may be formed of a metallic material that is opaque and has high reflectivity. Accordingly, as described above, the reflector 130 may have the high thermal conductivity, so that heat generated from the light emitting diode 140 may be easily discharged. For example, the reflector 130 may be an aluminum plate. For another example, the reflector 130 may be a polyamide resin, and the polyamide-based resin may include at least one unit of a terephthalic acid unit represented by the following <Formula 1>, a dicarboxylic acid unit represented by the following <Formula 2>, and the like.

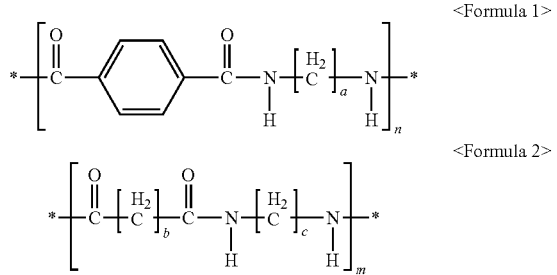

<Formula 1>

<Formula 2>

Herein, a, b, and c may have several to tens of integer values, and n and m may have tens to tens of thousands of integer values.

The light emitting diode 140 may be provided on the metal substrate 120. The light emitting diode 140 may be electrically connected to the metal substrate 120 through one structure of a solder-ball or a bump. In other words, the light emitting diode 140 may be the flip-chip type light emitting diode 140.

Unlike the above description, when the light emitting diode 140 is a wire-bonding type light emitting diode 140, an insulating material layer may be further included between the light emitting diode 140 and the metal substrate 120, and the light emitting diode 140 may be electrically connected to the metal substrate 120 through a metal wire. In this case, the metal wire may be disconnected, and accordingly, the lifespan of the light emitting diode package may be reduced.

However, as described above, when the light emitting diode 140 is a flip-chip type light emitting diode, the light emitting diode 140 as multiple structures may be electrically coupled to the metal substrate 120, and accordingly, the lifespan and heat dissipation characteristics of the light emitting diode package may be improved.

Referring to FIGS. 20 to 22, the light conversion layer 150 for covering the light emitting diode 140 may be formed (S120).

According to one embodiment, the light conversion layer 150 may be prepared by curing quantum dot ink including quantum dots 152, inorganic oxide having a curable functional group 156, and a crosslinkable material 158. Specifically, the light conversion layer 150 may be prepared by injecting the quantum dot ink into the concave groove famed therein with the light emitting diode 140, and then curing the quantum dot ink with light emitted from the light emitting diode 140. In other words, the step of curing the quantum dot ink may be performed without additional process equipment for irradiating heat or light energy. Accordingly, the light conversion layer 150 may be prepared by the relatively simple process. In addition, since the additional process equipment is unnecessary for the step of forming the light conversion layer 150, the process cost may be reduced.

According to one modification, the light conversion layer 150 may be prepared by injecting the quantum dot ink into the concave groove formed therein with the light emitting diode 140, and then curing the quantum dot ink by irradiating ultraviolet rays on the quantum dot ink. The ultraviolet rays may be uniformly irradiated over the entire region of the quantum dot ink, and accordingly, the quantum dot ink may be easily cured. In other words, the resin 154 surrounding the quantum dots 152 may be easily formed, and accordingly, the stability of the quantum dots 152 may be improved.

Accordingly, the light conversion layer 150 may include particles of the inorganic oxide 156 and the quantum dot 152. An average distance between the particles may be 0.3 nm or less.

Unlike the above description, when the average distance between the particles is more than 0.3 nm, the average distance between the particles may be greater than an average diameter of oxygen molecules or water molecules. Accordingly, the oxygen molecules and the water molecules may easily move between the particles.

However, as described above, when the average distance between the particles is 0.3 nm or less, the average distance may be smaller than the average diameter of the oxygen molecules and the water molecules. Accordingly, the light conversion layer 150 may have excellent anti-moisture permeation and anti-oxygen permeation properties.

Accordingly, the light conversion layer 150 may easily prevent the quantum dots 152 from reacting with the oxygen molecules and the water molecules and being decomposed, thereby exhibiting high light conversion efficiency. The light conversion layer 150 may further include at least any one additive of zinc oxide (ZnO), zirconium oxide (ZrO2), or aluminum oxide (Al2O3) to improve the anti-moisture permeability and anti-oxygen permeation properties.

Specifically, as shown in FIG. 22, the light conversion layer 150 may include the resin 154 in which the curable functional group and the crosslinkable material 158 are bonded, and the quantum dots 152 dispersed in the resin 154.

According to one embodiment, as shown in FIG. 22, the quantum dot 152 may be the quantum dot 152 having a core-shell structure composed of a quantum dot core 152c and a quantum dot shell 152s surrounding the quantum dot core 152c.

According to another embodiment, the quantum dot 152 is the quantum dot 152 having the core-shell structure, and may be a nanocapsule quantum dot further including a capsule layer bonded to the surface of the quantum dot shell 152s. Specifically, the nanocapsule quantum dot may be prepared by coating the quantum dot ink on a substrate, curing and pulverizing a quantum dot ink thin film formed, and re-dispersing the pulverized quantum dot ink thin film.

According to another embodiment, the quantum dot 152 may include heterogeneous materials, and may be formed by doping one material on another material.

Specifically, the quantum dot 152 may include at least one substance of a semiconductor compound of groups 12-16, a semiconductor compound of groups 13-15, a semiconductor compound of groups 14-16, a semiconductor compound of groups 14, or a semiconductor material of group 14.

For example, the semiconductor compound of groups 12-16 may be at least any one of cadmium sulfur (CdS), cadmium selenium (CdSe), cadmium tellurium (CdTe), zinc sulfur (ZnS), zinc selenium (ZnSe), zinc tellurium (ZnTe), zinc oxide (ZnO), mercury sulfur (HgS), mercury selenium (HgSe), or mercury tellurium (HgTe).

For another example, the semiconductor compound of groups 13-15 may be at least any one of gallium nitrogen (GaN), gallium phosphorus (GaP), gallium arsenide (GaAs), gallium antimony (GaSb), aluminum nitrogen (AlN), aluminum phosphorus (AlP), aluminum arsenic (AlAs), aluminum antimony (AlSb), indium nitrogen (InN), indium phosphorus (InP), indium arsenic (InAs), or indium antimony (InSb).

For still another example, the semiconductor compound of groups 14-16 may be at least any one of tin sulfur (SnS), tin selenium (ZnSe), tin tellurium (SnTe), lead sulfur (PbS), lead selenium (PbSe), or lead tellurium (PbTe).

For still another example, the semiconductor compound of group 14 may be any one of silicon carbon (SiC) or silicon germanium (SiGe).

For still another example, the semiconductor material of group 14 may be any one of silicon (Si) or germanium (Ge).

According to one embodiment, the modified inorganic oxide 156 may contain a metal element. In addition, the modified inorganic oxide 156 may include a curable material bonded with the metal element. Specifically, the curable material may include a functional group to be bonded with the metal element and the curable functional group that are formed at both ends thereof. Accordingly, the modified inorganic oxide 156 may be prepared by bonding the metal element and the functional group, and simultaneously the curable functional group may be disposed on the surface of the inorganic oxide 156.

For example, the inorganic oxide 156 may be at least any one of silicon oxide, aluminum oxide, gallium oxide, indium oxide, germanium oxide, tin oxide, palladium oxide, titanium dioxide, zirconium oxide, or hafnium oxide.

In addition, for example, the curable material may be a silane-based crosslinking agent, and the functional group may be an alkylethoxysilyl group. Specifically, for example, the curable material may be at least any one of (3-aminopropyl)silanetriol (APST) represented by the following <Formula 3>, 3-(trimethoxysilyl)propyl methacrylate (MSPM) represented by the following <Formula 4>, 3-(triethoxysilyl)propan-1-amine (TESPA) represented by the following <Formula 5>, triethyl(trifluorophetyl)silane (TETFS) represented by the following <Formula 6>, 3-(trimethoxysilyl)propyl methacrylate (MAPTMS) represented by the following <Formula 7>, 2-(trihydroxysilyl)ethyl methacrylate (HSEM) represented by the following <Formula 8>, 3-(triethoxysilyl)propan-1-amine (TEOSPA) represented by the following <Formula 9>, trimethoxy(vinyl)silane (VTMS) represented by the following <Formula 10>, N-(3-(triethoxysilyl)propyl) acrylamide (ALPTMS) represented by the following <Formula 11>, or (triethoxysilyl)methyl acrylate (AMTMS) represented by the following <Formula 12>.

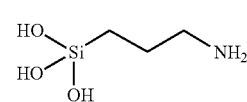

<Formula 3>

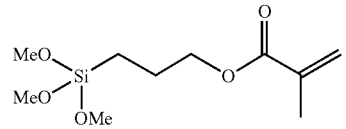

<Formula 4>

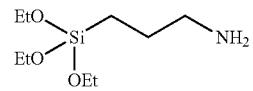

<Formula 5>

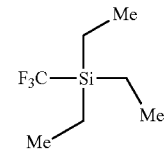

<Formula 6>

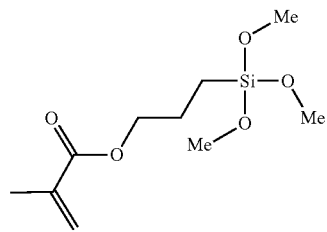

<Formula 7>

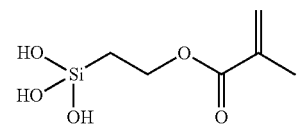

<Formula 8>

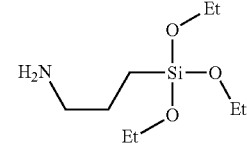

<Formula 9>

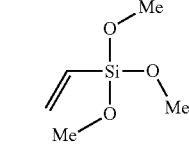

<Formula 10>

<Formula 11>

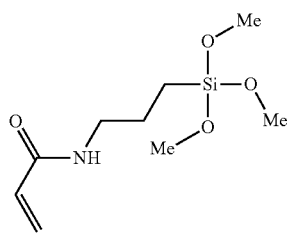

<Formula 12>

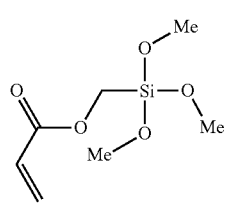

According to one embodiment, the crosslinkable material 158 may be a crosslinkable acrylate. Specifically, for example, the crosslinkable material 158 may include at least one of oligoacrylate, siloxane-based acrylate, or silicone polymer resin.

For example, the oligoacrylate may be at least any one of ethylene glycol dimethacrylate (EGDMA) represented by the following <Formula 13>, tri(ethylene glycol)dimethacrylate (TEGMMA) represented by the following <Formula 14>, 2-(acryloyloxymethyl)-2-ethylpropane-1,3-diyl diacrylate (AEDA) represented by the following <Formula 15>, pentaerythritol triacrylate (PETA) represented by the following <Formula 16>, trimethylolpropane triacrylate (TMPTA) represented by the following <Formula 17>, dipentaethitol acrylate (DPEA) represented by the following <Formula 18>, dipentaerythritol hexaacrylate (DPHA) represented by the following <Formula 19>, dipentaerythritol pentaacrylate (DPPA) represented by the following <Formula 20>, or trimethylolpropane ethoxylate triacrylate (TMPET) represented by the following <Formula 21>.

<Formula 13>

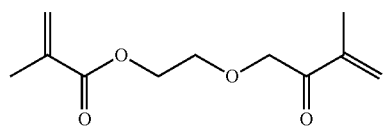

<Formula 14>

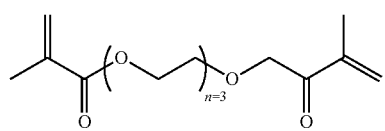

<Formula 15>

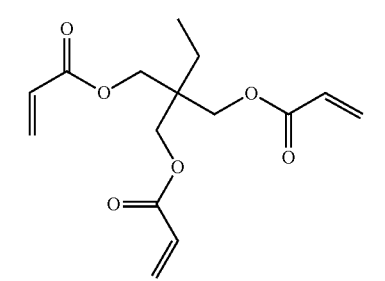

<Formula 16>

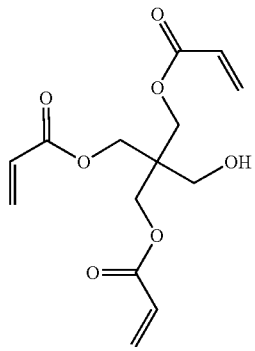

<Formula 17>

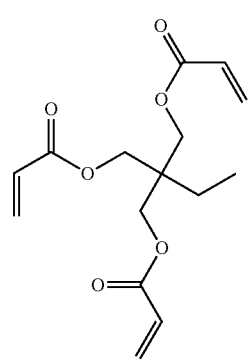

<Formula 18>

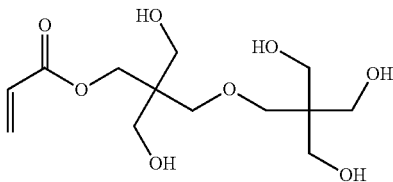

<Formula 19>

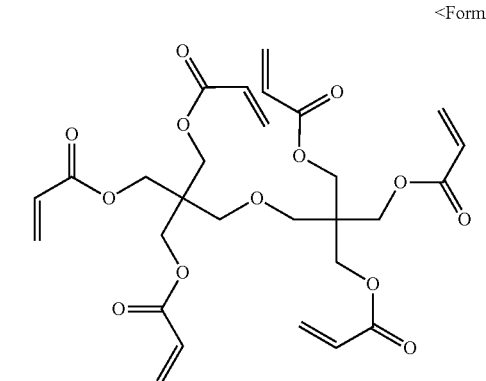

<Formula 20>

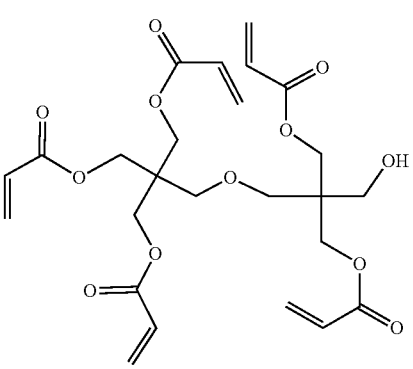

<Formula 21>

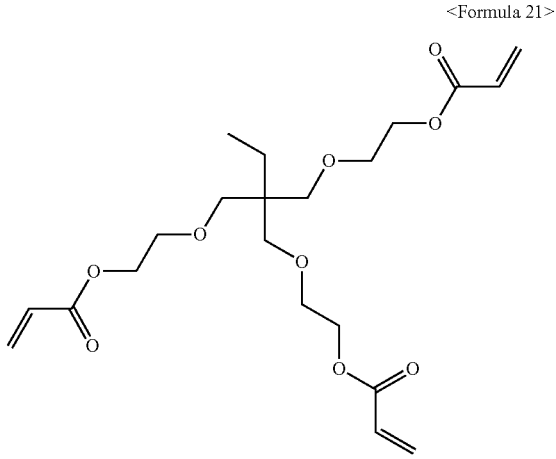

For another example, the siloxane-based acrylate may be at least any one of 3-(trimethoxysilyl)propyl methacrylate (MSPM) represented by the above <Formula 4>, 3-(trimethoxysilyl)propyl methacrylate (MAPTMS) represented by the above <Formula 7>, 2-(trihydroxysilyl)ethyl methacrylate (HSEM) represented by the above <Formula 8>, or (triethoxysilyl)methyl acrylate (AMTMS) represented by the above <Formula 12>.

For still another example, it may be silicon polymer resin. Specifically, for example, the silicon polymer resin may be polysilazane represented by <Formula 22>.

<Formula 22>

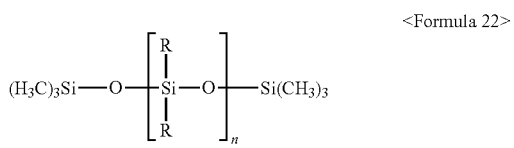

R may be an alkyl group selected from methyl, ethyl, propyl, butyl, and the like.

According to one embodiment, the quantum dot ink may further include a light scattering agent. The light scattering agent may change a path of light incident on the light conversion layer 150 and diffuse emitted light. For example, the light scattering agent may include at least one of metal oxide particles, air bubbles, glass beads, or polymer beads.

A protective layer may be further formed on the light conversion layer 150. For example, the protective layer may be a thin film for covering the light conversion layer 150. The protective layer may transmit light emitted from the light emitting diode 140 and the light conversion layer 150. In addition, the protective layer may prevent the oxygen molecules and the water molecules from being diffused to the light conversion layer 150. In other words, the protective layer may have the high light transmittance and the anti-moisture permeation and anti-oxygen permeation properties. Specifically, for example, the protective layer may be at least any one of polyethylene terephthalate (PET), polyester (PES), polyethylene naphtalate (PEN), polypropylene (PP), or polyethylene (PE).

For another example, as described above, the protective layer has the excellent anti-moisture permeation and anti-oxygen permeation properties, and may further perform the role of a lens. Accordingly, the protective layer may have any one shape selected from a semicircle, a square pyramid, or the like. When the protective layer has a semicircular shape, the light emitted from the light conversion layer 150 may be concentrated in a vertical direction of the light conversion layer 150. In addition, the protective layer may easily radiate the light generated from the light emitting diode 140 and the light conversion layer 150 to the outside of the light conversion layer 150. Specifically, for example, as described above, the protective layer may be at least any one of polyethylene terephthalate (PET), polyester (PES), polyethylene naphtalate (PEN), polypropylene (PP), or polyethylene (PE).

As described above, as shown in FIG. 21, a quantum dot light emitting diode package, which includes the package body 110 formed therein with the concave groove, the metal substrate 120 disposed on a lower surface of the concave groove, the reflector 130 disposed on a side surface of the concave groove, the light emitting diode 140 disposed on the metal substrate 120, and the light conversion layer 150 covering the light emitting diode 140, may be formed.

The light conversion layer 150 may transmit some of the light emitted from the light emitting diode 140, and convert the remaining part into light having a different wavelength. Accordingly, the light conversion layer 150 may include at least one or more quantum dots 152 having a maximum light emitting peak at a wavelength longer than a wavelength of a maximum light emitting peak of the light emitting diode 140. Accordingly, the quantum dot light emitting diode package may exhibit a light emitting color in which the light emitted from the light emitting diode 140 and light converted and emitted from the light conversion layer 150 are mixed. The light emitting color may be white light.

Specifically, for example, the light emitting diode 140 may be a blue light emitting diode, and the light conversion layer 150 may include a green-light emitting quantum dot, and a red-light emitting quantum dot. For example, the blue light emitting diode may exhibit a maximum light emitting peak in the range of 440 nm to 490 nm, the green-light emitting quantum dot may exhibit a maximum light emitting peak in the range of 520 nm to 560 nm, and the red-light emitting quantum dot may exhibit a maximum light emitting peak in the range of 630 nm to 660 nm.

As described above, the green-light emitting quantum dot may emit green light by converting the blue light emitted from the blue light emitting diode. The red-light emitting quantum dot may emit red light by converting the blue light. In addition, the red-light emitting quantum dot may emit the red light by converting the blue light. Specifically, for example, the light conversion layer 150 may include 5% of the green-light emitting quantum dots and 5% of the red-light emitting quantum dots.

Accordingly, the quantum dot light emitting diode package may emit white light by mixing the blue light, the green light emitted after the blue light is converted, and the red light emitted after the blue light and the green light are converted. In other words, the quantum dot light emitting diode package may emit the white light by mixing tricolor light including the blue light, the green light, and the red light with each other. Accordingly, the quantum dot light emitting diode package may have high color reproduction. In other words, the quantum dot light emitting diode may exhibit a high color rendering index (CRI).

For another example, the quantum dot light emitting diode package may include the light emitting diode 140 and the quantum dot 152 that have light emitting characteristic of a complementary color relation. Specifically, the light emitting diode 140 may be a sky-blue light emitting diode, and the light conversion layer 150 may include red-light emitting quantum dots. Alternatively, the light emitting diode 140 may be a blue light emitting diode, and the light conversion layer 150 may include yellow-light emitting quantum dots. The light conversion layer 150 may include a single material, and accordingly, the light conversion layer 150 may be easily prepared.

As described above, the quantum dot light emitting diode package may include the light emitting diode 140 and the light conversion layer 150 for converting light emitted from the light emitting diode 140 into light having a different wavelength.

The light conversion layer 150 may include the resin 154 formed by bonding the curable functional group on the surface of the inorganic oxide 156 with the crosslinkable material 158, and the quantum dots 152 dispersed on the resin 154. In this case, the resin 154 may provide photostability and heat-stability to the quantum dots 152 dispersed therein. Accordingly, the resin 154 may prevent the quantum dots 152 from being deteriorated by light or heat. Accordingly, the quantum dot light emitting diode package may be prepared to have a structure in which the light emitting diode 140 and the light conversion layer 150 come into direct contact with each other. In addition, the resin 154 may have the anti-moisture permeation and anti-oxygen permeation properties, and accordingly, may prevent the quantum dots 152 from reacting with the oxygen molecules and the water molecules and being decomposed. In other words, the quantum dot 152 may improve the stability by the resin 154 surrounding the quantum dots 152.

In addition, the light conversion layer 150 may be prepared by curing the quantum dot ink in which the inorganic oxide 156 having the surface modified with the curable functional group, the crosslinkable material 158, and the quantum dots 152 are mixed. After applied in the concave groove in which the light emitting diode 140 is formed, the quantum dot ink may be cured by the light emitted from the light emitting diode 140. In other words, the step of curing the quantum dot ink may be performed without additional equipment, so that the preparation process of the light conversion layer 150 may be simplified, and the cost of the preparation process may be reduced.

Hereinafter, evaluation results will be described with respect to the method of fabricating the quantum dot light emitting diode package and properties thereof according to a specific experimental example of the present invention.

Preparation of Quantum Dot Ink According to Experimental Examples 1 to 4

Dipentaerythritol pentaacrylate (DPPA) as the crosslinkable material, 3-methacryl oxypropyl trimethoxysilane as the curable material, silicon oxide as the inorganic oxide (88% of solid content 40%, average particle diameter 20 nm. 'Nalco 2327' manufactured by Nalco Corporation in Naperville, Ill.), and CdSe@ZnS as the quantum dot were prepared.

A first mixture was prepared by heating 65 g of the dipentaerythritol pentaacrylate (DPPA) at a temperature of 49° C., and adding 100 g of the silicon oxide.

A second mixture was prepared by mixing 15 g of the 3-(trimethoxysilyl)propyl methacrylate (MSPM) to the first mixture.

A third mixture was prepared by adding 0.3 g of the 2(3)-t-butyl-4-hydroxytoluene (BHT) as the photostabilizer and 0.04 g of phenothiazine as another photostabilizer into the second mixture.

A dried product was prepared by removing most of water and methanol contained in the third mixture, by gently vacuum distilling the third mixture at a pressure range of 80 mmHg to 120 mmHg in a temperature range of 50° C. to 54° C.

When the drying process is significantly completed, the solid was distilled by using a solvent mixture obtained by mixing isopropyl alcohol (IPA) and distilled water in the weight ratio of 14:1, until the solid has the content of 50%.

The mixed solvent was again provided to the mixture having the solid content of 50% and diluted such that the solid content becomes 25%.

The red light emitting quantum dots were dispersed in a chloroform solvent by using the acryloyl porpoline (ACMO).

The quantum dot solutions according to Experimental Examples 1 to 4 were prepared by mixing a solution obtained by dispersing the quantum dots in the mixture having the solid content of 25%, and 1.5 g of the (1-hydroxycyclohexyl)(phenyl)methanol (HCPM).

Preparation of quantum dot solution according to Experimental Example 5

The quantum dot solution according to the above-described Experimental Example 1 was coated to have a thickness of 2.5 mm on a polyethylene terephthalate (PET) substrate.

Most of the isopropyl alcohol was removed by flash drying the coated substrate in an air circulation oven at a temperature of 60° C. for 2.5 minutes.

After the drying process, a high-pressure mercury lamp (using 'QC 1202' of PPG Indestries in Plainfield of Illinois) was used, so that the dried coating was cured. The curing was subject to 20 m/min, 400 V, 100 mJ/cm2 and atmospheric conditions.

After the curing process, the transparent bulk capsule structure was prepared on the substrate.

After the bulk capsule structure was removed from the substrate by a film scraping process and pulverized, so that the quantum dot microcapsules were prepared.

The quantum dot microcapsules were provided in the dichlorobenzene solvent, so that the nanocapsule quantum dots were prepared.

While prepared in the same manner as in Experimental Example 1 described above, quantum dot ink according to Experimental Example 5 was prepared by providing the nanocapsule quantum dot instead of the CdSe@ZnS quantum dot.

The composition ratios of the quantum dot ink according to Experimental Examples 1 to 5 described above are shown in the following Table 1.

TABLE 1

|  | Quantum dots | Quantum dots: (Modified inorganic oxide + crosslinkable material) |
| --- | --- | --- |
| Comparative Example 1 | — | — |
| Comparative Example 2 | — | — |
| Experimental Example 1 | CdSe @ ZnS | 1:1 |
| Experimental Example 2 | CdSe @ ZnS | 1:10 |

TABLE 1-continued

| | Quantum dots | Quantum dots: (Modified inorganic oxide + crosslinkable material) |
|---|---|---|
| Experimental Example 3 | CdSe @ ZnS | 1:10 |
| Experimental Example 4 | CdSe @ ZnS | 1:10 |
| Experimental Example 5 | Nanocapsule quantum dot CdSe @ ZnS @ capsule | 1:10 |

FIGS. 23 to 25 photographs obtained by photographing the fabricating process of the quantum dot light emitting diode package according to the embodiments of the present invention. Referring to FIG. 23, as described above, with reference to FIGS. 20 and 21, the package body includes an electrode on the opposite side of the concave groove. Accordingly, as shown in FIG. 23, the package body further includes a structure connecting the electrode. The structure may be provided with a plurality of the light emitting diodes, and have a structure in which an anode and a cathode of the light emitting diode are connected in parallel. As shown in FIG. 23(b), the structure was fabricated by soldering a wire so that the same poles are connected in parallel. After the above soldering process, power may be connected to both ends of the wire, so that electrical energy may be provided through the anode and the cathode of the light emitting diode.

As shown in FIG. 24(a), the package body in which the metal electrode and the light emitting diode are formed on the structure is provided. After the package body is provided, as shown in FIG. 24(b), the quantum dot ink was provided to cover the light emitting diode.

As shown in FIG. 25(a), the quantum dot ink was provided to a plurality of light emitting diodes. As shown in FIG. 25(b), after the quantum dot ink is provided, the light emitting diode was activated and at the same time the quantum dot ink was cured.

FIGS. 26 to 30 are photographs obtained by photographing on-chip application results of using 0.5 W-LED of the quantum dot light emitting diode package according to the embodiments of the present invention.

Referring to FIGS. 26 to 30, on-chip test results of the quantum dot light emitting diode package including a light emitting diode of 0.5 W may be shown. The curing conditions of the quantum dot ink according to Comparative Example 1, Experimental Examples 1 to 3, and Experimental Example 5 shown in FIGS. 26 to 30 are shown in the following Table 2.

TABLE 2

| | Curing condition |
|---|---|
| Comparative Example 1 | — |
| Experimental Example 1 | Cure of 0.5 W LED |
| Experimental Example 2 | UV cure |
| Experimental Example 3 | Cure of 0.5 W LED |
| Experimental Example 5 | Cure of 0.5 W LED |

The quantum dot light emitting diode package (Experimental Example 1) shown in FIG. 26 may not include the light conversion layer. In other words, it may be the quantum dot light emitting diode package fabricated before the step of forming the light conversion layer. Referring to FIGS. 27 and 29, the result according to the concentration of the quantum dots in the quantum dot ink can be confirmed. The quantum dot ink may include red light emitting quantum dots. As shown in FIGS. 27(a) and 29(a), it can be seen that all of the light emitting diodes exhibit a red color before activation. In contrast, as shown in FIGS. 27(b) and 29(b), when the light emitting diode is activated, it can be seen that the light emitting color of the quantum dot light emitting diode package is close to a red color as the quantum dots have higher concentration. Accordingly, it can be seen that the light conversion layer transmits some of the light emitted from the light emitting diode and the rest of the light is absorbed by the quantum dots. Referring to FIGS. 28 and 29, the quantum dot light emitting diode package using the same quantum dot ink but fabricated by differently curing the quantum dot ink was photographed. In the quantum dot light emitting diode package (Experimental Example 2) shown in FIG. 28(b), after the quantum dot ink was irradiated with ultraviolet rays and cured, the light emitting diode was activated. In contrast, in the quantum dot light emitting diode package (Experimental Example 3) shown in FIG. 10(b), the quantum dot ink is coated, and the light emitting diode was activated, so that the quantum dot ink was cured. It was confirmed that light emitting colors of the quantum dot light emitting diode packages shown in FIGS. 28 and 29 were substantially the same over the entire regions. Accordingly, it was confirmed that the quantum dot light emitting diode package can be easily fabricated even by the simple process of activating the light emitting diode without pre-treatment such as ultraviolet irradiation after the quantum dot ink is applied.

Referring to FIGS. 29 and 30, the concentration of the quantum dot ink is the same, but the quantum dot of the quantum dot light emitting diode package shown in FIG. 30 may further include a capsule layer on a surface thereof. In other words, the quantum dot light emitting diode package (Experimental Example 3) shown in FIG. 29 includes the quantum dot having a core-shell structure, and the quantum dot light emitting diode package (Experimental Example 5) shown in FIG. 30 may be further include the capsule layer on the surface of the quantum dot having the core-shell structure. Accordingly, the quantum dot light emitting diode package according to Experimental Example 5 may include the core-shell-structured quantum dots having the concentration lower than that of the quantum dot light emitting diode package according to Experimental Example 3. Accordingly, as shown in FIGS. 29(a) and 30(a), it can be seen that the quantum dot light emitting diode package using the quantum dot ink according to Experimental Example 5 exhibits a color closer to the quantum dot light emitting diode package using the quantum dot ink according to Comparative Example 1 shown in FIG. 26, compared to the quantum dot light emitting diode package using the quantum dot ink according to Experimental Example 3. In addition, the results substantially the same as those of FIGS. 29(a) and 29(b) also can be seen in FIGS. 29(b) and 30(b).

FIGS. 31 and 32 are photographs obtained by photographing on-chip application results of using 8 W-LED of the quantum dot light emitting diode package according to the embodiments of the present invention.

Referring to FIGS. 31 and 32, as shown in FIGS. 26 and 29, on-chip test results of the quantum dot light emitting diode package were shown, in which the on-chip test results were photographed by using the light emitting diode having power of 10 W. The curing conditions of the quantum dot ink according to Comparative Example 2 and Experimental Example 4 shown in FIGS. 31 and 32 are shown in the following Table 3.

TABLE 3

| | Curing condition |
|---|---|
| Comparative Example 2 | — |
| Experimental Example 4 | Cure of 10 W LED |

Referring to FIG. 31, as described above, with reference to FIG. 26, before and after the quantum dot light emitting diode package emits light were photographed before the light conversion layer was fabricated. Referring to FIG. 32(a), as described above, with reference to FIG. 29, the quantum dot ink having the ratio of 1:10 between the red light emitting quantum dots having a core-shell structure, and the modified inorganic oxide and the crosslinkable material was injected into the concave groove shown in FIG. 31. As shown in FIG. 32(b), the light emitting diode was activated to cure the quantum dot ink. Unlike the quantum dot light emitting diode package (Experimental Example 3) described above with reference to FIG. 29, it was confirmed that the quantum dot light emitting diode package (Experimental Example 4) had high power in the light emitting diode, and accordingly, the quantum dot ink was evaporated as time passed. Accordingly, it was confirmed that the quantum dot ink was easily cured at low power of 0.5 W.

Figure 34:
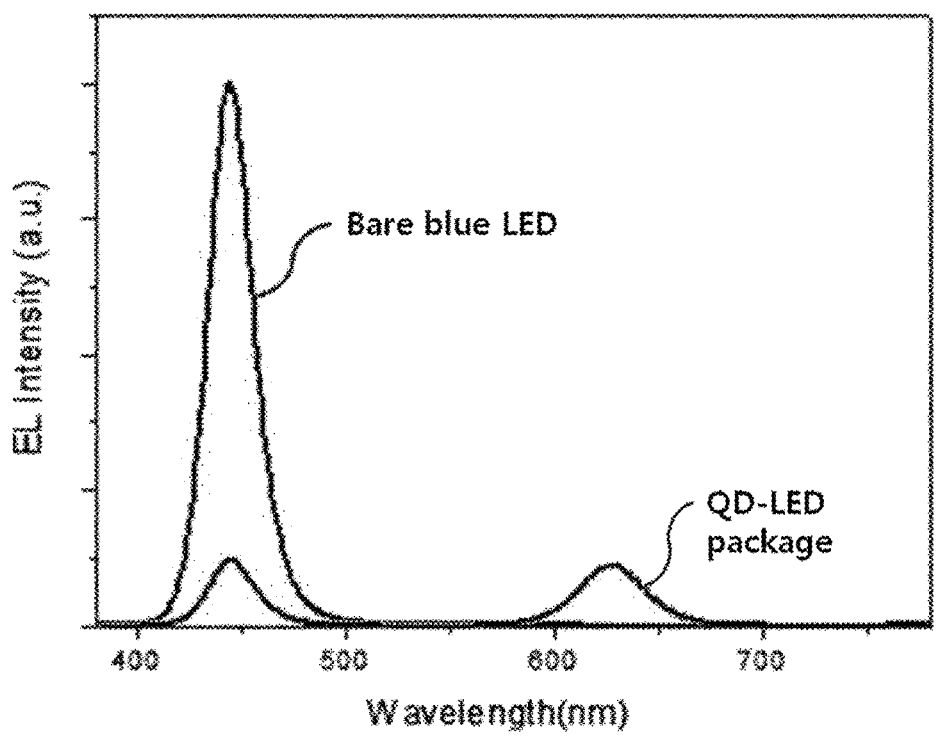
FIG. 34 is a view showing a light emitting spectrum obtained from a 20 mA input current of 0.2 W blue bare LED of the quantum dot LED package according to the embodiments of the present invention.

FIG. 33 are photographs obtained by photographing on-chip application results of using 0.2 W blue bare LED of the quantum dot light emitting diode package according to the embodiments of the present invention. FIG. 34 is a view showing a light emitting spectrum obtained from a 20 mA input current of 0.2 W blue bare LED of the quantum dot LED package according to the embodiments of the present invention.

Referring to FIG. 33, while having the same quantum dot ink composition ratio as in Experimental Examples 3 and 4 described above with reference to Table 1, the quantum dot light emitting diode package including a blue light emitting diode of 0.2 W was photographed. In other words, in the quantum dot light emitting diode package, the quantum dot ink was cured by the blue light emitting diode of 0.2 W.

Referring to FIG. 34, the light emitting spectrum of the quantum dot light emitting diode package fabricated with reference to FIG. 33 was confirmed.

As shown in FIG. 34, before on-chip, it can be seen that the blue light emitting diode of 0.2 W has a light emitting peak at about 380 nm.

In contrast, it was confirmed that the quantum dot light emitting diode package includes the light conversion layer having the red-light emitting quantum dots having a light emitting peak at about 620 nm and accordingly, the quantum dot light emitting diode package exhibits both the light emitting peak of the blue light emitting diode and the light emitting peak of the red light emitting quantum dot.

Although the present invention has been described in detail using the exemplary embodiments, the scope of the present invention is not limited to the specific embodiments, and shall be interpreted by the appended claims. In addition, it will be apparent that a person having ordinary skill in the art may carry out various deformations and modifications for the embodiments described as above within the scope without departing from the present invention.

The organic-inorganic hybrid coating layer and the method of fabricating the same according to the embodiments of the present invention may be used in various industrial fields, such as solar cells, light emitting devices, sensors, and bio-diagnostic reagents, which include quantum dots. The quantum dot nanocapsule and the method of fabricating the same according to the embodiments of the present invention may be used in various industrial fields, such as solar cells, light emitting devices, sensors, and bio-diagnostic reagents. The quantum dot light emitting diode package and the method of fabricating the same according to the embodiments of the present invention may be utilized in various industrial fields, such as living lightings, automobile lightings, architectural lightings, agriculture and fishing lightings, medical and cosmetic apparatuses, and traffic lights.

What is claimed is:

1. A method of fabricating an organic-inorganic hybrid coating layer, the method comprising:
    preparing a gel mixture including an organic precursor and colloidal silica particles;
    preparing a first mixed solution by heating the gel mixture;
    preparing a second mixed solution by adding quantum dots to the first mixed solution; and
    coating the second mixed solution on a substrate and irradiating light thereon to form a polymer matrix in which the organic precursor and the colloidal silica particles are crosslinked, and preparing a coating layer in which the quantum dots are dispersed in the polymer matrix, wherein
    the organic precursor includes at least one of dipentaerythritol pentaacrylate (DPPA) or dipentaerythritol hexaacrylate (DPHA).

2. The method of claim 1, wherein the preparing of the gel mixture includes:
    stirring and heating a precursor solution containing the organic precursor;
    modifying surfaces of the colloidal silica particles by using a crosslinkable silane compound; and
    preparing a gel mixture by mixing the heated precursor solution and the modified colloidal silica particles.

3. The method of claim 2, further comprising:
    crosslinking acrylamide on the surfaces of the modified colloidal silica particles, after the modifying of the surfaces of the colloidal silica particles.

4. The method of claim 1, wherein the gel mixture further includes at least one additive of pentaerythritol acrylate (PETA), N,N-dimethylacrylate amide (DMA), and zonyl acrylate (C8F17C2(OH)4O(CO)CH2=CH2).

5. The method of claim 1, wherein the quantum dot has a surface modified using trioctylphosphine (TOP).

6. The method of claim 1, wherein the coating of the second mixed solution on the substrate and irradiating light thereon includes:
    coating the second mixed solution on the substrate;
    removing a solvent by drying the coated second mixed solution; and
    irradiating light to a composition of the second mixed solution from which the solvent is removed.

7. An organic-inorganic hybrid coating layer comprising:
    a polymer matrix formed by crosslinking crosslinkable silane compounds bonded to surfaces of colloidal silica particles and organic precursors; and
    quantum dots dispersed in the polymer matrix.

8. The organic-inorganic hybrid coating layer of claim 7, wherein the crosslinkable silane compound includes an alkoxysilane group and an acrylic group, in which the alkoxysilane group is bonded to a hydroxyl group on the surface of the colloidal silica particle, and the acrylic group is bonded to an unsaturated hydrocarbon group of the organic precursor.

9. The organic-inorganic hybrid coating layer of claim 7, wherein the crosslinkable silane compound includes an acrylic group, and further includes acrylamide bonded to the acrylic group, and the polymer matrix further includes the acrylamide and the organic precursor that are crosslinked.

10. The organic-inorganic hybrid coating layer of claim 7, wherein the organic precursor includes at least one of dipentaerythritol pentaacrylate (DPPA) or dipentaerythritol hexaacrylate (DPHA).

11. The organic-inorganic hybrid coating layer of claim 7, wherein the crosslinkable silane compound is 4 to 20 parts based on 100 parts by weight of the colloidal silica particles.

12. The organic-inorganic hybrid coating layer of claim 7, wherein the crosslinkable silane compound includes at least one of acrylic oxyalkyl trimethoxysilane, methacrylic oxyalkyl trimethoxysilane, methacrylic oxyalkyl triethoxysilane, methacrylic oxyalkyl trichlorosilane, phenyl trichlorosilane, phenyl trimethoxysilane, phenyl triethoxysilane, vinyl trimethoxysilane, vinyl triethoxysilane, vinyl trichlorosilane, methyltrimethoxysilane, methyltriethoxysilane, propyl trimethoxysilane, glycidoxyalkyltrimethoxysilane, glycidoxyalkyltriethoxysilane, glycidoxyalkyltrichlorosilane, perfluoroalkyltrialkoxysilane, perfluoromethyl alkyltrialkoxysilane, or perfluoroalkyl trichlorosilane.

13. A method of fabricating a quantum dot nanocapsule, the method comprising:
preparing a first sol composition by mixing a first capsule composition of an organic substance and a second capsule composition of an inorganic substance;
preparing a second sol composition by mixing quantum dots and additives in the first sol composition;
photopolymerizing the second sol composition to form a structure in which the first capsule composition and the second capsule composition are crosslinked, and simultaneously introducing the quantum dots into the structure to form a bulk capsule structure in which the quantum dots are encapsulated into the structure;
forming quantum dot microcapsules by pulverizing the bulk capsule structure; and
preparing quantum dot nanocapsules by re-dispersing the quantum dot microcapsules in a solvent.

14. The method of claim 13, wherein the quantum dot includes tri-octyl phosphine ligand on a surface thereof, and the ligand is oxidized and removed from a surface of the quantum dot during the preparing of the second sol composition.

15. The method of claim 13, wherein the forming of the quantum dot microcapsules includes pulverizing the bulk capsule structure through a ball-mill process, and the forming of the quantum dot nanocapsules includes re-dispersing the quantum dot microcapsules in a dichlorobenzene solvent.

16. The method of claim 13, wherein the additive includes at least one of quantum dot dispersant, photoinitiator, or photostabilizer.

17. The method of claim 16, wherein the quantum dot dispersant includes at least one of methyl methacrylate (MA), tert-butyl methacrylate (tBMA), acryloyl porpoline (ACMO), N,N'-diethylacrylamide (NDEAA), N-isopropylacrylamide (NIPAM), N,N'-diethylaminoethyl acrylate (NDAEA), N,N'-diethylaminopropyl acrylate (NDAPA), N,N'-dimethylmethacrylamide (NDMMA) or N,N'-dimethylacrylamide (DMA).

18. The method of claim 16, wherein the photoinitiator includes at least one of 2,2'-demethoxy-2-phenylacetophenone (DMPA), benzophenone (BP), 2-oxo-1,2-diphenylethyl-4-methylbenzenesulfonate (BT), or (1-hydroxycyclohexyl) (phenyl)methanone (HCPM).

19. The method of claim 16, wherein the photostabilizer includes at least one of 2(3)-t-butyl-4-hydroxytoluene (BHT), Tinuvin 123, Tinuvin 292, Tinuvin 384, or Tinuvin 400.

20. The method of claim 13, wherein the preparing of the second sol composition further includes adding an additive solvent for concentration control or an inorganic additive, the inorganic additive includes at least one of silanediamine (SDA), poly-silamine (PSA), tetraethoxysilane (TEOS), or tetraisopropoxytitanium (TIPT), and the additive solvent includes at least one of propylene glycol monomethyl ester (PGME), or propylene glycol monomethyl ester acetate (PGMEA).

* * * * *

UNITED STATES PATENT AND TRADEMARK OFFICE
CERTIFICATE OF CORRECTION

PATENT NO. : 11,697,762 B2
APPLICATION NO. : 17/181017
DATED : July 11, 2023
INVENTOR(S) : Sang Ook Kang et al.

It is certified that error appears in the above-identified patent and that said Letters Patent is hereby corrected as shown below:

In the Claims

In Column 64, Line 19:
Please correct "(MA)" to --(MMA)--

Signed and Sealed this
Eighth Day of August, 2023

Katherine Kelly Vidal
*Director of the United States Patent and Trademark Office*